(12) United States Patent
Chen et al.

(10) Patent No.: US 12,706,051 B2
(45) **Date of Patent: *Aug. 11, 2026**

(54) DISPLAY SUBSTRATE INCLUDING MULTIPLE CASCADED SHIFT REGISTER UNITS, PREPARATION METHOD THEREOF, AND DISPLAY DEVICE

(71) Applicants: Chongqing BOE Display Technology Co.,Ltd., Chongqing (CN); BOE Technology Group Co., Ltd., Beijing (CN)

(72) Inventors: Teng Chen, Beijing (CN); Faming Jiang, Beijing (CN); Ri Chen, Beijing (CN); Xinxing Jia, Beijing (CN); Weixin Meng, Beijing (CN); Jonguk Kwak, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/918,116

(22) Filed: Oct. 17, 2024

(65) Prior Publication Data

US 2025/0037670 A1 Jan. 30, 2025

Related U.S. Application Data

(62) Division of application No. 17/609,407, filed as application No. PCT/CN2021/073726 on Jan. 26, 2021, now Pat. No. 12,154,510.

(51) Int. Cl.
*G09G 3/3266* (2016.01)
*G11C 19/28* (2006.01)
(Continued)

(52) U.S. Cl.
CPC ........... *G09G 3/3266* (2013.01); *G11C 19/28* (2013.01); *H10K 59/1201* (2023.02);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS 12,154,510 B2 * 11/2024 Chen .................... H10D 86/441
2010/0001932 A1 * 1/2010 Kishi .................. G09G 3/3225 345/77

(Continued)

FOREIGN PATENT DOCUMENTS

CN 111210776 A 5/2020
CN 111696486 A 9/2020

OTHER PUBLICATIONS

International Search Report for PCT/CN2021/073723 Mailed Oct. 20, 2021.

(Continued)

*Primary Examiner* — Ke Xiao
*Assistant Examiner* — Nelson Lam

(57) ABSTRACT

A display substrate includes an underlay substrate, and a first semiconductor layer, first conductive layer, second semiconductor layer, second conductive layer, and third conductive layer which are arranged on the underlay substrate. The first semiconductor layer includes an active layer of at least one transistor of a second semiconductor type of a shift register unit. The first conductive layer includes a control electrode of the at least one transistor of the second semiconductor type and a first electrode of at least one capacitor of the shift register unit. The second semiconductor layer includes an active layer of at least one transistor of a first semiconductor (Continued)

type of the shift register unit. The second conductive layer includes a control electrode of the at least one transistor of the first semiconductor type and a second electrode of the at least one capacitor of the shift register unit.

12 Claims, 33 Drawing Sheets

(51) Int. Cl.
*H10K 59/12* (2023.01)
*H10K 59/131* (2023.01)

(52) U.S. Cl.
CPC . *H10K 59/1315* (2023.02); *G09G 2300/0408* (2013.01); *G09G 2300/0426* (2013.01); *G09G 2310/0286* (2013.01)

(58) Field of Classification Search
CPC .... G09G 3/3233; G09G 3/3241; G09G 3/325; G09G 3/3258; G09G 3/3266; G09G 3/3275; G09G 3/3283; G09G 3/3291; G09G 2300/0408; G09G 2300/0426; G09G 2310/0286
USPC ...................................................... 345/76–83
See application file for complete search history.

(56) References Cited

U.S. PATENT DOCUMENTS

2019/0295673 A1* 9/2019 Umezaki .............. G11C 19/184
2019/0325834 A1 10/2019 Feng et al.
2021/0312869 A1* 10/2021 Dai ...................... G09G 3/3266
2022/0208072 A1* 6/2022 Jin ....................... G09G 3/2092
2022/0343854 A1* 10/2022 Li ........................ G09G 3/3266
2022/0343859 A1* 10/2022 Bai ........................ H10D 86/60
2023/0252941 A1* 8/2023 Yu .......................... G11C 19/28 345/213
2023/0260462 A1* 8/2023 Chen ...................... G11C 19/28 345/214
2023/0298509 A1* 9/2023 Liu ...................... G09G 3/3266 345/55
2023/0316985 A1* 10/2023 Qing .................... G09G 3/2092 345/204
2023/0317015 A1* 10/2023 Chen .................... H10D 86/481 345/204
2024/0249676 A1* 7/2024 Qing .................... G09G 3/3233

OTHER PUBLICATIONS

Office Action dated Jun. 17, 2024 for Chinese Patent Application No. 202180000068.8 and English Translation.

* cited by examiner

DISPLAY SUBSTRATE INCLUDING MULTIPLE CASCADED SHIFT REGISTER UNITS, PREPARATION METHOD THEREOF, AND DISPLAY DEVICE

CROSS-REFERENCE TO RELATED APPLICATION(S)

The present application is a divisional application of the U.S. application Ser. No. 17/609,407, filed on Nov. 8, 2021, which is a U.S. National Phase Entry of International Application No. PCT/CN2021/073726 having an international filing date of Jan. 26, 2021, the entire content of which is hereby incorporated by reference.

TECHNICAL FIELD

The present disclosure relates, but not limited, to the technical field of display, and particularly to a display substrate, a preparation method thereof, and a display device.

BACKGROUND

Organic Light Emitting Diode (OLED) with the advantages of ultra-thin design, large field of view, active emission, high brightness, continuous and adjustable light colors, low cost, quick response, low power consumption, wide working temperature range, flexible display, and the like has gradually become a next-generation display technology with a broad development prospect and attracted more and more attention. OLED may be divided into a Passive Matrix (PM) type and an Active Matrix (AM) type according to different driving modes. An AMOLED is a current-driven device and controls each sub-pixel using an independent Thin Film Transistor (TFT), and each sub-pixel may be continuously and independently driven to emit light.

SUMMARY

The below is a summary about the subject matter described in the present disclosure in detail. The summary is not intended to limit the scope of protection of the claims.

Embodiments of the present disclosure provide a display substrate, a preparation method thereof, and a display device.

According to an aspect, an embodiment of the present disclosure provides a display substrate, which includes a display region and a peripheral region on a periphery of the display region. A gate driving circuit is arranged in the peripheral region, and includes multiple cascaded shift register units. The shift register unit includes at least one transistor of a first semiconductor type, at least one transistor of a second semiconductor type, and at least one capacitor. Doping types of the first semiconductor type and the second semiconductor type are opposite. In a direction perpendicular to the display substrate, the display substrate includes an underlay substrate, and a first semiconductor layer, first conductive layer, second semiconductor layer, second conductive layer, and third conductive layer which are arranged on the underlay substrate. The first semiconductor layer at least includes an active layer of the at least one transistor of the second semiconductor type of the shift register unit. The first conductive layer at least includes a control electrode of the at least one transistor of the second semiconductor type and a first electrode of the at least one capacitor of the shift register unit. The second semiconductor layer at least includes an active layer of the at least one transistor of the first semiconductor type of the shift register unit. The second conductive layer at least includes a control electrode of the at least one transistor of the first semiconductor type and a second electrode of the at least one capacitor of the shift register unit. The third conductive layer at least includes first electrodes and second electrodes of the at least one transistor of the first semiconductor type and at least one transistor of the second semiconductor type of the shift register unit.

In some exemplary implementation modes, the first conductive layer further includes a third output terminal of the shift register unit. The second semiconductor layer is on a side of the third output terminal away from the first semiconductor layer.

In some exemplary implementation modes, the transistor of the second semiconductor type includes a first transistor and a second transistor. The transistor of the first semiconductor type includes a third transistor and a fourth transistor.

In some exemplary implementation modes, the first conductive layer further includes a first output terminal and second output terminal of the shift register unit. A control electrode of the second transistor and the second output terminal form an integrated structure. A control electrode of the first transistor is between the control electrode of the second transistor and the second output terminal. The third output terminal is on a side of the control electrode of the first transistor away from the second output terminal.

In some exemplary implementation modes, extending directions of the first output terminal, the second output terminal, and the third output terminal are parallel to one another.

In some exemplary implementation modes, an active layer of the third transistor and an active layer of the fourth transistor are on a side of the third output terminal away from the first transistor and the second transistor and form an integrated structure.

In some exemplary implementation modes, the integrated structure formed by the active layer of the third transistor and the active layer of the fourth transistor is of a shape of "ㄇ".

In some exemplary implementation modes, a second electrode of the second transistor, a second electrode of the third transistor, and a second electrode of the fourth transistor form an integrated structure and are connected with the third output terminal.

In some exemplary implementation modes, the second conductive layer further includes a control signal line. The third conductive layer further includes a fourth connecting electrode. The fourth connecting electrode is connected with the control electrode of the first transistor, a control electrode of the fourth transistor, and the control signal line.

In some exemplary implementation modes, the third conductive layer further includes a first power line and a second power line. A first electrode of the first transistor is connected with the first power line. A first electrode of the third transistor and a first electrode of the fourth transistor are connected with the second power line.

In some exemplary implementation modes, the third conductive layer further includes a first clock signal line and a second clock signal line. Extending directions of the first clock signal line, the second clock signal line, the first power line, and the second power line are parallel to one another and perpendicular to that of the control signal line.

In some exemplary implementation modes, the shift register unit includes an input circuit, a first control circuit, a second control circuit, and an output circuit. The input circuit is connected with a first clock signal line, a second clock signal line, a first input terminal, a first power line, a first control node, and a second control node, and is configured to provide a signal of the first input terminal to the second control node under the control of the first clock signal line and provide a signal of the first clock signal line or the first power line to the first control node under the control of the second clock signal line, the first input terminal, and the second control node. The first control circuit is connected with the first control node, the second control node, the first power line, a second power line, and a first output terminal, and is configured to provide a signal of the first power line or the second power line to the first output terminal under the control of the first control node and the second control node. The second control circuit is connected with the first power line, the second power line, the first output terminal, and a second output terminal, and is configured to provide an effective level signal of the first power line or the second power line to the second output terminal under the control of the first output terminal. The output circuit is connected with a control signal line, the first power line, the second power line, the second output terminal, and a third output terminal, and is configured to output an effective level signal of the first power line or the second power line to the third output terminal under the control of the control signal line and the second output terminal. Within the time of one frame, a duration of an effective level signal provided by the third output terminal is longer than that of an effective level signal provided by the second output terminal.

In some exemplary implementation modes, the output circuit includes a first transistor, a second transistor, a third transistor, and a fourth transistor. A control electrode of the first transistor is connected with the control signal line, a first electrode of the first transistor is connected with the first power line, and a second electrode of the first transistor is connected with a first electrode of the second transistor. A control electrode of the second transistor is connected with the second output terminal, and a second electrode of the second transistor is connected with the third output terminal. A control electrode of the third transistor is connected with the second output terminal, a first electrode of the third transistor is connected with the second power line, and a second electrode of the third transistor is connected with the third output terminal. A control electrode of the fourth transistor is connected with the control signal line, a first electrode of the fourth transistor is connected with the second power line, and a second electrode of the fourth transistor is connected with the third output terminal.

In some exemplary implementation modes, the second control circuit includes a fifth transistor and a sixth transistor. A control electrode of the fifth transistor is connected with the first output terminal, a first electrode of the fifth transistor is connected with the first power line, and a second electrode of the fifth transistor is connected with the second output terminal. A control electrode of the sixth transistor is connected with the first output terminal, a first electrode of the sixth transistor is connected with the second power line, and a second electrode of the sixth transistor is connected with the second output terminal. The fifth transistor is a transistor of the second semiconductor type. The sixth transistor is a transistor of the first semiconductor type.

In some exemplary implementation modes, the fifth transistor is on a side of the first transistor and the second transistor close to the first control circuit. The sixth transistor is on a side of the third transistor close to the first control circuit.

In some exemplary implementation modes, the first electrode of the first transistor, the first electrode of the fifth transistor, and the first power line form an integrated structure. The second electrode of the fifth transistor and the second electrode of the sixth transistor form an integrated structure and are connected with the control electrode of the third transistor, the control electrode of the second transistor, and the second output terminal.

According to another aspect, an embodiment of the present disclosure provides a display device, which includes the abovementioned display substrate.

According to another aspect, an embodiment of the present disclosure provides a preparation method of a display substrate, for preparing the abovementioned display substrate, and the preparation method includes: providing an underlay substrate; and forming a first semiconductor layer, a first conductive layer, a second semiconductor layer, a second conductive layer, and a third conductive layer on the underlay substrate in a peripheral region on a periphery of a display region. The first semiconductor layer at least includes an active layer of at least one transistor of a second semiconductor type of a shift register unit of a gate driving circuit. The first conductive layer at least includes a control electrode of the at least one transistor of the second semiconductor type and a first electrode of at least one capacitor of the shift register unit. The second semiconductor layer at least includes an active layer of at least one transistor of a first semiconductor type of the shift register unit. The second conductive layer at least includes a control electrode of the at least one transistor of the first semiconductor type and a second electrode of the at least one capacitor of the shift register unit. The third conductive layer at least includes first electrodes and second electrodes of the at least one transistor of the first semiconductor type and at least one transistor of the second semiconductor type of the shift register unit.

Other aspects will become apparent upon reading and understanding the drawings and the detailed description.

BRIEF DESCRIPTION OF THE DRAWINGS

The drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
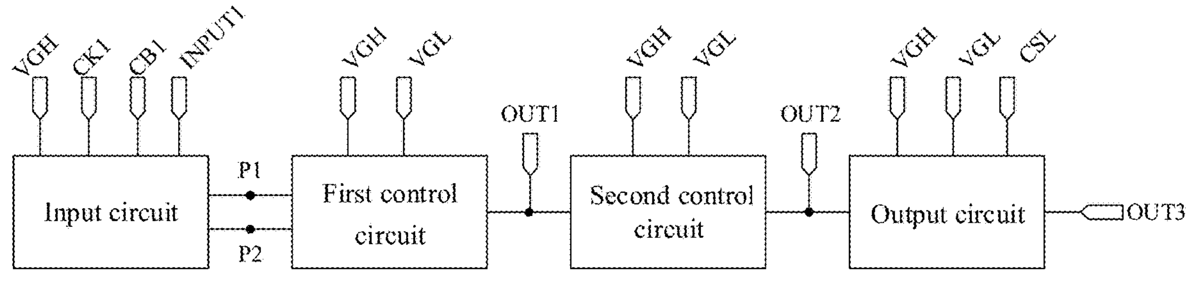
FIG. 1 is a structural schematic diagram of a shift register unit according to at least one embodiment of the present disclosure.

The embodiments of the present disclosure will be described below in combination with the drawings in detail. The implementation modes may be implemented in various forms. Those of ordinary skill in the art can easily understand such a fact that manners and contents may be transformed into one or more forms without departing from the purpose and scope of the present disclosure. Therefore, the present disclosure should not be explained as being limited to the contents recorded in the following implementation modes only. The embodiments in the present disclosure and the features in the embodiments can be freely combined without conflicts.

In the drawings, the size/sizes of one or more composition elements, the thicknesses of layers, or regions are exaggerated sometimes for clarity. Therefore, a mode of the present disclosure is not always limited to the size, and the shapes and sizes of each component in the drawings do not reflect the true scale. In addition, the drawings schematically illustrate ideal examples, and a mode of the present disclosure is not limited to the shapes, numerical values, or the like shown in the drawings.

Ordinal numerals "first", "second", and "third" in the present disclosure are set not to form limits in number but only to avoid the confusion of composition elements. In the present disclosure, "multiple" represents two or more than two.

In the present disclosure, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where the composition elements are described. Therefore, appropriate replacements based on situations are allowed, not limited to the expressions in the specification.

In the present disclosure, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill in the art may understand the meanings of the terms in the present disclosure according to specific situations. Herein, "electric connection" includes connection of the composition elements through an element with a certain electric action. "The element with the certain electric action" is not particularly limited as long as electric signals between the connected composition elements may be sent and received. Examples of "the element with the certain electric action" not only include an electrode and a line, but also include a switch element such as a transistor, a resistor, an inductor, a capacitor, another element with one or more functions, etc.

In the present disclosure, the transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. In the present disclosure, the channel region refers to a main region that the current flows through.

In the present disclosure, for distinguishing the two electrodes, except the gate, of the transistor, one electrode is called a first electrode, the other electrode is called a second electrode. The first electrode may be the source or the drain, and the second electrode may be the drain or the source. In addition, the gate of the transistor is called a control electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present disclosure.

In the present disclosure, "parallel" refers to a state that an angle formed by two straight lines is larger than −10° and smaller than 10°, and thus may include a state that the angle is larger than −5° and smaller than 5°. In addition, "perpendicular" refers to a state that an angle formed by two straight lines is larger than 80° and smaller than 100°, and thus may include a state that the angle is larger than 85° and smaller than 95°.

In the present disclosure, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

In the present disclosure, an effective level signal includes a level signal for turning on a transistor. For example, an effective level signal for turning on a P-type transistor is a low-level signal, and an effective level signal for turning on an N-type transistor is a high-level signal.

The embodiments of the present disclosure provide a shift register unit, a driving method thereof, a gate driving circuit, a display substrate, and a display device. The shift register unit of the present embodiment may provide many different gate driving signals to a pixel circuit to improve the performance of the pixel circuit.

FIG. 1 is a structural schematic diagram of a shift register unit according to at least one embodiment of the present disclosure. As shown in FIG. 1, the shift register unit provided in the embodiment of the present disclosure includes an input circuit, a first control circuit, a second control circuit, and an output circuit. The input circuit is connected with a first clock signal line CK1, a second clock signal line CB1, a first input terminal INPUT1, a first power line VGH, a first control node P1, and a second control node P2, and is configured to provide a signal of the first input terminal INPUT1 to the second control node P2 under the control of the first clock signal line CK1 and provide a signal of the first clock signal line CK1 or the first power line VGH to the first control node P1 under the control of the second clock signal line CB1, the first input terminal INPUT1, and the second control node P2. The first control circuit is connected with the first power line VGH, a second power line VGL, the first control node P1, the second control node P2, and a first output terminal OUT1, and is configured to provide a signal of the first power line VGH or the second power line VGL to the first output terminal OUT1 under the control of the first control node P1 and the second control node P2. The second control circuit is connected with the first power line VGH, the second power line VGL, the first output terminal OUT1, and a second output terminal OUT2, and is configured to provide an effective level signal of the first power line VGH or the second power line VGL to the second output terminal OUT2 under the control of the first output terminal OUT1. The output circuit is connected with the first power line VGH, the second power line VGL, a control signal line CSL, the second output terminal OUT2, and a third output terminal OUT3, and is configured to output an effective level signal of the first power line VGH or the second power line VGL to the third output terminal OUT3 under the control of the second output terminal OUT2 and the control signal line CSL. Within the time of one frame, a duration of an effective level signal provided by the third output terminal OUT3 is longer than that of an effective level signal provided by the second output terminal OUT2.

In some exemplary implementation modes, the first power line VGH may keep providing high-level signals, and the second power line VGL may keep providing low-level signals. In some examples, the effective level signal provided by the third output terminal OUT3 is a low-level signal provided by the second power line VGL, and the effective level signal provided by the second output terminal OUT2 is a high-level signal provided by the first power line VGH. However, no limits are made thereto in the present embodiment.

In some exemplary implementation modes, input signals of the first input terminal INPUT1, the first clock signal line CK1, the second clock signal line CB1, and the control signal line CSL may be pulse signals.

In some exemplary implementation modes, an output signal of the first output terminal OUT1 is opposite to an output signal of the second output terminal OUT2 in phase. For example, a first input terminal of a first-stage shift register unit may be connected with a first initial signal line, and a first output terminal of an nth-stage shift register unit may be connected with a first input terminal of an (n+1)th-stage shift register unit to provide an input signal to the (n+1)th-stage shift register unit, n being an integer greater than 0. An output signal provided by the second output terminal may be configured to control the turning-on of an N-type transistor (e.g., an oxide thin film transistor) in a pixel circuit. However, no limits are made thereto in the present embodiment.

In some exemplary implementation modes, the second output terminal OUT2 and the third output terminal OUT3 provide effective level signals with opposite polarities. The third output terminal OUT3 outputs effective level signals of the first power line VGH or the second power line VGL at intervals within the time of one frame. In some examples, the output signal of the third output terminal may be a NAND result of the output signal of the second output terminal and a signal provided by the control signal line. For example, the output signal of the third output terminal may be configured to control the turning-on of a P-type transistor (e.g., a Low Temperature Poly-silicon (LTPS) thin film transistor) in a pixel circuit. However, no limits are made thereto in the present embodiment.

In some exemplary implementation modes, an effective level signal provided to the third output terminal OUT3 within the time of one frame includes a first time period and second time period which are spaced. The first time period is configured to output an effective level signal of the second power line VGL to the third output terminal OUT3 under the control of the control signal line CSL. The second time period is configured to output the effective level signal of the second power line VGL to the third output terminal OUT3 under the control of the second output terminal OUT2. In some examples, a length of the second time period is longer than that of the first time period. In some examples, the length of the second time period is approximately equal to the duration of the effective level signal provided by the second output terminal OUT2.

In the present exemplary embodiment, many different output signals may be obtained through the first output terminal, second output terminal, and third output terminal of the shift register unit, and these output signals may be provided to the pixel circuit as gate driving signals to improve the performance of the pixel circuit.

Figure 2:
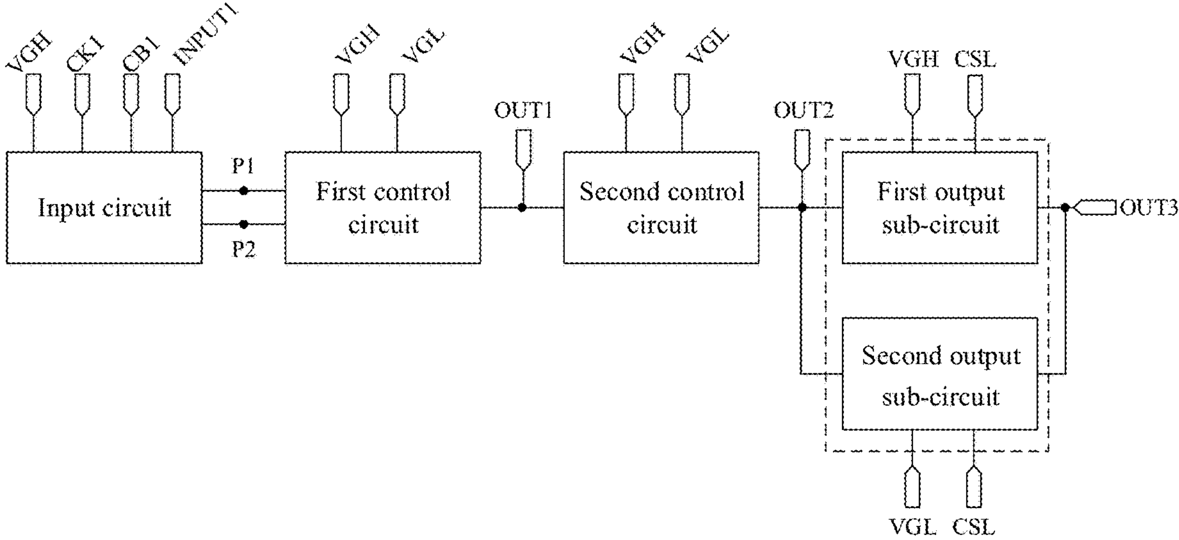
FIG. 2 is a structural schematic diagram of an output circuit of a shift register unit according to at least one embodiment of the present disclosure.

FIG. 2 is a structural schematic diagram of an output circuit of a shift register unit according to at least one embodiment of the present disclosure. As shown in FIG. 2, the output circuit in the shift register unit provided in the present exemplary embodiment includes a first output sub-circuit and a second output sub-circuit. The first output sub-circuit is connected with the control signal line CSL, the first power line VGH, the second output terminal OUT2, and the third output terminal OUT3, and is configured to provide the effective level signal of the first power line VGH to the third output terminal OUT3 under the control of the control signal line CSL and the second output terminal OUT2. The second output sub-circuit is connected with the control signal line CSL, the second power line VGL, the second output terminal OUT2, and the third output terminal OUT3, and is configured to provide the effective level signal of the second power line VGL to the third output terminal OUT3 under the control of the control signal line CSL and the second output terminal OUT2.

In the present exemplary embodiment, the first output sub-circuit and the second output sub-circuit may make the output signal of the third output terminal different from the output signals of the first output terminal and the second output terminal, thereby providing many different gate driving signals to the pixel circuit.

Figure 3:
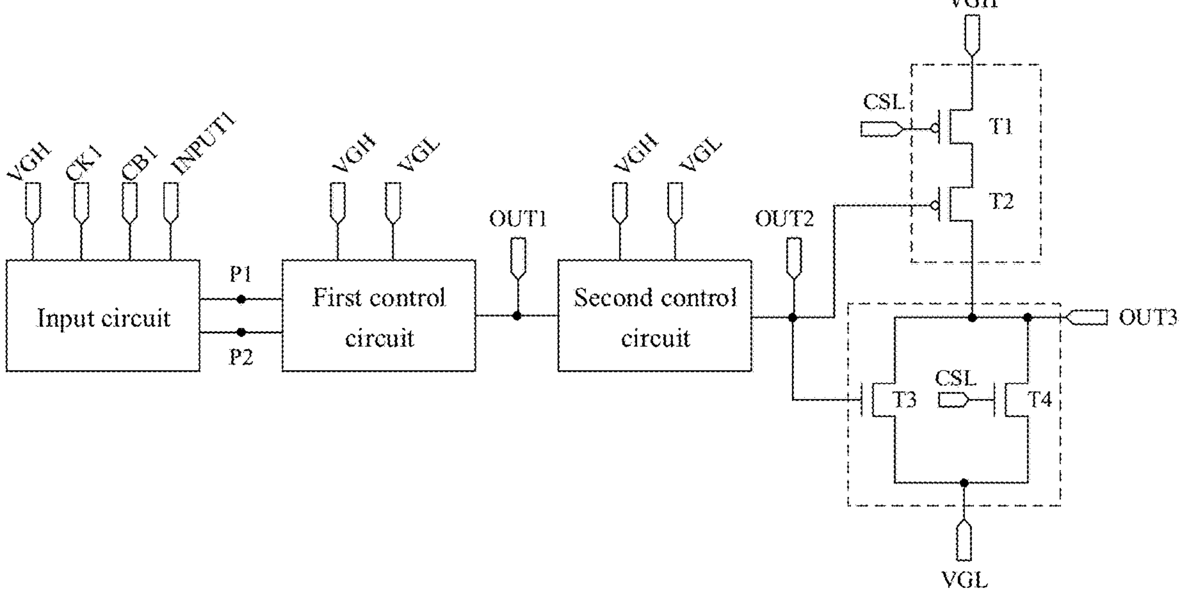
FIG. 3 is an equivalent circuit diagram of an output circuit of a shift register unit according to at least one embodiment of the present disclosure.

FIG. 3 is an equivalent circuit diagram of an output circuit of a shift register unit according to at least one embodiment of the present disclosure. As shown in FIG. 3, the output circuit in the shift register unit provided in the present exemplary embodiment includes a first output sub-circuit and a second output sub-circuit. The first output sub-circuit includes a first transistor T1 and a second transistor T2. A control electrode of the first transistor T1 is connected with the control signal line CSL, a first electrode of the first transistor T1 is connected with the first power line VGH, and a second electrode of the first transistor T1 is connected with a first electrode of the second transistor T2. A control electrode of the second transistor T2 is connected with the second output terminal OUT2, and a second electrode of the second transistor T2 is connected with the third output terminal OUT3. The second output sub-circuit includes a third transistor T3 and a fourth transistor T4. A control electrode of the third transistor T3 is connected with the second output terminal OUT2, a first electrode of the third transistor T3 is connected with the second power line VGL, and a second electrode of the third transistor T3 is connected with the third output terminal OUT3. A control electrode of the fourth transistor T4 is connected with the control signal line CSL, a first electrode of the fourth transistor T4 is connected with the second power line VGL, and a second electrode of the fourth transistor T4 is connected with the third output terminal OUT3.

In the present exemplary embodiment, FIG. 3 shows an exemplary structure of the output circuit. It is easy for those skilled in the art to understand that an implementation mode of the output circuit is not limited thereto as long as a function thereof may be realized.

Figure 4:
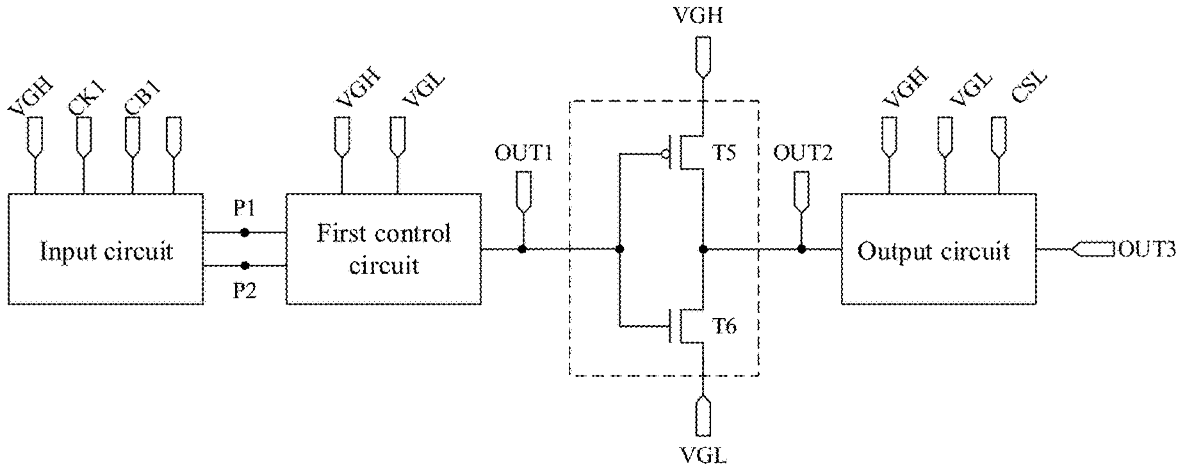
FIG. 4 is an equivalent circuit diagram of a second control circuit of a shift register unit according to at least one embodiment of the present disclosure.

FIG. 4 is an equivalent circuit diagram of a second control circuit of a shift register unit according to at least one embodiment of the present disclosure. As shown in FIG. 4, the second control circuit in the shift register unit provided in the present exemplary embodiment includes a fifth transistor T5 and a sixth transistor T6. A control electrode of the fifth transistor T5 is connected with the first output terminal OUT1, a first electrode of the fifth transistor T5 is connected with the first power line VGH, and a second electrode of the fifth transistor T5 is connected with the second output terminal OUT2. A control electrode of the sixth transistor T6 is connected with the first output terminal OUT1, a first electrode of the sixth transistor T6 is connected with the second power line VGL, and a second electrode of the sixth transistor T6 is connected with the second output terminal OUT2.

In the present exemplary embodiment, FIG. 4 shows an exemplary structure of the second control circuit. It is easy for those skilled in the art to understand that an implementation mode of the second control circuit is not limited thereto as long as a function thereof may be realized.

Figure 5:
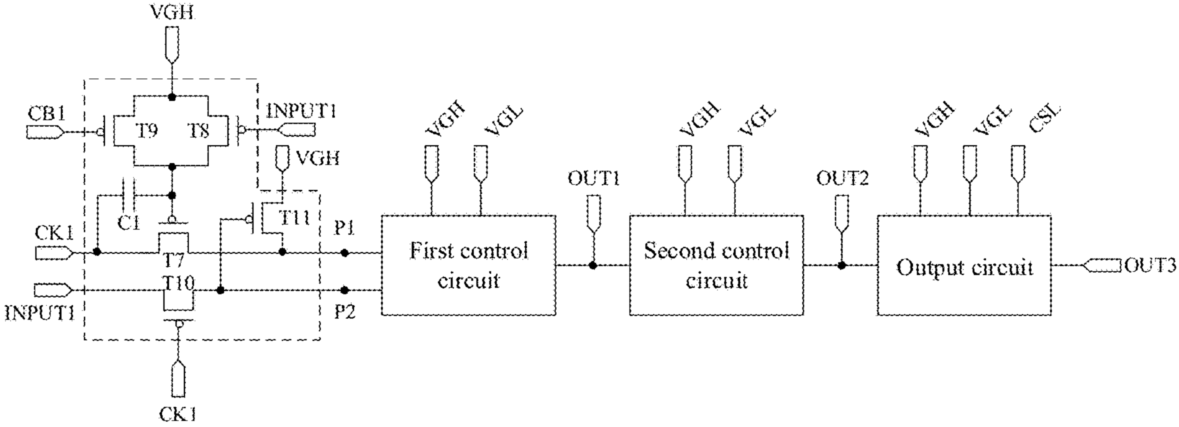
FIG. 5 is an equivalent circuit diagram of an input circuit of a shift register unit according to at least one embodiment of the present disclosure.

FIG. 5 is an equivalent circuit diagram of an input circuit of a shift register unit according to at least one embodiment of the present disclosure. As shown in FIG. 5, the input circuit in the shift register unit provided in the present exemplary embodiment includes a seventh transistor T7, an eighth transistor T8, a ninth transistor T9, a tenth transistor T10, an eleventh transistor T11, and a first capacitor C1. A control electrode of the seventh transistor T7 is connected with a second electrode of the eighth transistor T8 and a second electrode of the ninth transistor T9, a first electrode of the seventh transistor T7 is connected with the first clock signal line CK1, and a second electrode of the seventh transistor T7 is connected with the first control node P1. A control electrode of the eighth transistor T8 is connected with the first input terminal INPUT1, and a first electrode of the eighth transistor T8 is connected with the first power line VGH. A control electrode of the ninth transistor T9 is connected with the second clock signal line CB1, and a first electrode of the ninth transistor T9 is connected with the first power line VGH. A control electrode of the tenth transistor T10 is connected with the first clock signal line CK1, a first electrode of the tenth transistor T10 is connected with the first input terminal INPUT1, and a second electrode of the tenth transistor T10 is connected with the second control node P2. A control electrode of the eleventh transistor T11 is connected with the second control node P2, a first electrode of the eleventh transistor T11 is connected with the first power line VGH, and a second electrode of the eleventh transistor T11 is connected with the first control node P1. A first electrode of the first capacitor C1 is connected with the control electrode of the seventh transistor T7, and a second electrode of the first capacitor C1 is connected with the first electrode of the seventh transistor T7.

In the present exemplary embodiment, FIG. 5 shows an exemplary structure of the input circuit. It is easy for those skilled in the art to understand that an implementation mode of the input circuit is not limited thereto as long as a function thereof may be realized.

Figure 6:
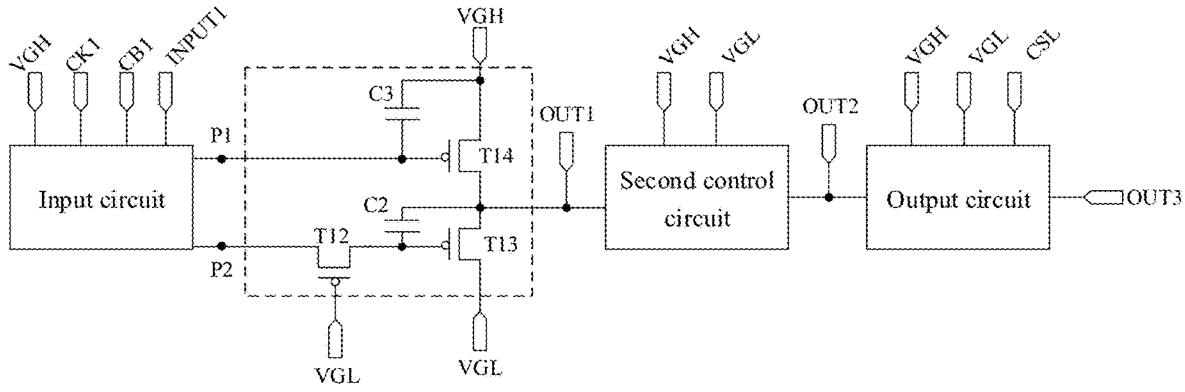
FIG. 6 is an equivalent circuit diagram of a first control circuit of a shift register unit according to at least one embodiment of the present disclosure.

FIG. 6 is an equivalent circuit diagram of a first control circuit of a shift register unit according to at least one embodiment of the present disclosure. As shown in FIG. 6, the first control circuit in the shift register unit provided in the present embodiment includes a twelfth transistor T12, a thirteenth transistor T13, a fourteenth transistor T14, a second capacitor C2, and a third capacitor C3. A control electrode of the twelfth transistor T12 is connected with the second power line VGL, a first electrode of the twelfth transistor T12 is connected with the second control node P2, and a second electrode of the twelfth transistor T12 is connected with a control electrode of the thirteenth transistor T13. A first electrode of the thirteenth transistor T13 is connected with the second power line VGL, and a second electrode of the thirteenth transistor T13 is connected with the first output terminal OUT1. A control electrode of the fourteenth transistor T14 is connected with the first control node P1, a first electrode of the fourteenth transistor T14 is connected with the first power line VGH, and a second electrode of the fourteenth transistor T14 is connected with the first output terminal OUT1. A first electrode of the second capacitor C2 is connected with the control electrode of the thirteenth transistor T13, and a second electrode of the second capacitor C2 is connected with the first output terminal OUT1. A first electrode of the third capacitor C3 is connected with the control electrode of the fourteenth transistor T14, and a second electrode of the third capacitor C3 is connected with the first power line VGH.

In the present exemplary embodiment, FIG. 6 shows an exemplary structure of the first control circuit. It is easy for those skilled in the art to understand that an implementation mode of the first control circuit is not limited thereto as long as a function thereof may be realized.

Figure 7:
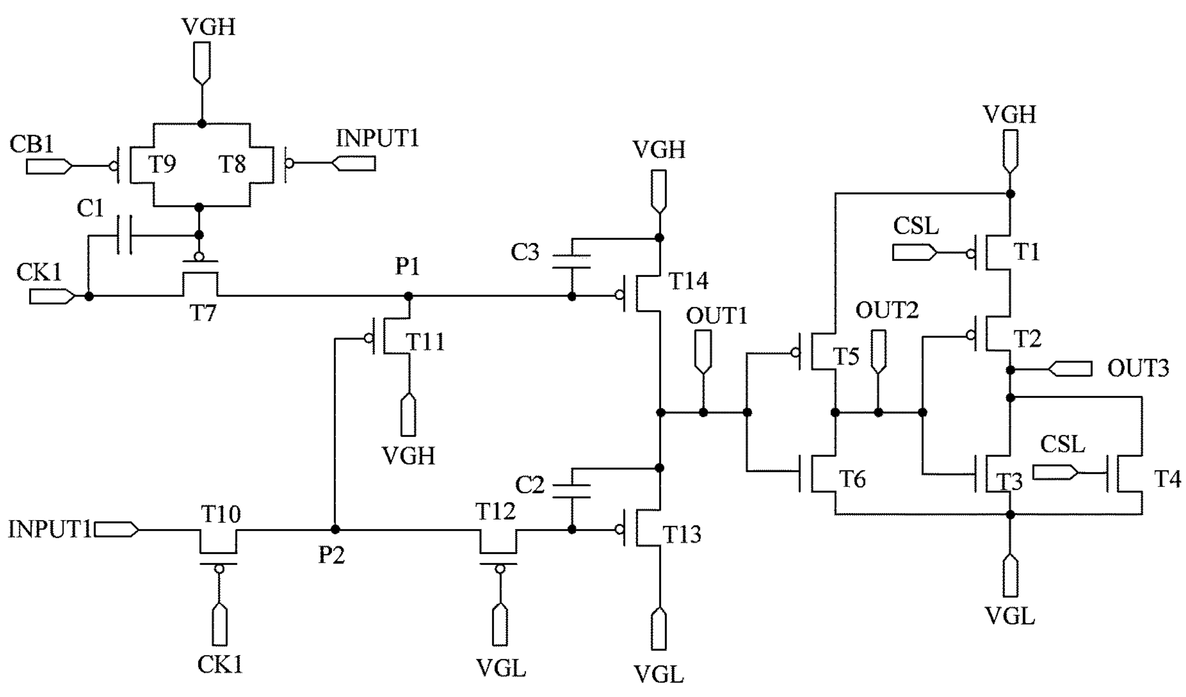
FIG. 7 is an equivalent circuit diagram of a shift register unit according to at least one embodiment of the present disclosure.

FIG. 7 is an equivalent circuit diagram of a shift register unit according to at least one embodiment of the present disclosure. As shown in FIG. 7, the shift register unit provided in the present exemplary embodiment includes an input circuit, a first control circuit, a second control circuit, and an output circuit. The output circuit includes a first transistor T1, a second transistor T2, a third transistor T3, and a fourth transistor T4. The second control circuit includes a fifth transistor T5 and a sixth transistor T6. The input circuit includes a seventh transistor T7, an eighth transistor T8, a ninth transistor T9, a tenth transistor T10, an eleventh transistor T11, and a first capacitor C1. The first control circuit includes a twelfth transistor T12, a thirteenth transistor T13, a fourteenth transistor T14, a second capacitor C2, and a third capacitor C3.

In the present exemplary implementation mode, a control electrode of the first transistor T1 is connected with the control signal line CSL, a first electrode of the first transistor T1 is connected with the first power line VGH, and a second electrode of the first transistor T1 is connected with a first electrode of the second transistor T2. A control electrode of the second transistor T2 is connected with the second output terminal OUT2, and a second electrode of the second transistor T2 is connected with the third output terminal OUT3. A control electrode of the third transistor T3 is connected with the second output terminal OUT2, a first electrode of the third transistor T3 is connected with the second power line VGL, and a second electrode of the third transistor T3 is connected with the third output terminal OUT3. A control electrode of the fourth transistor T4 is connected with the control signal line CSL, a first electrode of the fourth transistor T4 is connected with the second power line VGL, and a second electrode of the fourth transistor T4 is connected with the third output terminal OUT3. A control electrode of the fifth transistor T5 is connected with the first output terminal OUT1, a first electrode of the fifth transistor T5 is connected with the first power line VGH, and a second electrode of the fifth transistor T5 is connected with the second output terminal OUT2. A control electrode of the sixth transistor T6 is connected with the first output terminal OUT1, a first electrode of the sixth transistor T6 is connected with the second power line VGL, and a second electrode of the sixth transistor T6 is connected with the second output terminal OUT2. A control electrode of the seventh transistor T7 is connected with a second electrode of the eighth transistor T8 and a second electrode of the ninth transistor T9, a first electrode of the seventh transistor T7 is connected with the first clock signal line CK1, and a second electrode of the seventh transistor T7 is connected with the first control node P1. A control electrode of the eighth transistor T8 is connected with the first input terminal INPUT1, and a first electrode of the eighth transistor T8 is connected with the first power line VGH. A control electrode of the ninth transistor T9 is connected with the second clock signal line CB1, and a first electrode of the ninth transistor T9 is connected with the first power line VGH. A control electrode of the tenth transistor T10 is connected with the first clock signal line CK1, a first electrode of the tenth transistor T10 is connected with the first input terminal INPUT1, and a second electrode of the tenth transistor T10 is connected with the second control node P2. A control electrode of the eleventh transistor T11 is connected with the second control node P2, a first electrode of the eleventh transistor T11 is connected with the first power line VGH, and a second electrode of the eleventh transistor T11 is connected with the first control node P1. A control electrode of the twelfth transistor T12 is connected with the second power line VGL, a first electrode of the twelfth transistor T12 is connected with the second control node P2, and a second electrode of the twelfth transistor T12 is connected with a control electrode of the thirteenth transistor T13. A first electrode of the thirteenth transistor T13 is connected with the second power line VGL, and a second electrode of the thirteenth transistor T13 is connected with the first output terminal OUT1. A control electrode of the fourteenth transistor T14 is connected with the first control node P1, a first electrode of the fourteenth transistor T14 is connected with the first power line VGH, and a second electrode of the fourteenth transistor T14 is connected with the first output terminal OUT1. A first electrode of the first capacitor C1 is connected with the control electrode of the seventh transistor T7, and a second electrode of the first capacitor C1 is connected with the first electrode of the seventh transistor T7. A first electrode of the second capacitor C2 is connected with the control electrode of the thirteenth transistor T13, and a second electrode of the second capacitor C2 is connected with the first output terminal OUT1. A first electrode of the third capacitor C3 is connected with the control electrode of the fourteenth transistor T14, and a second electrode of the third capacitor C3 is connected with the first power line VGH.

In some exemplary implementation modes, the third transistor T3, the fourth transistor T4, and the sixth transistor T6 are transistors of a first semiconductor type. The first transistor T1, the second transistor T2, the fifth transistor T5, and the seventh transistor T7 to the fourteenth transistor T14 are transistors of a second semiconductor type. Doping types of the first semiconductor type and the second semiconductor type are opposite. In some examples, the third transistor T3, the fourth transistor T4, and the sixth transistor T6 are N-type thin film transistors, e.g., oxide thin film transistors like Indium Gallium Zinc Oxide (IGZO) thin film transistors. The first transistor T1, the second transistor T2, the fifth transistor T5, and the seventh transistor T7 to the fourteenth transistor T14 are P-type thin film transistors, e.g., Low Temperature Poly-silicon (LTPS) thin film transistors. In addition, a thin film transistor of a bottom gate structure or a thin film transistor of a top gate structure may be selected in the embodiment of the present disclosure as long as a switch function may be realized. No limits are made thereto in the present embodiment.

Figure 8:
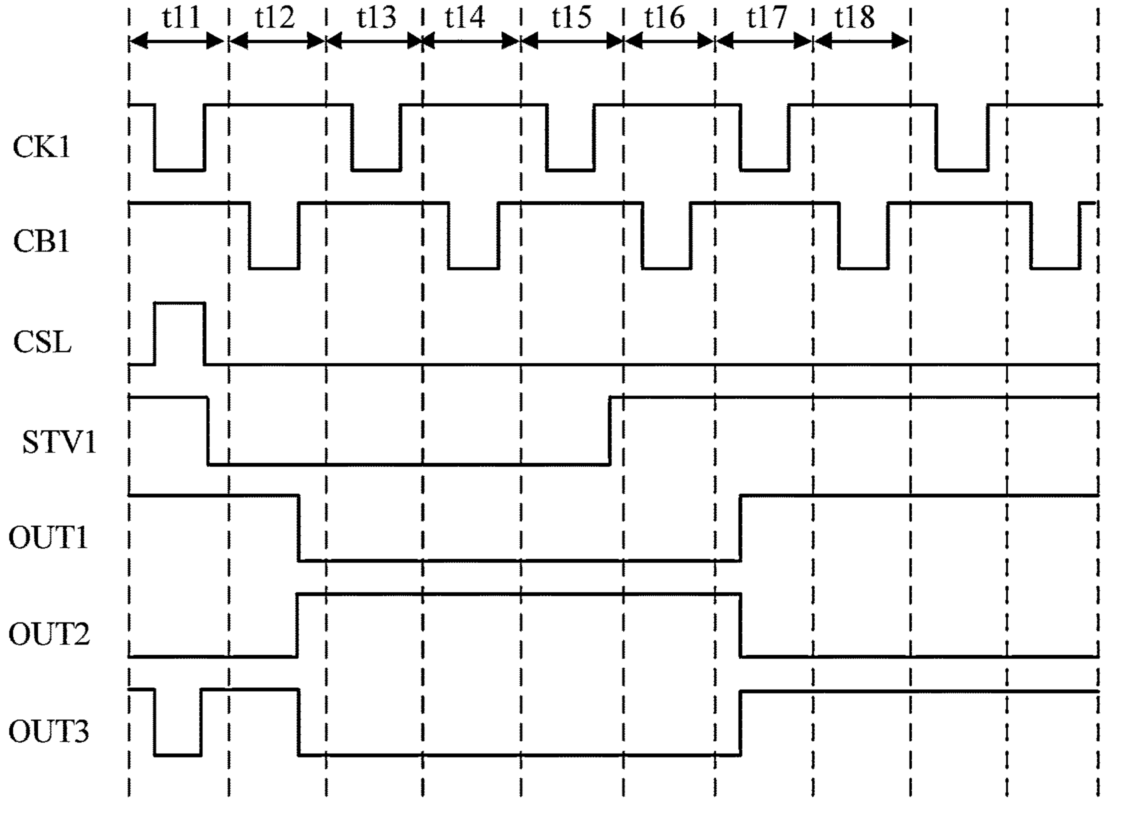
FIG. 8 is a working timing diagram of the shift register unit shown in FIG. 7.

The technical solution of the embodiment of the present disclosure will further be described below through a working process of the shift register unit. The following description is made taking a working process of a first-stage shift register unit as an example. A first input terminal INPUT1 of the first-stage shift register unit is connected with a first initial signal line STV1. FIG. 8 is a working timing diagram of the shift register unit shown in FIG. 7. As shown in FIGS. 7 and 8, the shift register unit of the present exemplary embodiment includes fourteen transistor units (i.e., the first transistor T1 to the fourteenth transistor T14), three capacitor units (i.e., the first capacitor C1 to the third capacitor C3), four input terminals (i.e., the first clock signal line CK1, the second clock signal line CB2, the first input terminal INPUT1, and the control signal line CSL), three output terminals (i.e., the first output terminal OUT1, the second output terminal OUT2, and the third output terminal OUT3), and two power terminals (i.e., the first power line VGH and the second power line VGL). The first power line VGH keeps providing high-level signals. The second power line VGL keeps providing low-level signals.

In some examples, an output signal of the second output terminal OUT2 may be configured to turn on an N-type thin film transistor in the pixel circuit, and an output signal of the third output terminal OUT3 may be configured to turn on a P-type thin film transistor in the pixel circuit. However, no limits are made thereto in the present disclosure.

The working process of the shift register unit provided in the present exemplary embodiment includes the following eight stages.

In a first stage t11, the first clock signal line CK1 inputs a low-level signal, the second clock signal line CB1 inputs a high-level signal, the first initial signal line STV1 inputs a high-level signal, and the control signal line CSL inputs a high-level signal. The tenth transistor T10 is turned on, and a potential of the second control node P2 is pulled up. The eighth transistor T8, the ninth transistor T9, and the eleventh transistor T11 are turned off, the seventh transistor T7 is turned on, and a potential of the first control node P1 is pulled down. The twelfth transistor T12 and the fourteenth transistor T14 are turned on, the thirteenth transistor T13 is turned off, and the first output terminal OUT1 outputs a high-level signal. The fifth transistor T5 is turned off, the sixth transistor T6 is turned on, and the second output terminal OUT2 outputs a low-level signal. The second transistor T2 and the fourth transistor T4 are turned on, the first transistor T1 and the third transistor T3 are turned off, and the third output terminal OUT3 outputs a low-level signal.

In a second stage t12, the first clock signal line CK1 inputs a high-level signal, the second clock signal line CB1 inputs a low-level signal, the first initial signal line STV1 inputs a low-level signal, and the control signal line CSL inputs a low-level signal. The eighth transistor T8 and the ninth transistor T9 are turned on, the seventh transistor T7, the tenth transistor T10, and the eleventh transistor T11 are turned off, the first control node P1 is kept at a low potential, and the second control node P2 is kept at a high potential. The twelfth transistor T12 and the fourteenth transistor T14 are turned on, the thirteenth transistor T13 is turned off, and the first output terminal OUT1 outputs a high-level signal. The fifth transistor T5 is turned off, the sixth transistor T6 is turned on, and the second output terminal OUT2 outputs a low-level signal. The third transistor T3 and the fourth transistor T4 are turned off, the first transistor T1 and the second transistor T2 are turned on, and the third output terminal OUT3 outputs a high-level signal.

In a third stage t13, the first clock signal line CK1 inputs a low-level signal, the second clock signal line CB1 inputs a high-level signal, the first initial signal line STV1 inputs a low-level signal, and the control signal line CSL inputs a low-level signal. The tenth transistor T10 is turned on, and the potential of the second control node P2 is pulled down. The eighth transistor T8 and the eleventh transistor T11 are turned on, the seventh transistor T7 and the ninth transistor R9 are turned on, and the potential of the first control node P1 is pulled up. The twelfth transistor T12 and the thirteenth transistor T13 are turned on, the fourteenth transistor T14 is turned off, and the first output terminal OUT1 outputs a low-level signal. The fifth transistor T5 is turned on, the sixth transistor T6 is turned off, and the second output terminal OUT2 outputs a high-level signal. The first transistor T1 and the third transistor T3 are turned on, the second transistor T2 and the fourth transistor T4 are turned off, and the third output terminal OUT3 outputs a low-level signal.

In a fourth stage t14, the first clock signal line CK1 inputs a high-level signal, the second clock signal line CB1 inputs a low-level signal, the first initial signal line STV1 inputs a low-level signal, and the control signal line CSL inputs a low-level signal. The tenth transistor T10 is turned off, and the second control node P2 is kept at a low potential. The eighth transistor T8, the ninth transistor T9, and the eleventh transistor T11 are turned on, the seventh transistor T7 is turned off, and the first control node P1 is kept at a high potential. The twelfth transistor T12 and the thirteenth transistor T13 are turned on, the fourteenth transistor T14 is turned off, and the first output terminal OUT1 outputs a low-level signal. The fifth transistor T5 is turned on, the sixth transistor T6 is turned off, and the second output terminal OUT2 outputs a high-level signal. The first transistor T1 and the third transistor T3 are turned on, the second transistor T2 and the fourth transistor T4 are turned off, and the third output terminal OUT3 outputs a low-level signal.

In a fifth stage t15, the first clock signal line CK1 inputs a low-level signal, the second clock signal line CB1 inputs a high-level signal, the first initial signal line STV1 inputs a low-level signal, and the control signal line CSL inputs a low-level signal. The tenth transistor T10 is turned on, and the second control node P2 is kept at a low potential. The eighth transistor T8 and the eleventh transistor T11 are turned on, the ninth transistor T9 and the seventh transistor T7 are turned off, and the first control node P1 is kept at a high potential. The twelfth transistor T12 and the thirteenth transistor T13 are turned on, the fourteenth transistor T14 is turned off, and the first output terminal OUT1 outputs a low-level signal. The fifth transistor T5 is turned on, the sixth transistor T6 is turned off, and the second output terminal OUT2 outputs a high-level signal. The second transistor T2 and the fourth transistor T4 are turned off, the first transistor T1 and the third transistor T3 are turned on, and the third output terminal OUT3 outputs a low-level signal.

In a sixth stage t14, the first clock signal line CK1 inputs a high-level signal, the second clock signal line CB1 inputs a low-level signal, the first initial signal line STV1 inputs a high-level signal, and the control signal line CSL inputs a low-level signal. The tenth transistor T10 is turned off, and the second control node P2 is kept at a low potential. The eighth transistor T8 and the seventh transistor T7 are turned off, the ninth transistor T9 and the eleventh transistor T11 are turned on, and the first control node P1 is kept at a high potential. The twelfth transistor T12 and the thirteenth transistor T13 are turned on, the fourteenth transistor T14 is turned off, and the first output terminal OUT1 outputs a low-level signal. The fifth transistor T5 is turned on, the sixth transistor T6 is turned off, and the second output terminal OUT2 outputs a high-level signal. The second transistor T2 and the fourth transistor T4 are turned off, the first transistor T1 and the third transistor T3 are turned on, and the third output terminal OUT3 outputs a low-level signal.

In a seventh stage t17, the first clock signal line CK1 inputs a low-level signal, the second clock signal line CB1 inputs a high-level signal, the first initial signal line STV1 inputs a high-level signal, and the control signal line CSL inputs a low-level signal. The tenth transistor T10 is turned on, and the potential of the second control node P2 is pulled up. The eighth transistor T8, the ninth transistor T9, and the eleventh transistor T11 are turned off, the seventh transistor T7 is turned on, and the potential of the first control node P1 is pulled down. The twelfth transistor T12 and the fourteenth transistor T14 are turned on, the thirteenth transistor T13 is turned off, and the first output terminal OUT1 outputs a high-level signal. The fifth transistor T5 is turned off, the sixth transistor T6 is turned on, and the second output terminal OUT2 outputs a low-level signal. The first transistor T1 and the second transistor T2 are turned on, the third transistor T3 and the fourth transistor T4 are turned off, and the third output terminal OUT3 outputs a high-level signal.

In an eighth stage t18, the first clock signal line CK1 inputs a high-level signal, the second clock signal line CB1 inputs a low-level signal, the first initial signal line STV1 inputs a high-level signal, and the control signal line CSL inputs a low-level signal. The tenth transistor T10 is turned off, and the second control node P2 is kept at a high potential. The eighth transistor T8, the seventh transistor T7, and the eleventh transistor T11 are turned off, the ninth transistor T9 is turned on, and the first control node P1 is kept at a low potential. The twelfth transistor T12 and the fourteenth transistor T14 are turned on, the thirteenth transistor T13 is turned off, and the first output terminal OUT1 outputs a high-level signal. The fifth transistor T5 is turned off, the sixth transistor T6 is turned on, and the second output terminal OUT2 outputs a low-level signal. The first transistor T1 and the second transistor T2 are turned on, the third transistor T3 and the fourth transistor T4 are turned off, and the third output terminal OUT3 outputs a high-level signal.

The seventh stage t17 and the eighth stage t18 may be repeated after the eighth stage t18, and the working process is restarted from the first stage when the first input terminal INPUT1 inputs a low-level signal and the control signal line CSL inputs a high-level signal.

It can be seen according to the abovementioned working process of the shift register unit that: in the third stage t13 to the sixth stage t16, the first output terminal OUT1 outputs low-level signals, the second output terminal OUT2 outputs high-level signals, and the third output terminal OUT3 outputs low-level signals; and the third output terminal OUT3 also outputs a low-level signal in the first stage t11. The third output terminal OUT3 outputs low-level signals at intervals within the time of one frame. The output signals provided by the first output terminal OUT1 and the second output terminal OUT2 are opposite in phase. An effective level signal provided by the second output terminal OUT2 is a high-level signal, and an effective level signal provided by the third output terminal OUT3 is a low-level signal. Moreover, within the time of one frame, a duration of a low-level signal output by the third output terminal OUT3 is longer than that of a high-level signal output by the second output terminal OUT2.

Figure 9:
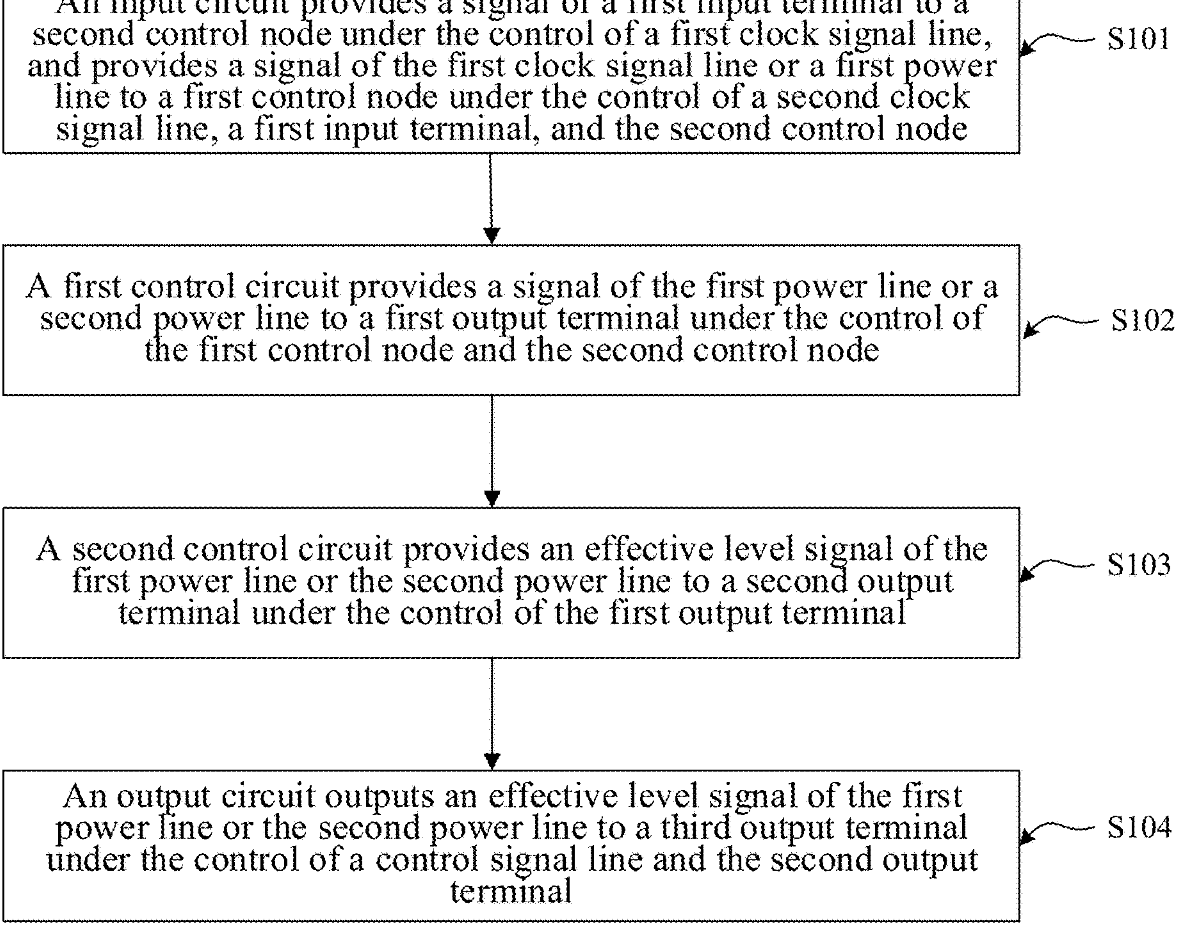
FIG. 9 is a flowchart of a driving method of a shift register unit according to at least one embodiment of the present disclosure.

An embodiment of the present disclosure also provides a driving method of a shift register unit. FIG. 9 is a flowchart of a driving method of a shift register unit according to an embodiment of the present disclosure. As shown in FIG. 9, the driving method of a shift register unit in the present embodiment is applied to the shift register unit provided in the abovementioned embodiment. The driving method provided in the present embodiment may include the following multiple steps.

In S101, an input circuit provides a signal of a first input terminal to a second control node under the control of a first clock signal line, and provides a signal of the first clock signal line or a first power line to a first control node under the control of a second clock signal line, a first input terminal, and the second control node.

In S102, a first control circuit provides a signal of the first power line or a second power line to a first output terminal under the control of the first control node and the second control node.

In S103, a second control circuit provides an effective level signal of the first power line or the second power line to a second output terminal under the control of the first output terminal.

In S104, an output circuit outputs an effective level signal of the first power line or the second power line to a third output terminal under the control of a control signal line and the second output terminal. Herein, within the time of one frame, a duration of an effective level signal provided by the third output terminal is longer than that of an effective level signal provided by the second output terminal.

In some exemplary implementation modes, S104 may include that: the output circuit outputs an effective level signal of the second power line to the third output terminal in a first time period within the time of one frame under the control of the control signal line; and the output circuit outputs the effective level signal of the second power line to the third output terminal in a second time period spaced from the first time period within the time of the one frame under the control of the second output terminal. In the present exemplary implementation mode, the first time period and second time period within the time of the one frame are discontinuous, and an effective level signal of the first power line may be output to the third output terminal between the first time period and the second time period. In some examples, a length of the first time period is shorter than that of the second time period.

The driving method of the shift register unit provided in the present exemplary embodiment and the structure and working process of the shift register unit have been described in the abovementioned embodiment, and will not be elaborated herein.

Figure 10:
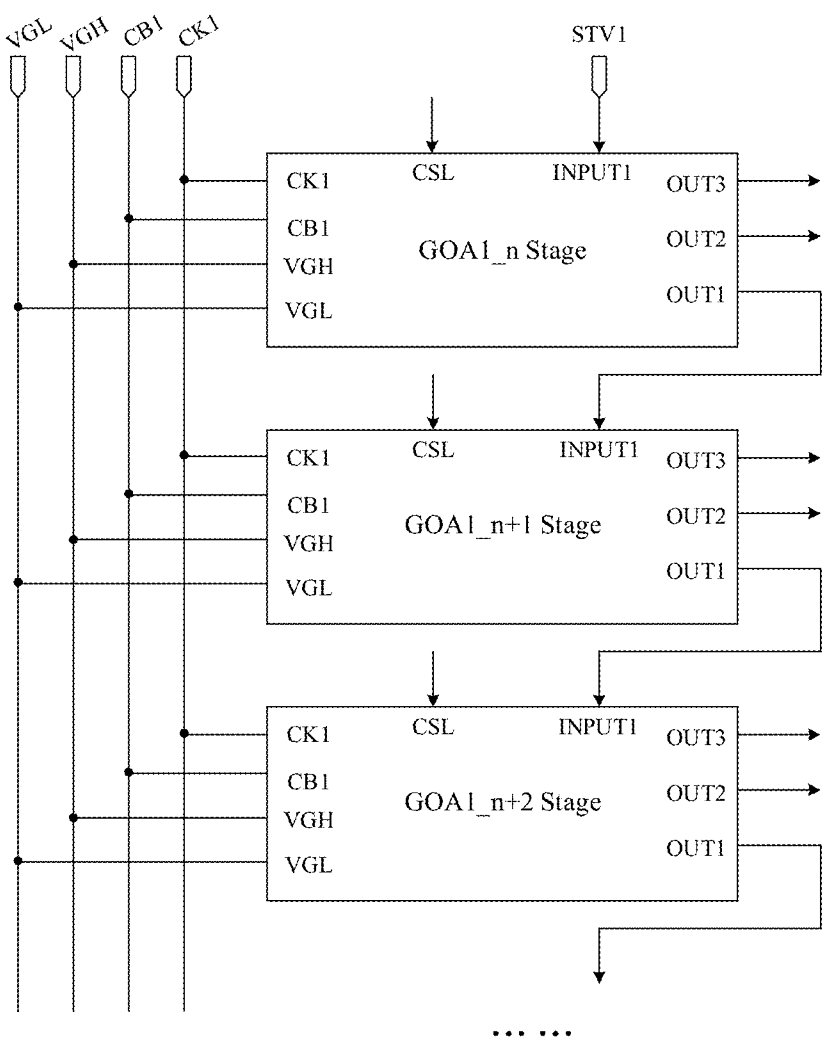
FIG. 10 is a schematic diagram of a gate driving circuit according to at least one embodiment of the present disclosure.

An embodiment of the present disclosure also provides a gate driving circuit. FIG. 10 is a schematic diagram of a gate driving circuit according to at least one embodiment of the present disclosure. As shown in FIG. 10, the gate driving circuit provided in the present exemplary embodiment includes multiple cascaded first shift register units GOA1. The first shift register unit GOA1 is the shift register unit provided in the abovementioned embodiment, and an implementation principle and implementation effect thereof are similar and thus will not be elaborated herein.

In the present exemplary embodiment, as shown in FIG. 10, a first input terminal INPUT1 of the first-stage first shift register unit is connected with a first initial signal line STV1. A first input terminal of an (n+1)th-stage first shift register unit is connected with a first output terminal of an nth-stage first shift register unit, n being an integer greater than 0.

Figure 11:
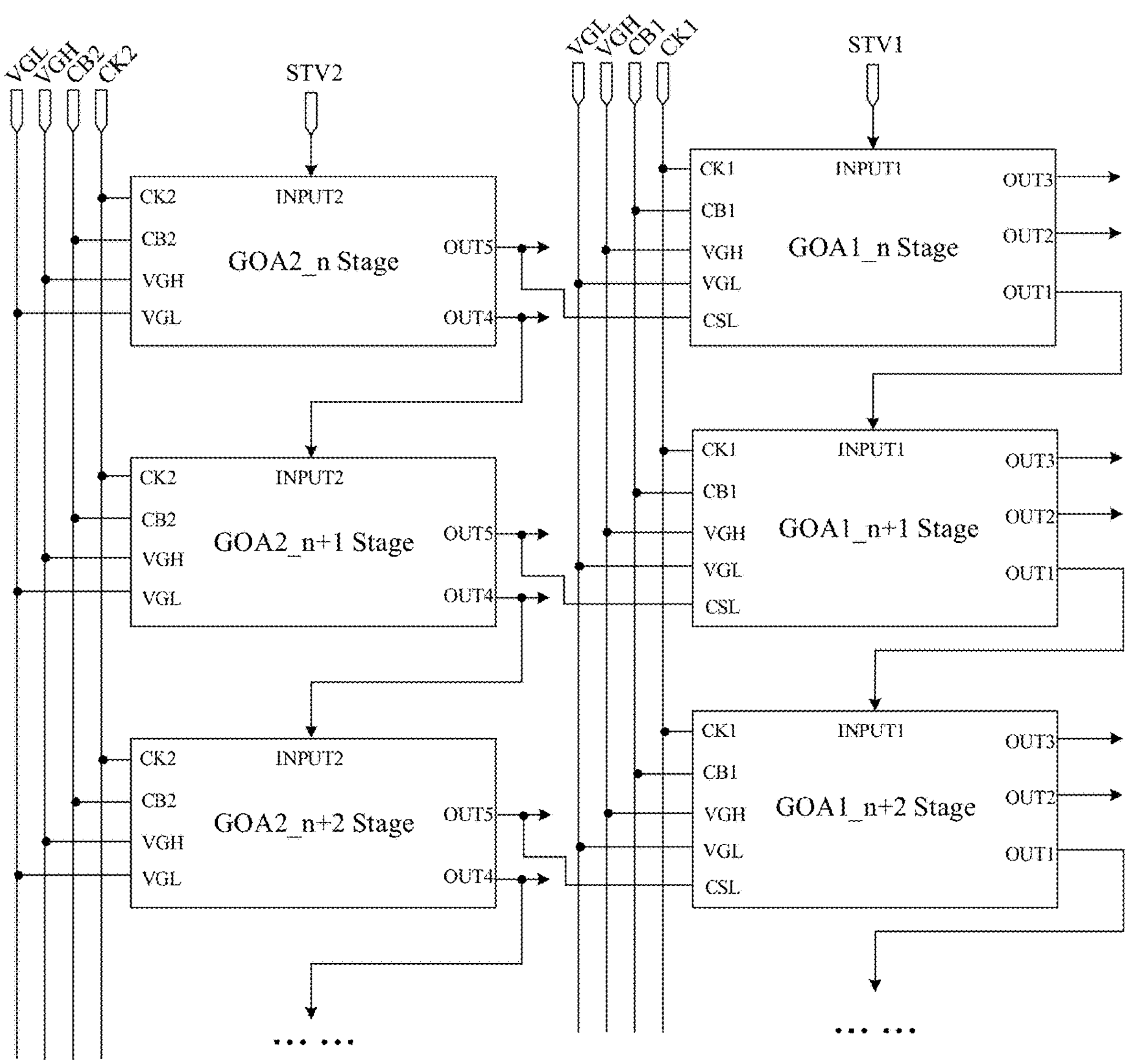
FIG. 11 is another schematic diagram of a gate driving circuit according to at least one embodiment of the present disclosure.

FIG. 11 is another schematic diagram of a gate driving circuit according to at least one embodiment of the present disclosure. As shown in FIG. 11, the gate driving circuit provided in the present exemplary embodiment includes multiple cascaded first shift register units GOA1 and multiple cascaded second shift register units GOA2. The first shift register unit GOA1 is the shift register unit provided in the abovementioned embodiment, and an implementation principle and implementation effect thereof are similar and thus will not be elaborated herein. The second shift register unit GOA2 includes a second input terminal INPUT2, a fourth output terminal OUT4, and a fifth output terminal OUT5. The second input terminal of the first-stage second shift register unit is connected with a second initial signal line STV2. The second input terminal of the (n+1)th-stage second shift register unit is connected with the fourth output terminal of the nth-stage second shift register unit. The fifth output terminal of the nth-stage second shift register unit is connected with a control signal line CSL of the nth-stage first shift register unit. Herein, n is an integer greater than 0. In the present exemplary embodiment, the second shift register unit provides a control signal to the first shift register unit through a control signal line. However, no limits are made thereto in the present embodiment.

Figure 12:
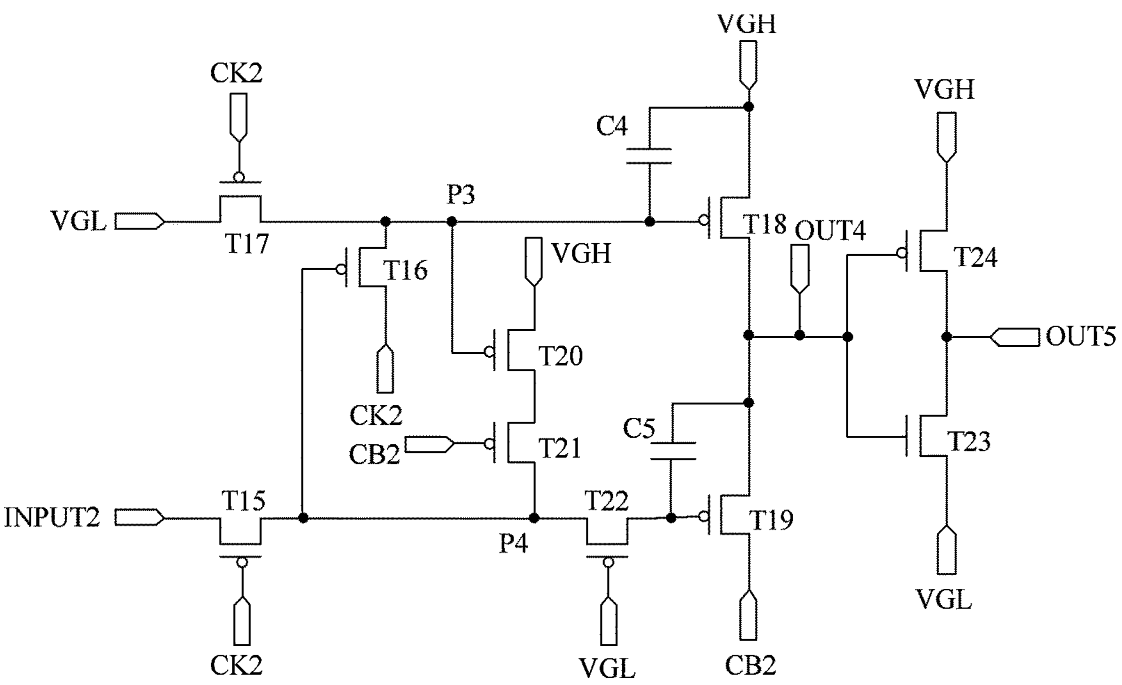
FIG. 12 is an equivalent circuit diagram of a second shift register unit according to at least one embodiment of the present disclosure.

FIG. 12 is an equivalent circuit diagram of a second shift register unit according to at least one embodiment of the present disclosure. As shown in FIG. 12, the second shift register unit provided in the present exemplary embodiment includes a fifteenth transistor T15 to a twenty-fourth transistor T24, a fourth capacitor C4, and a fifth capacitor C5. A control electrode of the fifteenth transistor T15 is connected with a third clock signal line CK2, a first electrode of the fifteenth transistor T15 is connected with the second input terminal INPUT2, and a second electrode of the fifteenth transistor T15 is connected with a fourth control node P4. A control electrode of a sixteenth transistor T16 is connected with the fourth control node P4, a first electrode of the sixteenth transistor T16 is connected with the third clock signal line CK2, and a second electrode of the sixteenth transistor T16 is connected with a third control node P3. A control electrode of a seventeenth transistor T17 is connected with the third clock signal line CK2, a first electrode of the seventeenth transistor T17 is connected with a second power line VGL, and a second electrode of the seventeenth transistor T17 is connected with the third control node P3. A control electrode of an eighteenth transistor T18 is connected with the third control node P3, a first electrode of the eighteenth transistor T18 is connected with a first power line VGH, and a second electrode of the eighteenth transistor T18 is connected with the fourth output terminal OUT4. A control electrode of a nineteenth transistor T19 is connected with a second electrode of a twenty-second transistor T22, a first electrode of the nineteenth transistor T19 is connected with a fourth clock signal line CB2, and a second electrode of the nineteenth transistor T19 is connected with the fourth output terminal OUT4. A control electrode of a twentieth transistor T20 is connected with the third control node P3, a first electrode of the twentieth transistor T20 is connected with the first power line VGH, and a second electrode of the twentieth transistor T20 is connected with a first electrode of a twenty-first transistor T21. A control electrode of the twenty-first transistor T21 is connected with the fourth clock signal line CB2, and a second electrode of the twenty-first transistor T21 is connected with the fourth control node P4. A control electrode of the twenty-second transistor T22 is connected with the second power line VGL, a first electrode of the twenty-second transistor T22 is connected with the fourth control node P4, and the second electrode of the twenty-second transistor T22 is connected with the control electrode of the nineteenth transistor T19. A control electrode of a twenty-third transistor T23 is connected with the fourth output terminal OUT4, a first electrode of the twenty-third transistor T23 is connected with the second power line VGL, and a second electrode of the twenty-third transistor T23 is connected with the fifth output terminal OUT5. A control electrode of the twenty-fourth transistor T24 is connected with the fourth output terminal OUT4, a first electrode of the twenty-fourth transistor T24 is connected with the first power line VGH, and a second electrode of the twenty-fourth transistor T24 is connected with the fifth output terminal OUT5. A first electrode of the fourth capacitor C4 is connected with the control electrode of the eighteenth transistor T18, and a second electrode of the fourth capacitor C4 is connected with the first power line VGH. A first electrode of the fifth capacitor C5 is connected with the control electrode of the nineteenth transistor T19, and a second electrode of the fifth capacitor C5 is connected with the fourth output terminal OUT4.

In some examples, the twenty-third transistor T23 in the second shift register unit is an N-type transistor, e.g., an oxide thin film transistor. The other transistors in the second shift register unit are P-type transistors, e.g., low temperature poly-silicon thin film transistors. However, no limits are made thereto in the present embodiment.

Figure 13:
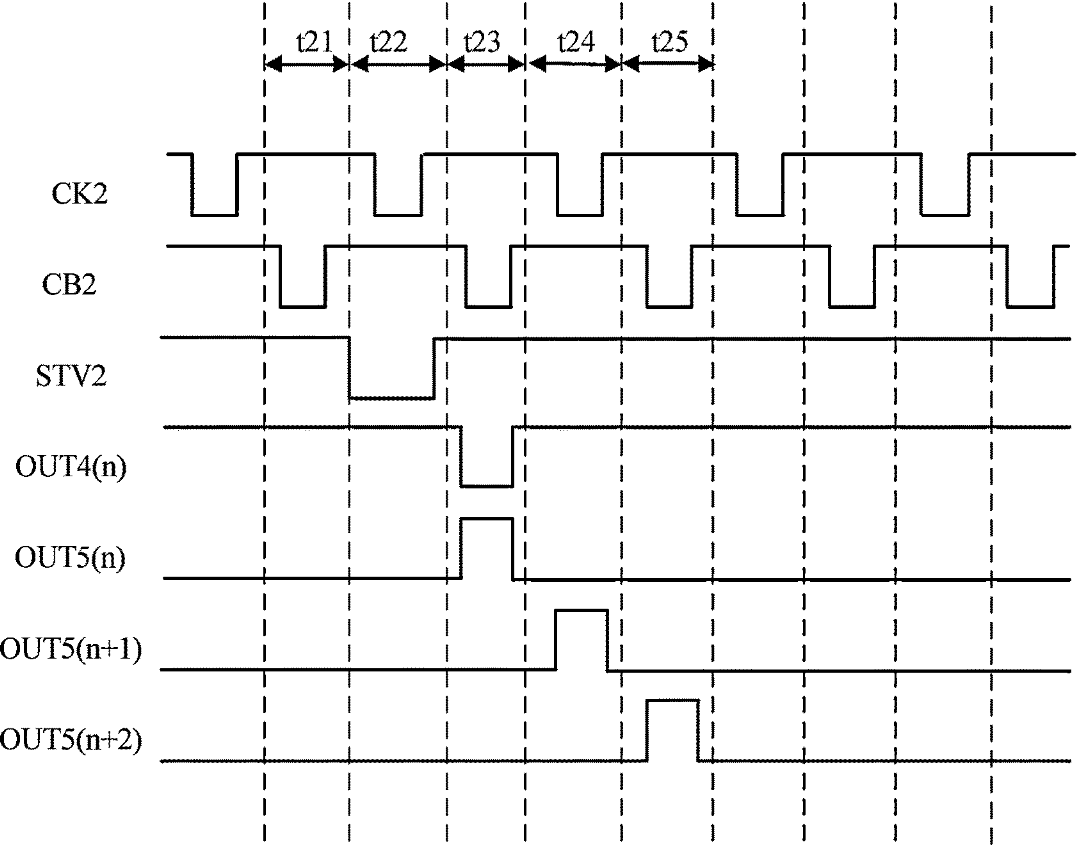
FIG. 13 is a working timing diagram of the second shift register unit shown in FIG. 12.

The following description is made taking a working process of the first-stage second shift register unit as an example. The second input terminal INPUT2 of the first-stage second shift register unit is connected with the second initial signal line STV2. FIG. 13 is a working timing diagram of the second shift register unit shown in FIG. 12. As shown in FIGS. 12 and 13, the second shift register unit of the present exemplary embodiment includes ten transistor units (i.e., the fifteenth transistor T15 to the twenty-fourth transistor T24), two capacitor units (i.e., the fourth capacitor C4 to the fifth capacitor C5), three input terminals (i.e., the third clock signal line CK2, the fourth clock signal line CB2, and the second input terminal INPUT2), two output terminals (i.e., the fourth output terminal OUT4 and the fifth output terminal OUT5), and two power terminals (i.e., the first power line VGH and the second power line VGL). The first power line VGH keeps providing high-level signals. The second power line VGL keeps providing low-level signals.

In some examples, an output signal of the fourth output terminal OUT5 is opposite to an output signal of the fifth output terminal OUT5 in phase. The output signal of the fourth output terminal OUT4 may be configured to turn on a P-type transistor in the pixel circuit, and the output signal of the fifth output terminal OUT5 may be configured to turn on an N-type transistor in the pixel circuit. However, no limits are made thereto in the present disclosure.

The working process of the second shift register unit provided in the present exemplary embodiment includes the following five stages.

In a first stage t21, the third clock signal line CK2 inputs a high-level signal, the fourth clock signal line CB2 inputs a low-level signal, and the second initial signal line STV1 inputs a high-level signal. The seventeenth transistor T17, the fifteenth transistor T15, the sixteenth transistor T16, and the nineteenth transistor T19 are turned off, the twentieth transistor T20, the twenty-first transistor T21, the twenty-second transistor T22, and the eighteenth transistor T18 are turned on, and the fourth output terminal OUT4 outputs a high-level signal. The twenty-third transistor T23 is turned on, the twenty-fourth transistor T24 is turned off, and the fifth output terminal OUT5 outputs a low-level signal.

In a second stage t22, the third clock signal line CK2 inputs a low-level signal, the fourth clock signal line CB2 inputs a high-level signal, and the second initial signal line STV1 inputs a low-level signal. The fifteenth transistor T15, the seventeenth transistor T17, the sixteenth transistor T16, the twenty-second transistor T22, the twentieth transistor T20, the eighteenth transistor T18, and the nineteenth transistor T19 are turned on, the twenty-first transistor T21 is turned off, and the fourth output terminal OUT4 outputs a high-level signal. The twenty-third transistor T23 is turned on, the twenty-fourth transistor T24 is turned off, and the fifth output terminal OUT5 outputs a low-level signal.

In a third stage t23, the third clock signal line CK2 inputs a high-level signal, the fourth clock signal line CB2 inputs a low-level signal, and the second initial signal line STV1 inputs a high-level signal. The fifteenth transistor T15, the seventeenth transistor T17, the twentieth transistor T20, and the eighteenth transistor T18 are turned off, the sixteenth transistor T16, the twenty-first transistor T21, the twenty-second transistor T22, and the nineteenth transistor T19 are turned on, and the fourth output terminal OUT4 outputs a low-level signal. The twenty-third transistor T23 is turned off, the twenty-fourth transistor T24 is turned on, and the fifth output terminal OUT5 outputs a high-level signal.

In a fourth stage t24, the third clock signal line CK2 inputs a low-level signal, the fourth clock signal line CB2 inputs a high-level signal, and the second initial signal line STV1 inputs a high-level signal. The fifteenth transistor T15, the seventeenth transistor T17, the sixteenth transistor T16, the twentieth transistor T20, the eighteenth transistor T18, the twenty-second transistor T22, and the nineteenth transistor T19 are turned on, the twenty-first transistor T21 is turned off, and the fourth output terminal OUT4 outputs a high-level signal. The twenty-third transistor T23 is turned on, the twenty-fourth transistor T24 is turned off, and the fifth output terminal OUT5 outputs a low-level signal.

In a fifth stage t25, the third clock signal line CK2 inputs a high-level signal, the fourth clock signal line CB2 inputs a low-level signal, and the second initial signal line STV1 inputs a high-level signal. The fifteenth transistor T15, the seventeenth transistor T17, the sixteenth transistor T16, and the nineteenth transistor T19 are turned off, the twentieth transistor T20, the twenty-first transistor T21, the twenty-second transistor T22, and the eighteenth transistor T18 are turned on, and the fourth output terminal OUT4 outputs a high-level signal. The twenty-third transistor T23 is turned on, the twenty-fourth transistor T24 is turned off, and the fifth output terminal OUT5 outputs a low-level signal.

The fourth stage t24 and the fifth stage t25 may be repeated after the fifth stage t25, and the working process is restarted when the second input terminal INPUT2 inputs a low-level signal.

It can be seen according to the abovementioned working process of the second shift register unit that: in the third stage, the fourth output terminal OUT4 outputs a low-level signal, and the fifth output terminal OUT5 outputs a high-level signal; and in the other stages, the fourth output terminal OUT4 outputs high-level signals, and the fifth output terminal OUT5 outputs low-level signals. The output signals provided by the fourth output terminal OUT4 and fifth output terminal OUT5 of the second shift register unit of the present exemplary embodiment are opposite in phase. An output signal of the fifth output terminal of the nth-stage second shift register unit may be provided to the nth-stage first shift register unit through a control signal line CSL.

In some examples, cycles of clock signal provided by the third clock signal line and the fourth clock signal line may be the same, and may be the same as those of clock signals provided by the first clock signal line and the second clock signal line. It can be seen according to the abovementioned working processes of the second shift register unit and the first shift register unit that a duration of an effective level signal provided by the fifth output terminal of the second shift register unit is shorter than that of an effective level signal provided by the third output terminal of the first shift register unit. The effective level signal provided by the third output terminal of the first shift register unit may be configured to control threshold voltage compensation time of the pixel circuit. The effective level signal provided by the fifth output terminal of the second shift register unit may be configured to control data signal writing time of the pixel circuit. The threshold voltage compensation and data signal writing of the pixel circuit may be controlled separately to implement rapid data writing and threshold voltage full compensation, thereby reducing display defects and improving the display effect.

Figure 14:
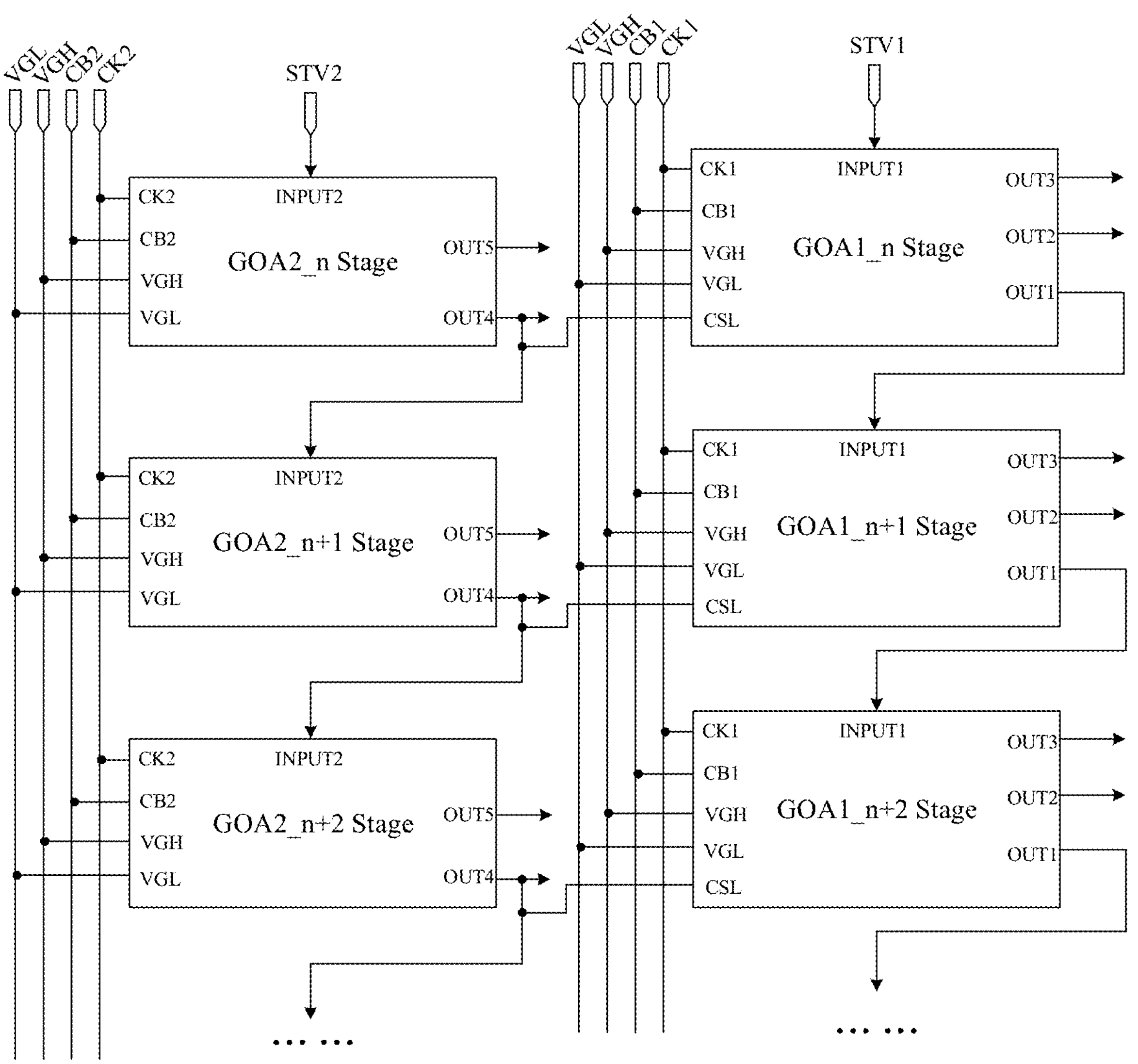
FIG. 14 is another schematic diagram of a gate driving circuit according to at least one embodiment of the present disclosure.

FIG. 14 is another schematic diagram of a gate driving circuit according to at least one embodiment of the present disclosure. As shown in FIG. 14, the gate driving circuit provided in the present exemplary embodiment includes multiple cascaded first shift register units GOA1 and multiple cascaded second shift register units GOA2. The first shift register unit GOA1 is the shift register unit provided in the abovementioned embodiment, and an implementation principle and implementation effect thereof are similar and thus will not be elaborated herein. The second shift register unit GOA2 includes a second input terminal INPUT2, a fourth output terminal OUT4, and a fifth output terminal OUT5. The second input terminal of the first-stage second shift register unit is connected with a second initial signal line STV2. The second input terminal of the (n+1)th-stage second shift register unit is connected with the fourth output terminal of the nth-stage second shift register unit. The fourth output terminal of the nth-stage second shift register unit is connected with a control signal line CSL of the nth-stage first shift register unit. Herein, n is an integer greater than 0. In some examples, a first transistor in the first shift register unit may be an N-type transistor, and a fourth transistor may be a P-type transistor. In the present exemplary implementation mode, the second shift register unit provides a control signal to the first shift register unit through a control signal line. However, no limits are made thereto in the present embodiment. Related contents of the other structures of the second shift register and first shift register unit of the present exemplary implementation mode may refer to the description about the abovementioned embodiment, and thus will not be elaborated herein.

Figure 15:
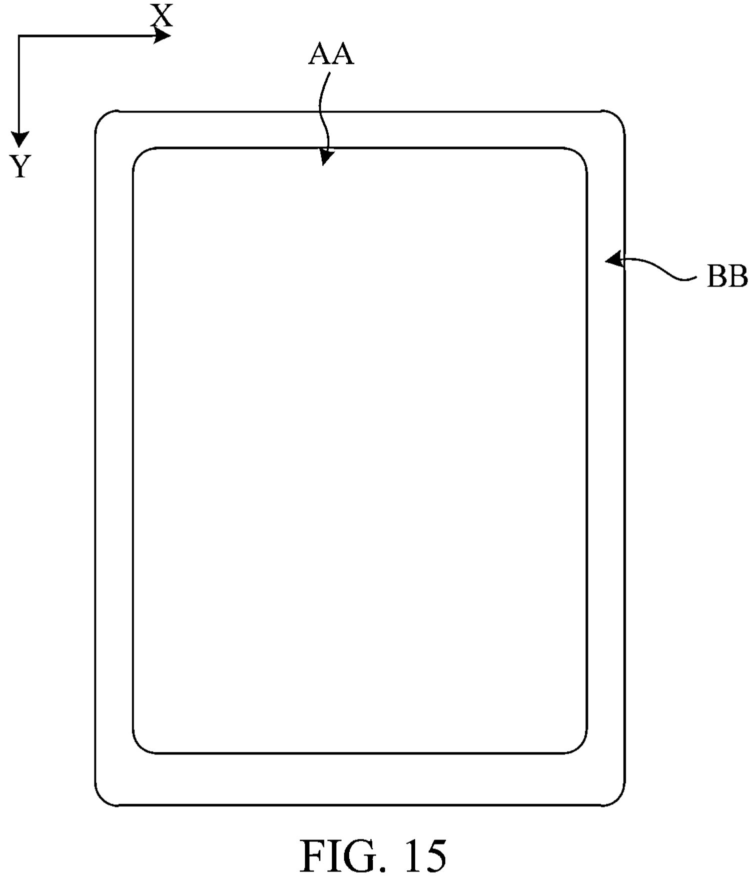
FIG. 15 is a schematic diagram of a display substrate according to at least one embodiment of the present disclosure.

FIG. 15 is a schematic diagram of a display substrate according to at least one embodiment of the present disclosure. As shown in FIG. 15, the display substrate of the present exemplary embodiment includes a display region AA and a peripheral region BB on a periphery of the display region AA. The display region AA at least includes multiple regularly arranged pixel units, multiple gate lines (for example, including a scanning line, a reset signal line, and a light emitting control line) extending in a first direction X, multiple data lines extending in a second direction Y, and a power line. The first direction X and the second direction Y are in the same plane. The first direction X is perpendicular to the second direction Y.

In some examples, a pixel unit in the display region AA may include three sub-pixels, i.e., a red sub-pixel, a green sub-pixel, and a blue sub-pixel respectively. However, no limits are made thereto in the present embodiment. In some examples, a pixel unit may include four sub-pixels, i.e., a red sub-pixel, a green sub-pixel, a blue sub-pixel, and a white sub-pixel respectively.

In some examples, the sub-pixel may be shaped into a rectangle, a rhombus, a pentagon, or a hexagon. When a pixel unit includes three sub-pixels, the three sub-pixels may be arranged in parallel in a horizontal direction, in parallel in a vertical direction, or in a Delta shape. When a pixel unit includes four sub-pixels, the four sub-pixels may be arranged in parallel in the horizontal direction, in parallel in the vertical direction, or in a square. However, no limits are made thereto in the present embodiment.

In some examples, a timing controller, a data driving circuit, and a gate driving circuit may be arranged in the peripheral region BB. The gate driving circuit may be arranged on two opposite sides of the display region AA respectively. The timing controller and the data driving circuit may be arranged on one side of the display region AA. However, no limits are made thereto in the present embodiment.

In some examples, the data driving circuit may provide a data signal to the sub-pixel through the data line. The gate driving circuit may provide a scanning signal to the sub-pixel through the scanning line, provide a reset signal to the sub-pixel through the reset signal line, and provide a light emitting control signal to the sub-pixel through the light emitting control line. The timing controller may provide driving signals to the data driving circuit and the gate driving circuit. The gate driving circuit and the data driving circuit may be controlled by the timing controller to act. The timing controller may provide gray scale data specifying a gray scale that should be displayed at a sub-pixel to the data driving circuit. The data driving circuit may provide a data signal of a potential corresponding to the gray scale data of the sub-pixel to a sub-pixel of a row selected by the gate driving circuit through a data line.

Figure 16:
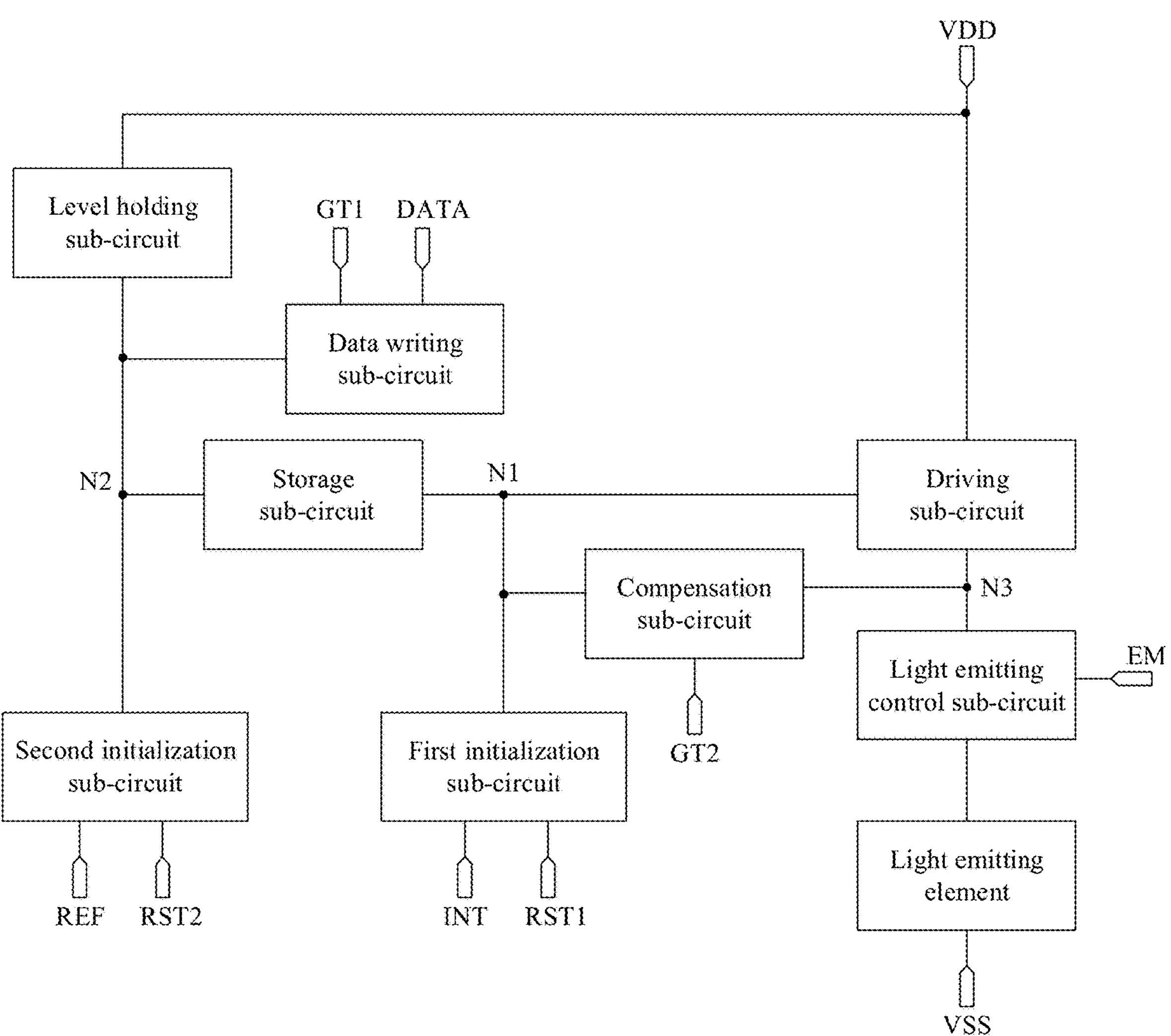
FIG. 16 is a structural schematic diagram of a pixel circuit according to at least one embodiment of the present disclosure.

FIG. 16 is a structural schematic diagram of a pixel circuit according to at least one embodiment of the present disclosure. As shown in FIG. 16, the pixel circuit of the present exemplary embodiment includes a data writing sub-circuit, a driving sub-circuit, a storage sub-circuit, a level holding sub-circuit, a light emitting control sub-circuit, a first initialization sub-circuit, and a second initialization sub-circuit. The data writing sub-circuit is connected with a data line DATA, a first scanning line GT1, and a second node N2, and is configured to write a signal of the data line DATA to the storage sub-circuit under the control of the first scanning line GT1. The driving sub-circuit is connected with a third power line VDD, a first node N1, and a third node N3, and is configured to output a driving current to the light emitting control sub-circuit through the third node N3 under the control of the first node N1. The storage sub-circuit is connected with the first node N1 and the second node N2. The level holding sub-circuit is connected with the third power line VDD and the second node N2, and is configured to hold a potential of the second node N2. A compensation sub-circuit is connected with a second scanning line GT2, the first node N1, and the third node N3, and is configured to compensate a threshold voltage of the driving sub-circuit under the control of the second scanning line GT2. The first initialization sub-circuit is connected with a first reset signal line RST1, an initial voltage line INT, and the first node N1, and is configured to initialize the first node N1 under the control of the first reset signal line RST1. The second initialization sub-circuit is connected with a second reset signal line RST2, a reference voltage line REF, and the second node N2, and is configured to initialize the second node N2 under the control of the second reset signal line RST2. The light emitting control sub-circuit is connected with a light emitting control line EM, the third node N3, and a first electrode of a light emitting element, and is configured to, under the control of the light emitting control line EM, drive the light emitting element according to the driving current to emit light. A second electrode of the light emitting element is connected with a fourth power line VSS.

In some examples, the light emitting element may be an Organic Light Emitting Diode (OLED), the first electrode may be an anode, and the second electrode may be a cathode. However, no limits are made thereto in the present embodiment.

In some examples, writing time when the data writing sub-circuit writes the signal of the data line DATA to the storage sub-circuit is shorter than compensation time of the compensation sub-circuit for the threshold voltage of the driving sub-circuit. In the present exemplary implementation mode, the data voltage writing time and the threshold voltage compensation time may be controlled separately to reduce the data voltage writing time on the basis of ensuring the threshold voltage compensation time, thereby improving the refresh rate to support the application to a high-resolution product. Moreover, the threshold voltage compensation time may be prolonged to ensure enough threshold compensation time to reduce display defects.

Figure 17:
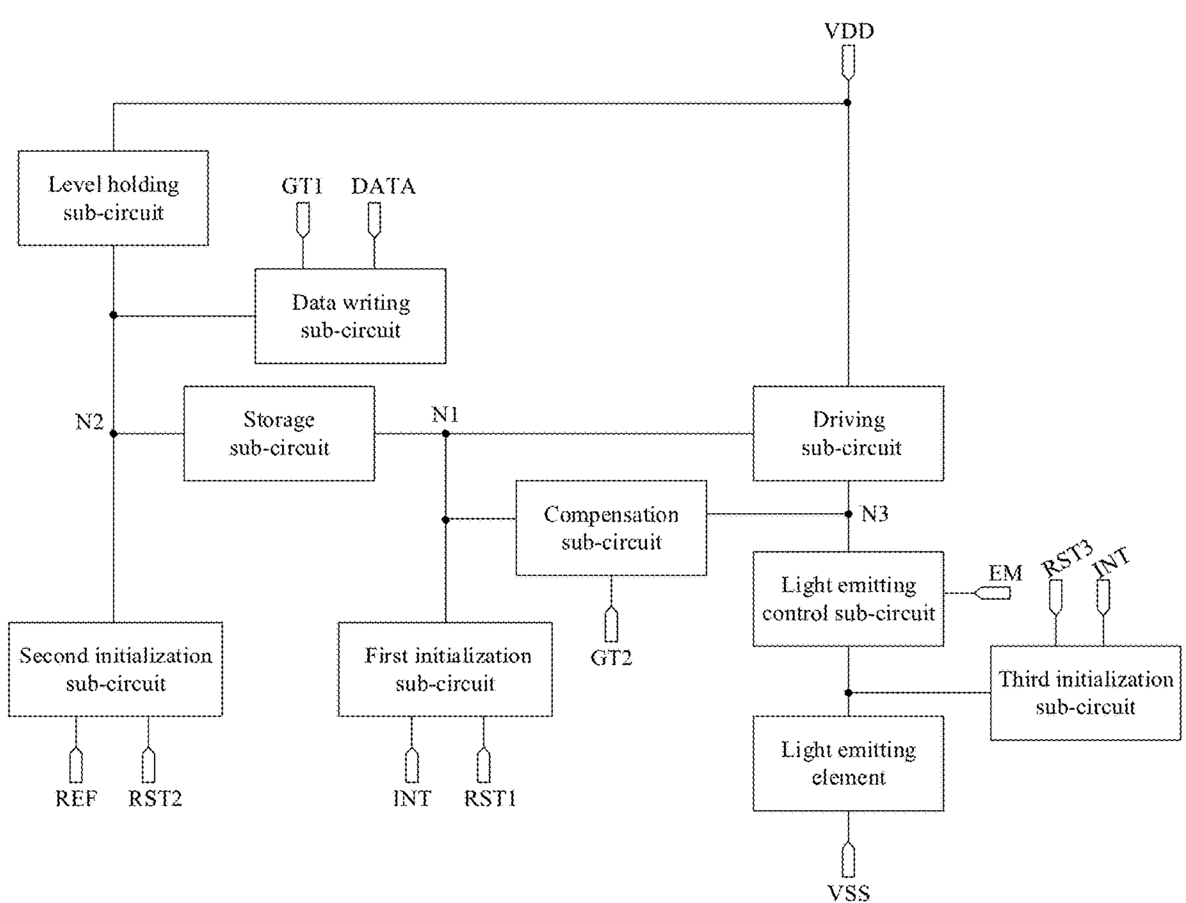
FIG. 17 is another structural schematic diagram of a pixel circuit according to at least one embodiment of the present disclosure.

FIG. 17 is another structural schematic diagram of a pixel circuit according to at least one embodiment of the present disclosure. As shown in FIG. 17, the pixel circuit of the present exemplary embodiment includes a driving sub-circuit, a light emitting control sub-circuit, a data writing sub-circuit, a storage sub-circuit, a level holding sub-circuit, a compensation sub-circuit, a first initialization sub-circuit, a second initialization sub-circuit, and a third initialization sub-circuit. The data writing sub-circuit is connected with a data line DATA, a first scanning line GT1, and a second node N2, and is configured to write a signal of the data line DATA to the storage sub-circuit under the control of the first scanning line GT1. The driving sub-circuit is connected with a third power line VDD, a first node N1, and a third node N3, and is configured to output a driving current to the light emitting control sub-circuit through the third node N3 under the control of the first node N1. The storage sub-circuit is connected with the first node N1 and the second node N2. The level holding sub-circuit is connected with the third power line VDD and the second node N2, and is configured to hold a potential of the second node N2. A compensation sub-circuit is connected with a second scanning line GT2, the first node N1, and the third node N3, and is configured to compensate a threshold voltage of the driving sub-circuit under the control of the second scanning line GT2. The first initialization sub-circuit is connected with a first reset signal line RST1, an initial voltage line INT, and the first node N1, and is configured to initialize the first node N1 under the control of the first reset signal line RST1. The second initialization sub-circuit is connected with a second reset signal line RST2, a reference voltage line REF, and the second node N2, and is configured to initialize the second node N2 under the control of the second reset signal line RST2. The light emitting control sub-circuit is connected with a light emitting control line EM, the third node N3, and a first electrode of a light emitting element, and is configured to, under the control of the light emitting control line EM, drive the light emitting element according to the driving current to emit light. A second electrode of the light emitting element is connected with a fourth power line VSS. The third initialization sub-circuit is connected with the first electrode of the light emitting element, the initial voltage line INT, and a third reset signal line RST3, and is configured to initialize the light emitting element under the control of the third reset signal line RST3. A third reset signal line RST3(*n*) connected with a pixel circuit of a sub-pixel of an nth row is arranged to be connected with a second reset signal line RST2(*n*+1) driving a pixel circuit of a sub-pixel of an (n+1)th row. However, no limits are made thereto in the present embodiment. In some examples, the third initialization sub-circuit may be connected with the first electrode of the light emitting element, the initial voltage line, and the second reset signal line and configured to initialize the light emitting element under the control of the second reset signal line.

Figure 18:
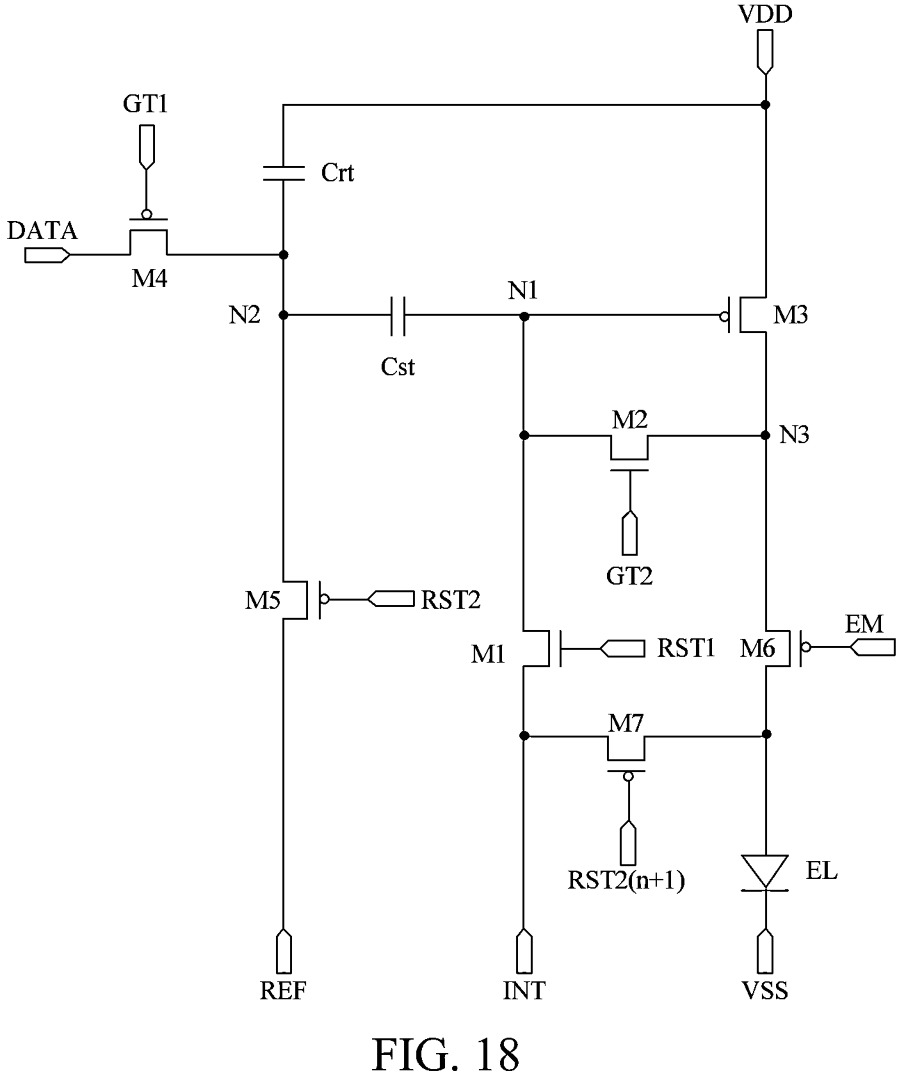
FIG. 18 is an equivalent circuit diagram of a pixel circuit according to at least one embodiment of the present disclosure.

FIG. 18 is an equivalent circuit diagram of a pixel circuit according to at least one embodiment of the present disclosure. As shown in FIG. 18, the pixel circuit of the present exemplary embodiment includes a driving sub-circuit, a light emitting control sub-circuit, a data writing sub-circuit, a storage sub-circuit, a level holding sub-circuit, a compensation sub-circuit, a first initialization sub-circuit, a second initialization sub-circuit, and a third initialization sub-circuit. The data writing sub-circuit includes a data writing transistor M4. A control electrode of the data writing transistor M4 is connected with a first scanning line GT1, a first electrode of the data writing transistor M4 is connected with a data line DATA, and a second electrode of the data writing transistor M4 is connected with a second node N2. The driving sub-circuit includes a driving transistor M3. A control electrode of the driving transistor M3 is connected with a first node N1, a first electrode of the driving transistor M3 is connected with a third power terminal VDD, and a second electrode of the driving transistor M3 is connected with a third node N3. The storage sub-circuit includes a storage capacitor Cst. A first electrode of the storage capacitor Cst is connected with the first node N1, and a second electrode of the storage capacitor Cst is connected with the second node N2. The level holding sub-circuit includes a voltage stabilizing capacitor Crt. A first electrode of the voltage stabilizing capacitor Crt is connected with the third power terminal VDD, and a second electrode of the voltage stabilizing capacitor Crt is connected with the second node N2. The compensation sub-circuit includes a compensation transistor M2. A control electrode of the compensation transistor M2 is connected with a second scanning line GT2, a first electrode of the compensation transistor M2 is connected with the first node N1, and a second electrode of the compensation transistor M2 is connected with the third node N3. The light emitting control sub-circuit includes a light emitting control transistor M6. A control electrode of the light emitting control transistor M6 is connected with a light emitting control line EM, a first electrode of the light emitting control transistor M6 is connected with the third node N3, and a second electrode of the light emitting control transistor M6 is connected with a first electrode of a light emitting element EL. A second electrode of the light emitting element EL is connected with a fourth power line VSS. The first initialization sub-circuit includes a first initialization transistor M1. A control electrode of the first initialization transistor M1 is connected with a first reset signal line RST1, a first electrode of the first initialization transistor M1 is connected with an initial voltage line INT, and a second electrode of the first initialization transistor M1 is connected with the first node N1. The second initialization sub-circuit includes a second initialization transistor M5. A control electrode of the second initialization transistor M5 is connected with a second reset signal line RST2, a first electrode of the second initialization transistor M5 is connected with a reference voltage line REF, and a second electrode of the second initialization transistor M5 is connected with the second node N2. The third initialization sub-circuit includes a third initialization transistor M7. A control electrode of the third initialization transistor M7 is connected with a third reset signal line, a first electrode of the third initialization transistor M7 is connected with the initial voltage line INT, and a second electrode of the third initialization transistor M7 is connected with the first electrode of the light emitting element EL. A third reset signal line connected with a pixel circuit of a sub-pixel of an nth row is arranged to be connected with a second reset signal line RST2(*n*+1) driving a pixel circuit of a sub-pixel of an (n+1)th row.

In some exemplary implementation modes, the compensation transistor M2 and first initialization transistor M1 of the pixel circuit are transistors of a first semiconductor type. The driving transistor M3, the data writing transistor M4, the light emitting control transistor M6, the second initialization transistor M5, and the third initialization transistor M7 are transistors of a second semiconductor type. Doping types of the first semiconductor type and the second semiconductor type are opposite. In some examples, the compensation transistor M2 and first initialization transistor M1 of the pixel circuit are N-type thin film transistors, e.g., oxide thin film transistors like IGZO thin film transistors. The driving transistor M3, data writing transistor M4, light emitting control transistor M6, second initialization transistor M5, and third initialization transistor M7 of the pixel circuit are P-type thin film transistors, e.g., low temperature polysilicon thin film transistors. However, no limits are made thereto in the present embodiment.

Figure 19:
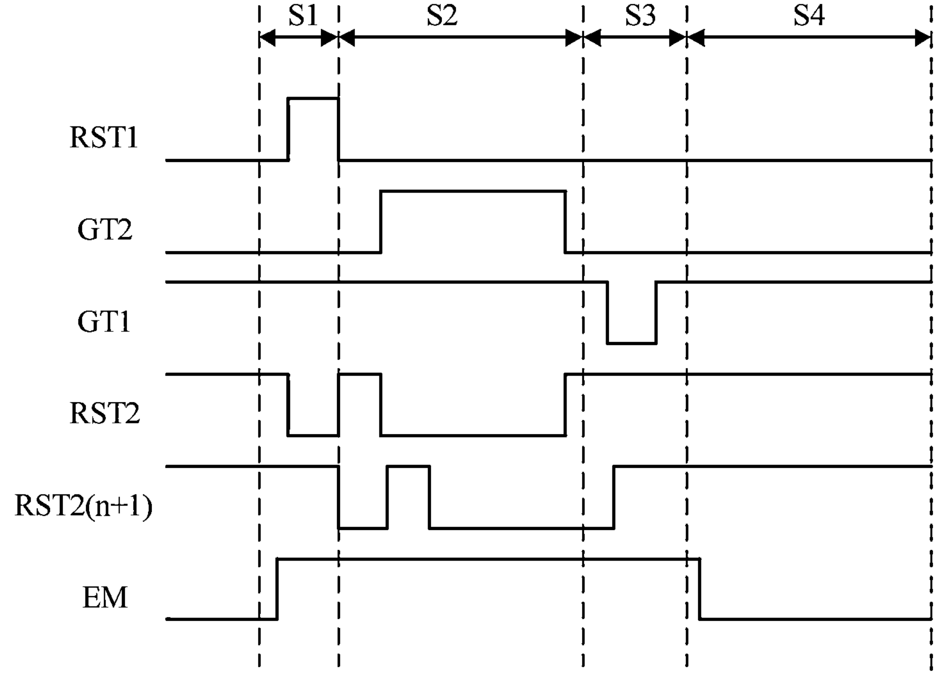
FIG. 19 is a working timing diagram of the pixel circuit shown in FIG. 18.

A working process of the pixel circuit shown in FIG. 18 will be exemplarily described below with an example that the compensation transistor M2 and first initialization transistor M1 of the pixel circuit are N-type thin film transistors and the other transistors are P-type thin film transistors. FIG. 19 is a working timing diagram of the pixel circuit shown in FIG. 18. As shown in FIG. 18, the pixel circuit of the present exemplary embodiment includes seven transistor units (M1 to M7), two capacitor units (i.e., the storage capacitor Cst to the voltage stabilizing capacitor Crt), nine input terminals (i.e., the data line DATA, the first scanning line GT1, the second scanning line GT2, the light emitting control line EM, the first reset signal line RST1, the second reset signal line RST2, the second reset signal line RST2(*n*+1), the reference power line REF, and the initial voltage line INT), and two power terminals (i.e., the third power line VDD and the fourth power line VSS). The third power line VDD keeps providing high-level signals, and the fourth power line VSS keeps providing low-level signals.

In the present exemplary implementation mode, as shown in FIGS. 18 and 19, the working process of the pixel circuit includes the following stages.

In a first stage S1, i.e., a reset stage, the first reset signal line RST1 provides a high-level signal, the first initialization transistor M1 is turned on, and a voltage $V_{N1}$ of the first node N1 is an initial voltage Vint provided by the initial voltage line INT. The second reset signal line RST2 provides a low-level signal, the second initialization transistor M5 is turned on, a voltage $V_{N2}$ of the second node N2 is a reference voltage Vref provided by the reference voltage line REF, the storage capacitor Cst is reset, and an original data voltage in the storage capacitor Cst is cleared. The first scanning line GT1 provides a high-level signal, and the data writing transistor M4 is turned off. The second scanning line GT2 provides a low-level signal, and the compensation transistor M2 is turned off. The light emitting control line EM provides a high-level signal, and the light emitting control transistor M6 is turned off. A control electrode voltage of the driving transistor M3 (i.e., the voltage $V_{N1}$ of the first node N1) is the initial voltage Vint provided by the initial voltage line INT, and the voltage $V_{N2}$ of the second node N2 is the reference voltage Vref. The second reset signal line RST2 (*n*+1) provides a high-level signal, and the third initialization transistor M7 is turned off.

In a second stage S2, i.e., a compensation stage, the first reset signal line RST1 provides a low-level signal, and the first initialization transistor M1 is turned off. The second reset signal line RST2 provides a low-level signal, the second initialization transistor M5 is turned on, and the voltage $V_{N2}$ of the second node N2 is still the reference voltage Vref. The first scanning line GT1 provides a high-level signal, and the data writing transistor M4 is turned off. The second scanning line GT2 provides a high-level signal, and the compensation transistor M2 is turned on. The light emitting control line EM provides a high-level signal, and the light emitting control transistor M6 is turned off. The second reset signal line RST2(*n*+2) provides spaced low-level signals, and the third initialization transistor M7 is turned on to provide the initial voltage Vint provided by the initial voltage line INT to the first electrode of the light emitting element EL to initialize the first electrode of the light emitting element EL.

At the beginning of the second stage S2, a difference between a voltage $V_{VDD}$ provided by the third power line VDD and the voltage of the first node N1 is greater than a threshold voltage Vth of the driving transistor M3. In such case, the driving transistor M3 is turned on, and the voltage of the third power line VDD flows to the first node N1 through the driving transistor M3 and the compensation transistor M2. Since on-time of the compensation transistor M2 is relatively long, the threshold voltage of the driving transistor M3 may be fully compensated. The driving transistor M3 is turned off when the voltage VN1 of the first node N1 rises to $V_{VDD}$+Vth. In such case, the voltage VN1 of the first node N1 is $V_{VDD}$+Vth, the voltage VN2 of the second node N2 is the reference voltage Vref, and a voltage difference between the first node N1 and the second node N2 is $V_{VDD}$+Vth−Vref.

In a third stage S3, i.e., a writing stage, the first reset signal line RST1 provides a low-level signal, and the first initialization transistor M1 is turned off. The second reset signal line RST2 provides a high-level signal, and the second initialization transistor M5 is turned off. The second scanning line GT2 provides a high-level signal, and the compensation transistor M2 is turned off. The light emitting control line EM provides a high-level signal, and the light emitting control transistor M6 is turned off. The first scanning line GT1 provides a low-level signal, the data writing transistor M4 is turned off, a signal provided by the data line DATA is written to the second node N2, namely the voltage VN2 of the second node N2 changes to a data voltage Vdata, and the first capacitor C1 may achieve a bootstrapping effect to keep a voltage difference between two terminals unchanged. In such case, the voltage of the first node N1 finally changes to $V_{VDD}$+Vth+Vdata−Vref by the bootstrapping of the capacitor to keep the voltage difference between the first node N1 and the second node N2 $V_{VDD}$+Vth−Vref.

In a fourth stage S4, i.e., a light emitting stage, the first reset signal line RST1 provides a low-level signal, and the first initialization transistor M1 is turned off. The second reset signal line RST2 provides a high-level signal, and the second initialization transistor M5 is turned off. The first scanning line GT1 provides a high-level signal, and the data writing transistor M4 is turned off. The second scanning line GT2 provides a low-level signal, and the compensation transistor M2 is turned off. The second reset signal line RST2(*n*+1) provides a high-level signal, and the third initialization transistor M7 is turned off. The light emitting control line EM provides a low-level signal, and the light emitting control transistor M6 is turned on. The voltage difference between the third power line VDD and the first node N1 is Vth+Vdata−Vref, greater than the threshold voltage Vth of the driving transistor M3. In such case, the driving transistor M3 is turned on, and the light emitting element EL is driven by the driving transistor M3 to emit light. A light emitting current of the light emitting element EL is:

$$I = \frac{1}{2}uC_{ox}W/L(Vgs - Vth)^2 = 1/2uC_{ox}W/L(V_{N1} - V_{VDD} - Vth)^2$$
$$= \frac{1}{2}uC_{ox}W/L(V_{VDD} + Vth + Vdata - Vref - V_{VDD} - Vth)^2$$
$$= \frac{1}{2}uC_{ox}W/L(Vdata - Vref)^2.$$

Herein, u is channel mobility of the driving transistor, $C_{ox}$ is channel capacitance of the driving transistor in a unit area, W and L are a channel width and channel length of the driving transistor respectively, and Vgs is a gate-source voltage of the driving transistor (i.e., a difference between a gate voltage and source voltage of the driving transistor).

It can thus be seen that the light emitting current I is unrelated to the power voltage $V_{VDD}$ of the third power line and the threshold voltage Vth and only determined by the data voltage Vdata provided by the data line DATA and the reference voltage Vref provided by the reference voltage line REF. Therefore, the influence of the threshold voltage of the driving transistor on a driving current is eliminated, the uniformity of display brightness of the display substrate is further ensured, and the display effect is improved.

In the present example, the voltage $V_{N1}$ of the first node N1 and the voltage $V_{N2}$ of the second node N2 in different abovementioned stages are shown in Table 1.

TABLE 1

| | First stage S1 | Second stage S2 | Third stage S3 | Fourth stage S4 |
|---|---|---|---|---|
| $V_{N1}$ | Vint | $V_{VDD}$ + Vth | $V_{VDD}$ + Vth + Vdata − Vref | $V_{VDD}$ + Vth + Vdata − Vref |
| $V_{N2}$ | Vref | Vref | Vdata | Vdata |

In the present exemplary implementation mode, the effective level signal provided by the first scanning line controls the writing time of the data voltage provided by the data line (i.e., on-time of the data writing transistor), and has a relatively small pulse width, and the effective level signal provided by the second scanning line controls the threshold voltage compensation time (i.e., the on-time of the compensation transistor), and has a relatively small pulse width. That is, the data voltage writing time is shorter than the threshold voltage compensation time. Therefore, when the threshold voltage compensation time is satisfied, the data voltage writing time may be reduced, and the refresh rate may be improved. Moreover, the effective level signal provided by the third reset signal line controls initialization time of the light emitting element to be greater than a sum of the data voltage writing time and the threshold voltage compensation time, so that the initialization time is prolonged, the service life of the light emitting element may be prolonged, and the service life of the display substrate is further prolonged.

Figure 20:
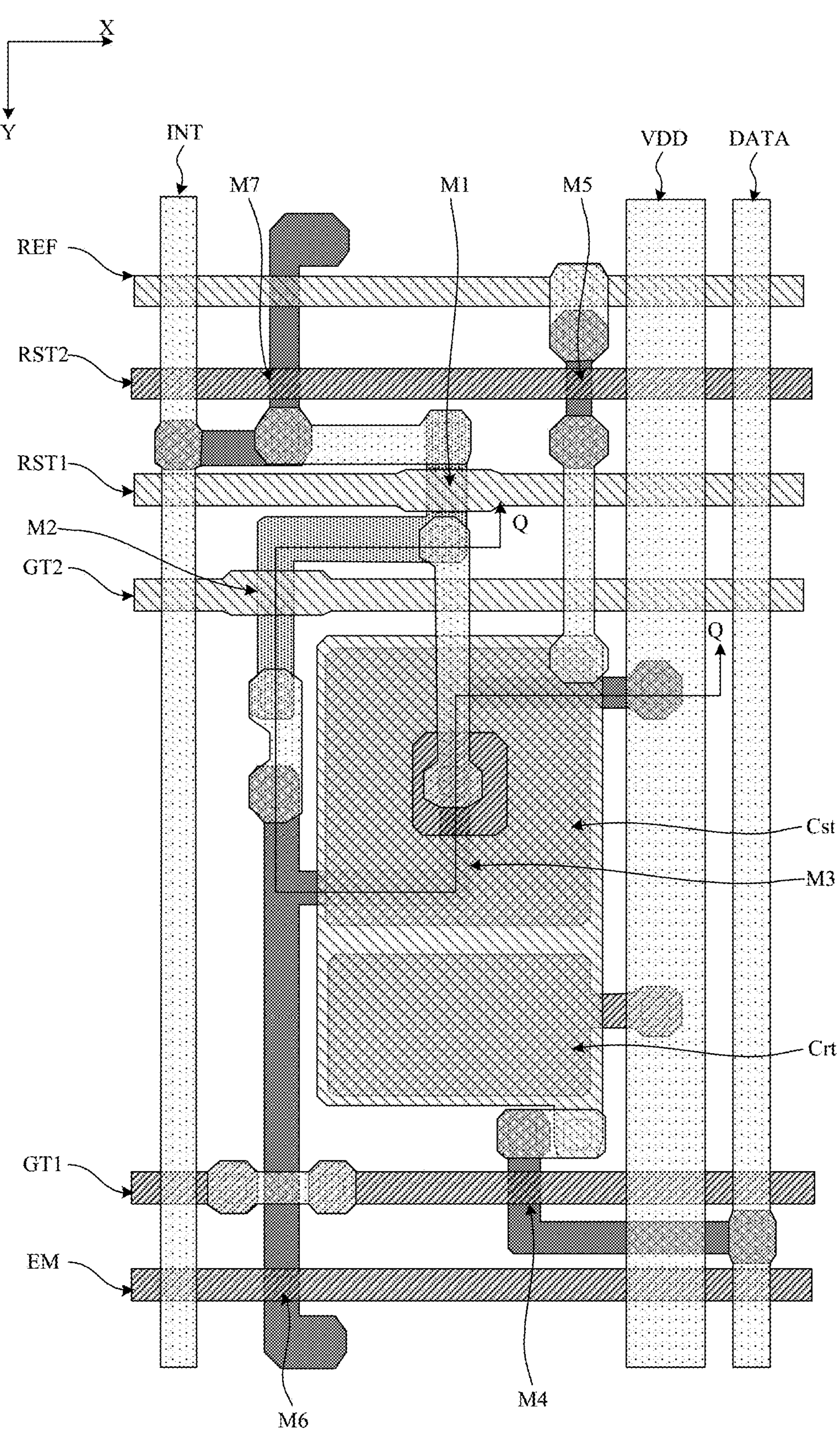
FIG. 20 is a top view of a sub-pixel in a display region according to at least one embodiment of the present disclosure.
Figure 21:
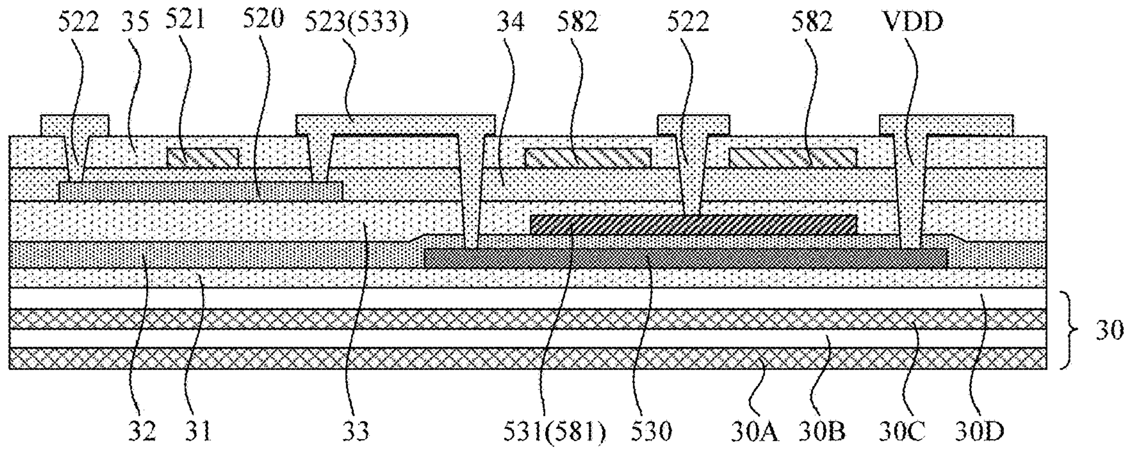
FIG. 21 is a schematic sectional view along Q-Q in FIG. 20.

FIG. 20 is a top view of a sub-pixel of a display substrate according to at least one embodiment of the present disclosure. FIG. 21 is a schematic sectional view along Q-Q in FIG. 20. As shown in FIGS. 20 and 21, the display region of the display substrate of the present exemplary embodiment includes an underlay substrate 30, and a first semiconductor layer, first conductive layer, second semiconductor layer, second conductive layer, and third conductive layer which are sequentially arranged on the underlay substrate 30. A first insulating layer 31 is arranged between the underlay substrate 30 and the first semiconductor layer. A second insulating layer 32 is arranged between the first conductive layer and the first semiconductor layer. A third insulating layer 33 is arranged between the first conductive layer and the second semiconductor layer. A fourth insulating layer 34 is arranged between the second semiconductor layer and the second conductive layer. A fifth insulating layer 35 is arranged between the second conductive layer and the third conductive layer. In some examples, a planar layer, an anode layer, an organic insulating layer, a cathode layer, and a package layer are arranged on a side of the fifth insulating layer 35 away from the underlay substrate 30. However, no limits are made thereto in the present embodiment.

In the present exemplary implementation mode, a third initialization transistor M7 shown in FIG. 20 is what a pixel circuit of a sub-pixel of an (n−1)th row includes, and other transistors (i.e., M1 to M6) are what a pixel circuit of a sub-pixel of an nth row includes. The third initialization transistor M7 in FIG. 20 is connected with a first electrode of a light emitting element of the sub-pixel of the (n−1)th row, and the light emitting control transistor M6 is connected with a first electrode of a light emitting element of the sub-pixel of the nth row.

Figure 22:
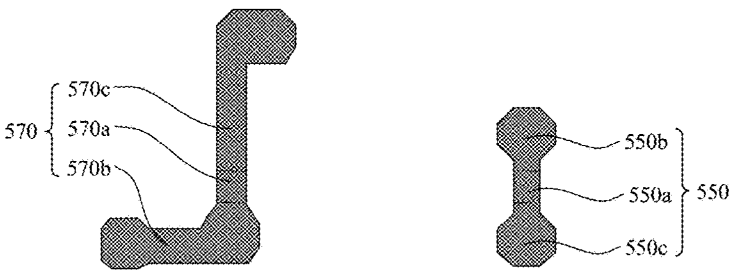
FIG. 22 is a top view of a sub-pixel after a first semiconductor layer is formed according to at least one embodiment of the present disclosure.
Figure 22:
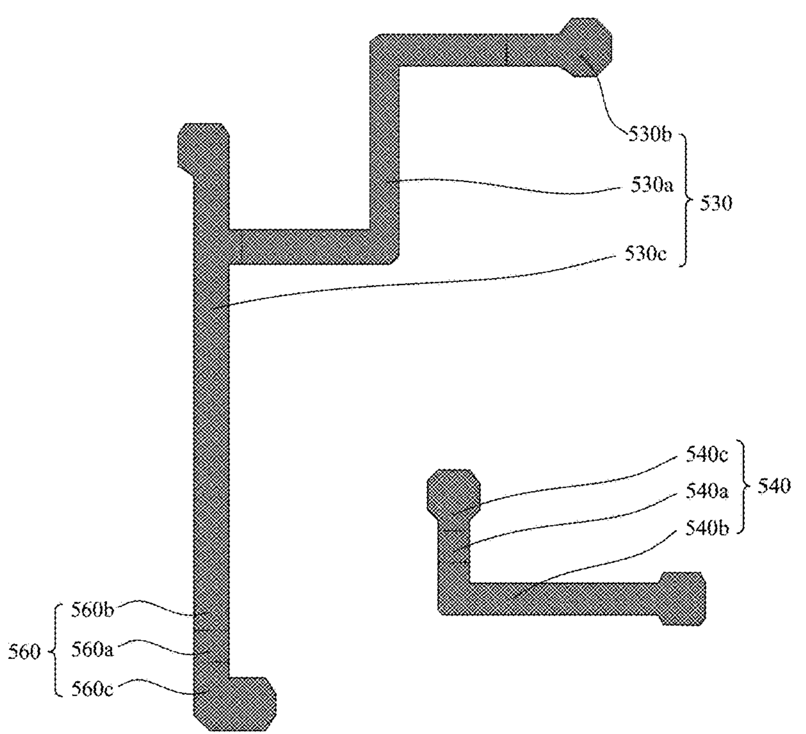

FIG. 22 is a top view of a sub-pixel after a first semiconductor layer is formed according to at least one embodiment of the present disclosure. As shown in FIGS. 20 to 22, the first semiconductor layer of the display region of the present exemplary embodiment at least includes an active layer 540 of a data writing transistor M4, an active layer 530 of a driving transistor M3, an active layer 550 of a second initialization transistor M5, an active layer 570 of a third initialization transistor M7, and an active layer 560 of a light emitting control transistor M6. The active layer 530 of the driving transistor M3 and the active layer 560 of the light emitting control transistor M6 form an integrated structure.

In some exemplary implementation modes, the material of the first semiconductor layer may include, for example, poly-silicon. In some examples, the active layer may include a channel region, a first doped region, and a second doped region. The channel region may be doped with no impurities, and has a semiconductor characteristic. The first doped region and the second doped region may be on two sides of the channel region and doped with impurities, and thus are conductive. The impurity may change according to the type of the transistor.

In some exemplary implementation modes, as shown in FIG. 22, the active layer 540 of the data writing transistor M4 includes a channel region 540*a*, and a first doped region 540*b* and second doped region 540*c* which are at two terminals of the channel region 540*a*. The active layer 530 of the driving transistor M3 includes a channel region 530*a*, and a first doped region 530*b* and second doped region 530*c* which are at two terminals of the channel region 530*a*. The active layer 550 of the second initialization transistor M5 includes a channel region 550*a*, and a first doped region 550*b* and second doped region 550*c* which are at two terminals of the channel region 550*a*. The active layer 570 of the third initialization transistor M7 includes a channel region 570*a*, and a first doped region 570*b* and second doped region 570*c* which are at two terminals of the channel region 570*a*. The active layer 560 of the light emitting control transistor M6 includes a channel region 560*a*, and a first doped region 560*b* and second doped region 560*c* which are at two terminals of the channel region 560*a*. The doped region 530*c* of the active layer 530 of the driving transistor M3 is connected with the second doped region 560*b* of the active layer 560 of the light emitting control transistor M6.

In some exemplary implementation modes, the first doped region or second doped region of the active layer may be interpreted as a source electrode or drain electrode of the transistor. For example, a source electrode of the driving transistor M3 may correspond to the first doped region 530*b* doped with an impurity on a periphery of the channel region 530*a* of the active layer 530, and a drain electrode of the driving transistor M3 may correspond to the second doped region 530*c* doped with an impurity on the periphery of the channel region 530*a* of the active layer 530. In addition, a portion of the active layer between transistors may be interpreted as a line doped with an impurity, and may be used to electrically connect the transistors.

Figure 23:
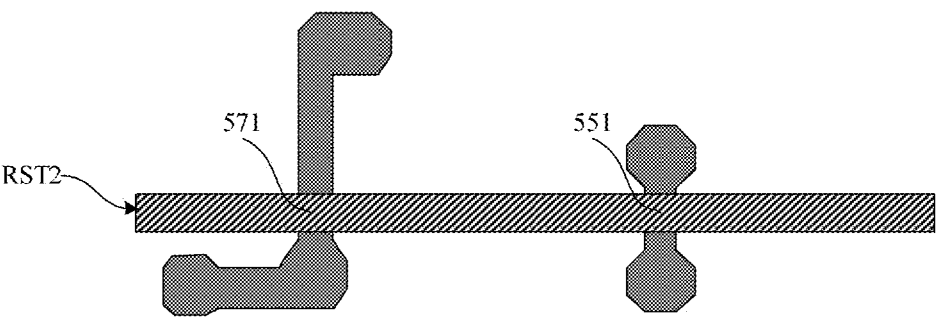
FIG. 23 is a top view of a sub-pixel after a first conductive layer is formed according to at least one embodiment of the present disclosure.
Figure 23:
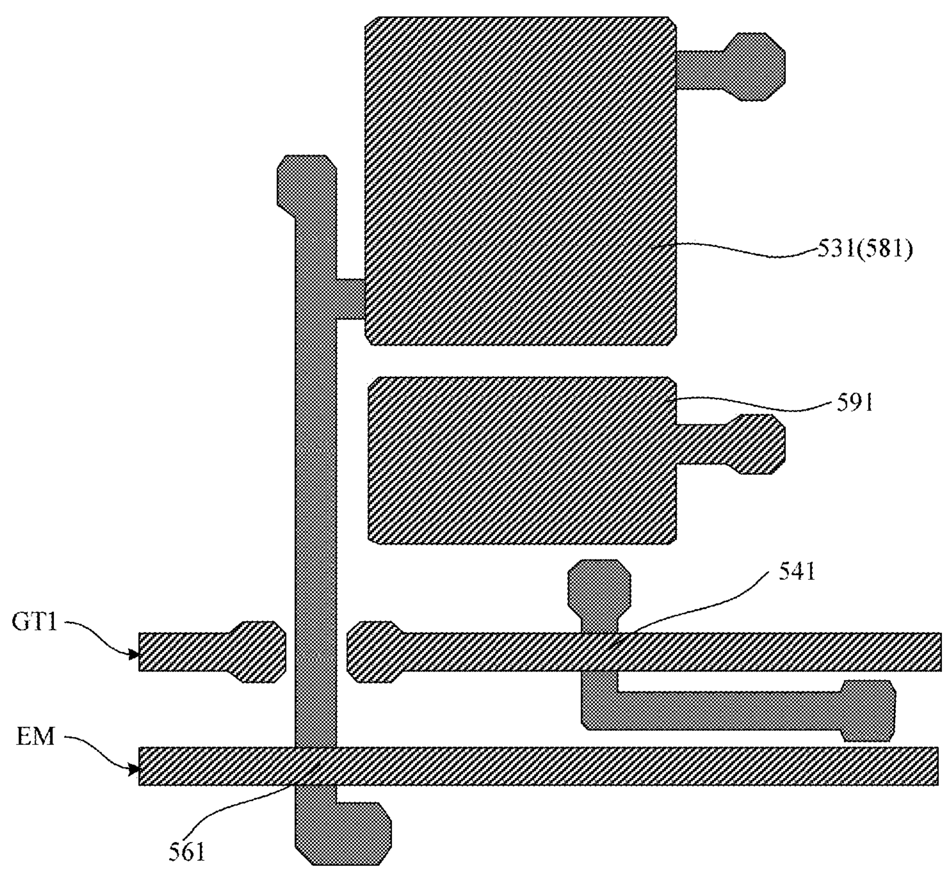

FIG. 23 is a top view of a sub-pixel after a first conductive layer is formed according to at least one embodiment of the present disclosure. As shown in FIGS. 20 to 23, the first conductive layer of the display region of the present exemplary embodiment at least includes a control electrode 541 of the data writing transistor M4, a control electrode 561 of the light emitting control transistor M6, a control electrode 551 of the second initialization transistor M5, a control electrode 571 of the third initialization transistor M7, a control electrode 531 of the driving transistor M3, a first scanning line GT1, a second reset signal line RST2, a light emitting control line EM, a first electrode 581 of a storage capacitor Cst, and a first electrode 591 of a voltage stabilizing capacitor Crt. The first scanning line GT1 provides a first scanning signal. The second reset signal line RST2 provides a second reset signal. The light emitting control line EM provides a light emitting control signal.

In some exemplary implementation modes, the control electrode 531 of the driving transistor M3 and the first electrode 581 of the storage capacitor Cst form an integrated structure. The light emitting control line EM and the control electrode 561 of the light emitting control transistor M6 form an integrated structure. The control electrode 551 of the second initialization transistor M5 and the second reset signal line RST2 form an integrated structure. The control electrode 571 of the third initialization transistor M7 of the pixel circuit of the sub-pixel of the (n−1)th row and the second reset signal line RST2 connected with the pixel circuit of the sub-pixel of the nth row form an integrated structure.

Figure 24:
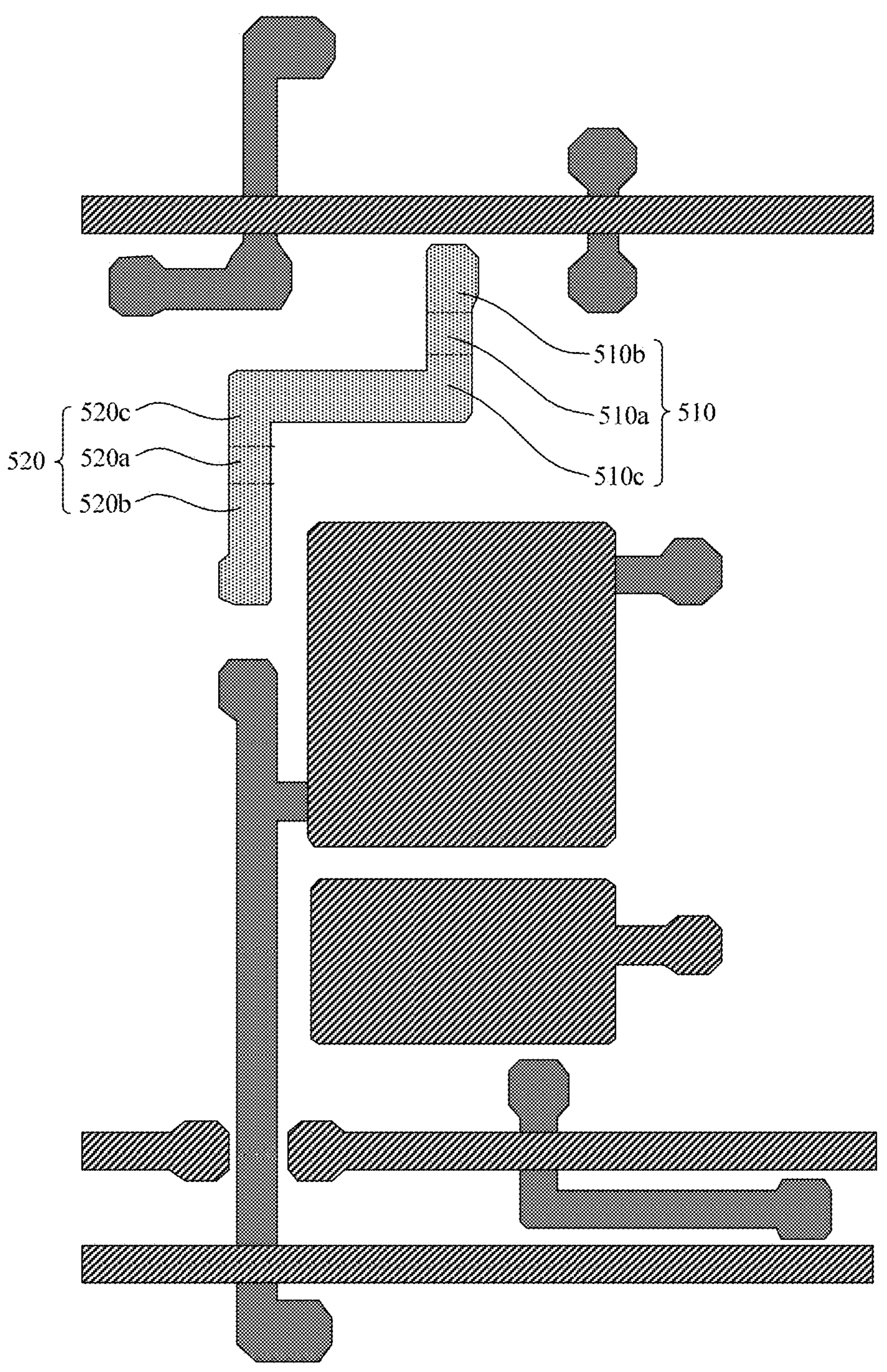
FIG. 24 is a top view of a sub-pixel after a second semiconductor layer is formed according to at least one embodiment of the present disclosure.

FIG. 24 is a top view of a sub-pixel after a second semiconductor layer is formed according to at least one embodiment of the present disclosure. As shown in FIGS. 20 to 24, the second semiconductor layer of the display region of the present exemplary embodiment at least includes an active layer 520 of a compensation transistor M2 and an active layer 510 of a first initialization transistor M1. The active layer 520 of the compensation transistor M2 and the active layer 510 of the first initialization transistor M1 form an integrated structure. In the present exemplary embodiment, the material of the second semiconductor layer may include metal oxide, e.g., IGZO.

Figure 25:
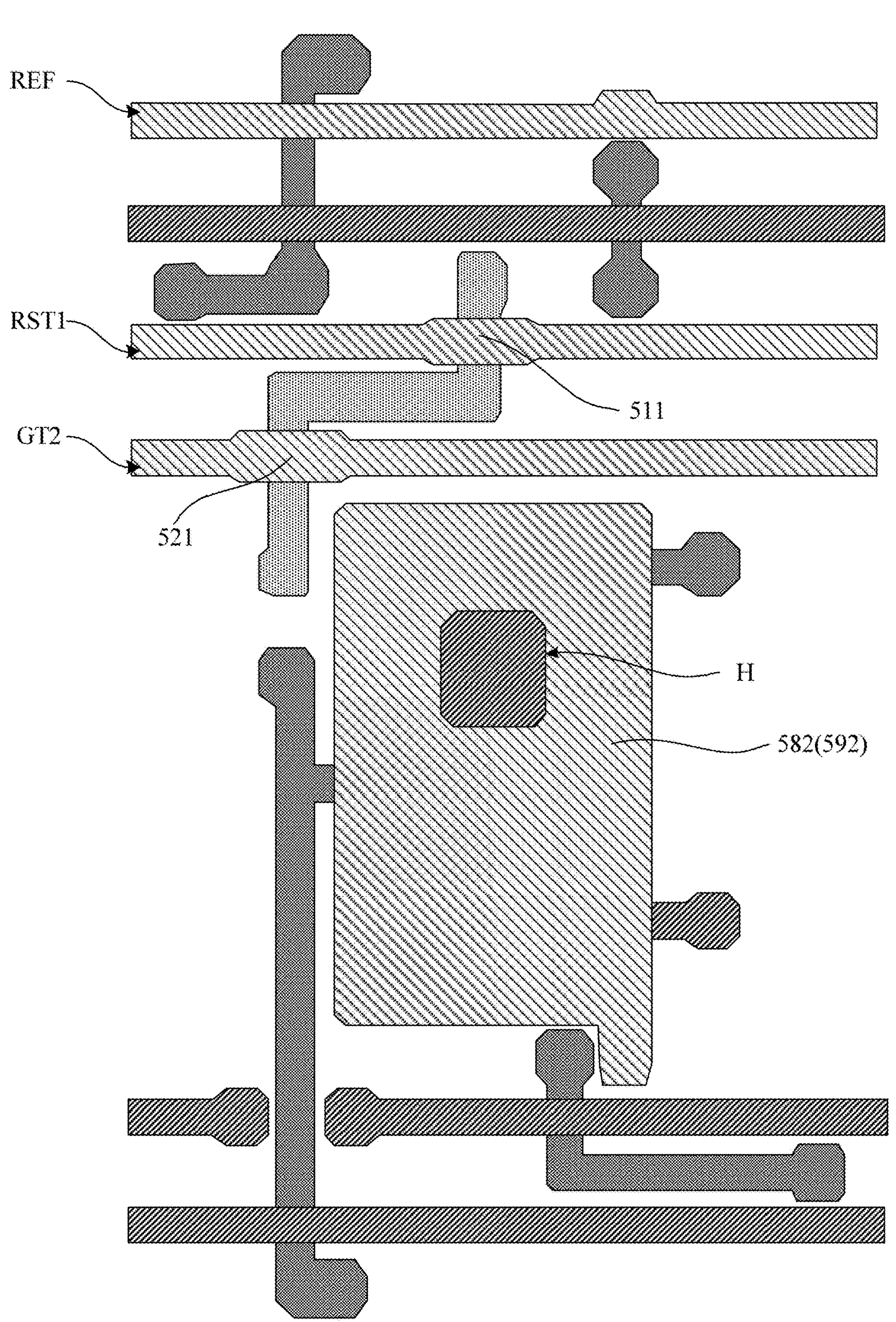
FIG. 25 is a top view of a sub-pixel after a second conductive layer is formed according to at least one embodiment of the present disclosure.

FIG. 25 is a top view of a sub-pixel after a second conductive layer is formed according to at least one embodiment of the present disclosure. As shown in FIGS. 20 to 25, the second conductive layer of the display region of the present exemplary embodiment at least includes a control electrode 521 of the compensation transistor M2, a control electrode 511 of the first initialization transistor M1, a first reset signal line RST1, a second scanning line GT2, a reference voltage line REF, a second electrode 582 of the storage capacitor Cst, and a second electrode 592 of the voltage stabilizing capacitor Crt. The first reset signal line RST1 provides a first reset signal. The second scanning line GT2 provides a second scanning signal. The reference voltage line REF provides a reference voltage.

In some exemplary implementation modes, the first reset signal line RST1 and the control electrode 511 of the first initialization transistor M1 form an integrated structure. The second scanning line GT2 and the control electrode 521 of the compensation transistor M2 form an integrated structure. The second electrode 582 of the storage capacitor Cst and the second electrode 592 of the voltage stabilizing capacitor Crt form an integrated structure. The second electrode 582 of the storage capacitor Cst has a hollow region H. An orthographic projection of the hollow region H on the underlay substrate is inside that of the first electrode 581 of the storage capacitor Cst on the underlay substrate.

Figure 26:
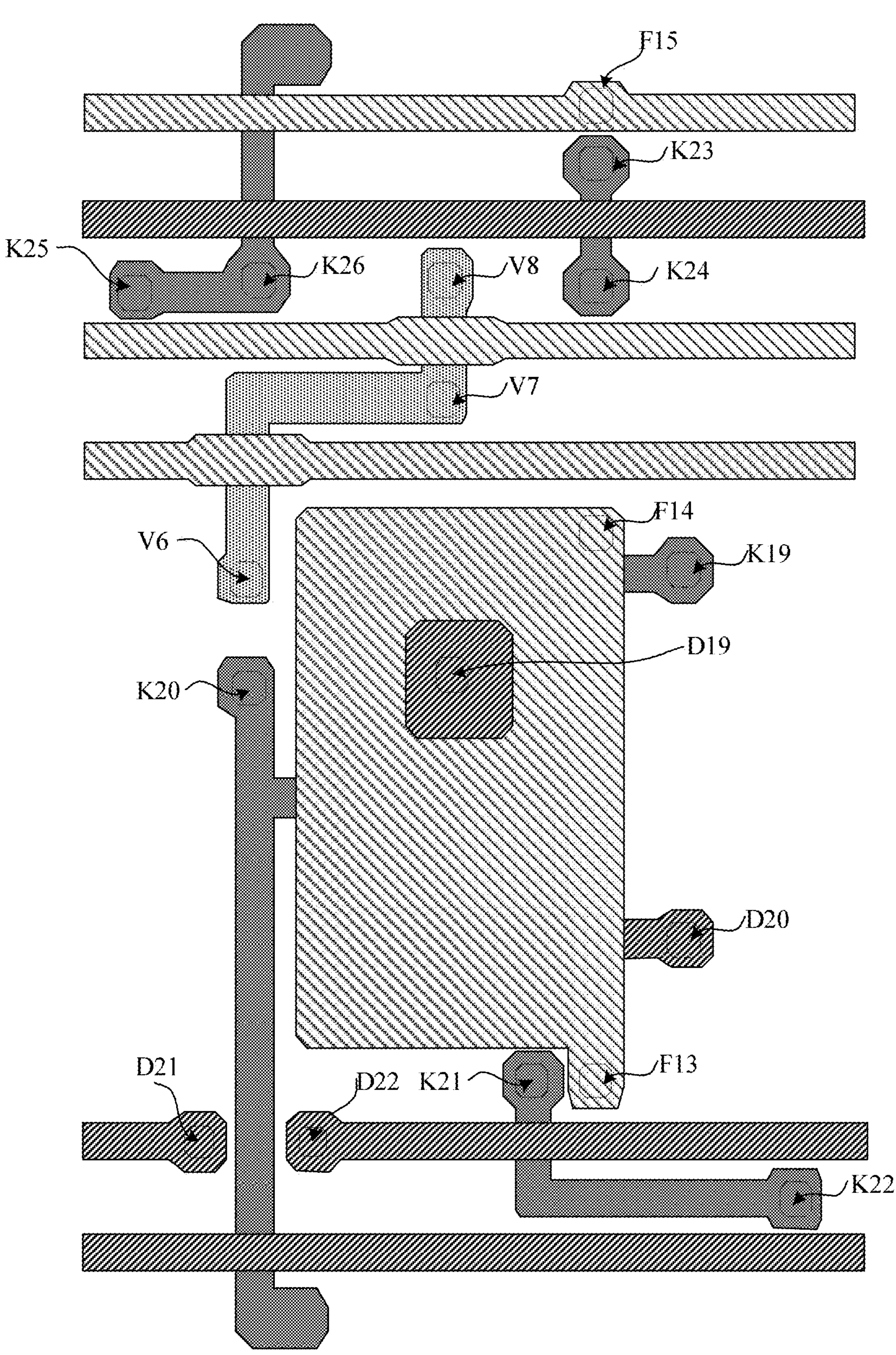
FIG. 26 is a top view of a sub-pixel after a fifth insulating layer is formed according to at least one embodiment of the present disclosure.

FIG. 26 is a top view of a sub-pixel after a fifth insulating layer is formed according to at least one embodiment of the present disclosure. As shown in FIGS. 20 to 26, multiple vias are formed on the fifth insulating layer of the display region of the present exemplary embodiment. The multiple vias at least include first vias K19 to K26, second vias D19 to D22, third vias V6 to V8, and fourth vias F13 to F15. The fifth insulating layer 35, fourth insulating layer 34, third insulating layer 33, and second insulating layer 32 in the first vias are etched away to expose a surface of the first semiconductor layer. The fifth insulating layer 35, fourth insulating layer 34, and third insulating layer 33 in the second vias are etched away to expose a surface of the first conductive layer. The fifth insulating layer 35 and fourth insulating layer 34 in the third vias are etched away to expose a surface of the second semiconductor layer. The fifth insulating layer 35 in the fourth vias is etched away to expose a surface of the second conductive layer.

Figure 27:
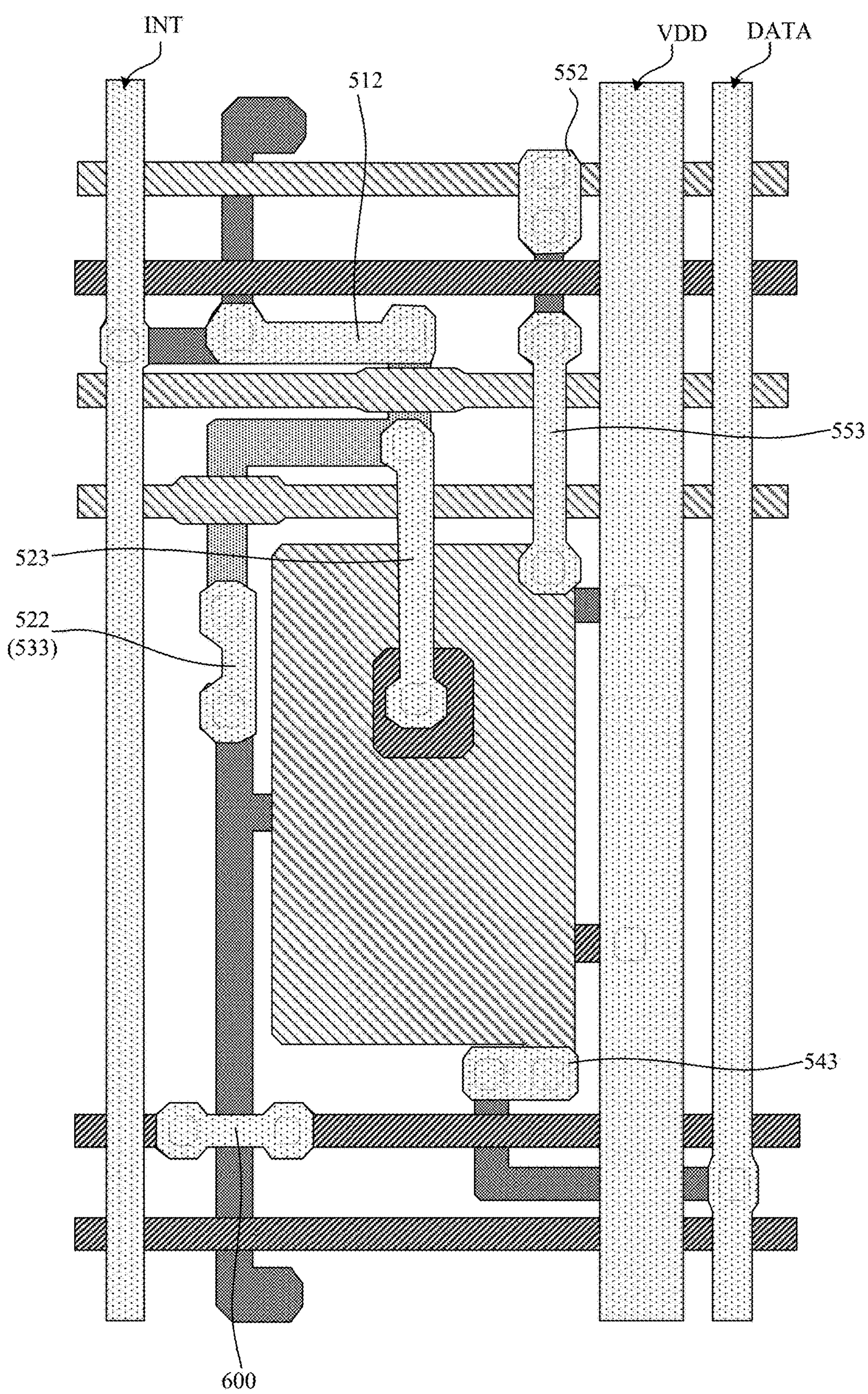
FIG. 27 is a top view of a sub-pixel after a third conductive layer is formed according to at least one embodiment of the present disclosure.

FIG. 27 is a top view of a sub-pixel after a third conductive layer is formed according to at least one embodiment of the present disclosure. As shown in FIGS. 20 to 27, the third conductive layer of the display region of the present exemplary embodiment at least includes a third power line VDD, a data line DATA, an initial voltage line INT, a second electrode 533 of the driving transistor M3, a first electrode 522 and second electrode 523 of the compensation transistor M2, a first electrode 512 of the first initialization transistor M1, a first electrode 552 and second electrode 553 of the second initialization transistor M5, a second electrode 543 of the data writing transistor M4, and a scanning line connecting electrode 600. The data line DATA provides a data signal. The initial voltage line INT provides an initial voltage. The first electrode 522 of the compensation transistor M2 and the second electrode 533 of the driving transistor M3 form an integrated structure.

In some exemplary implementation modes, the third power line VDD, the data line DATA, and the initial voltage line INT extend in a second direction Y. The first electrode 512 of the first initialization transistor M1 is connected with the first doped region 510*b* of the active layer 510 of the first initialization transistor M1 through the third via V8 and connected with the first doped region 570*b* of the active layer 570 of the third initialization transistor M7 through the first via K26. The initial voltage line INT is connected with the first doped region 570*b* of the active layer 570 of the third initialization transistor M7 through the first via K25. The first electrode 512 of the first initialization transistor M1 is connected with the initial voltage line INT through the first doped region 570*b* of the active layer 570 of the third initialization transistor M7. The first electrode 522 of the compensation transistor M2 is connected with a first doped region 520*b* of an active layer 520 of the compensation transistor M2 through the third via V6. The second electrode 523 of the compensation transistor M2 is connected with a second doped region 520*c* of the active layer 520 of the compensation transistor M2 through the third via V7 and connected with a first electrode 581 of a storage capacitor Cst through the second via D19. The second electrode 533 of the driving transistor M3 is connected with a second doped region 530*c* of an active layer 530 of the driving transistor M3 through the first via K20. The third power line VDD is connected with the first doped region 530*b* of the active layer 530 of the driving transistor M3 through the first via K19 and connected with the first electrode 591 of the voltage stabilizing capacitor Crt through the second via D20. The first electrode 552 of the second initialization transistor M5 is connected with the first doped region 550*b* of the active layer 550 of the second initialization transistor M5 through the first via K23 and connected with the reference voltage line REF through the fourth via F15. The second electrode 553 of the second initialization transistor M5 is connected with the second doped region 550*c* of the active layer 550 of the second initialization transistor M5 through the first via K24 and connected with the second electrode 582 of the storage capacitor Cst through the fourth via F14. The second electrode 543 of the data writing transistor M4 is connected with the second doped region 540*c* of the active layer 540 of the data writing transistor M4 through the first via K21 and connected with the second electrode 592 of the voltage stabilizing capacitor Crt through the fourth via F13. The data line DATA is connected with the first doped region 540*b* of the active layer 540 of the data writing transistor M4 through the first via K22. The scanning line connecting electrode 600 is connected with the first scanning line GT1 through the second via D21 and connected with the control electrode 541 of the data writing transistor M4 through the second via D22. In some examples, the second doped region 560*c* of the active layer 560 of the light emitting control transistor M6 may be connected with a first electrode of a light emitting element of a sub-pixel of the present row. The second doped region 570*c* of the active layer 570 of the third initialization transistor M7 may be connected with a first electrode of a light emitting element of a sub-pixel of a previous row.

In the pixel circuit provided in the present exemplary embodiment, the compensation transistor M2 and the first initialization transistor M1 adopt IGZO thin film transistors with extremely low leakage currents such that voltage holding time of the storage capacitor is relatively long during low-frequency driving. Data voltage writing and threshold voltage compensation are controlled by the first scanning line and the second scanning line respectively, data voltage writing time is relatively short, and threshold voltage compensation time is relatively long, so that rapid data writing and threshold voltage full compensation may be satisfied during high-frequency driving.

Figure 28:
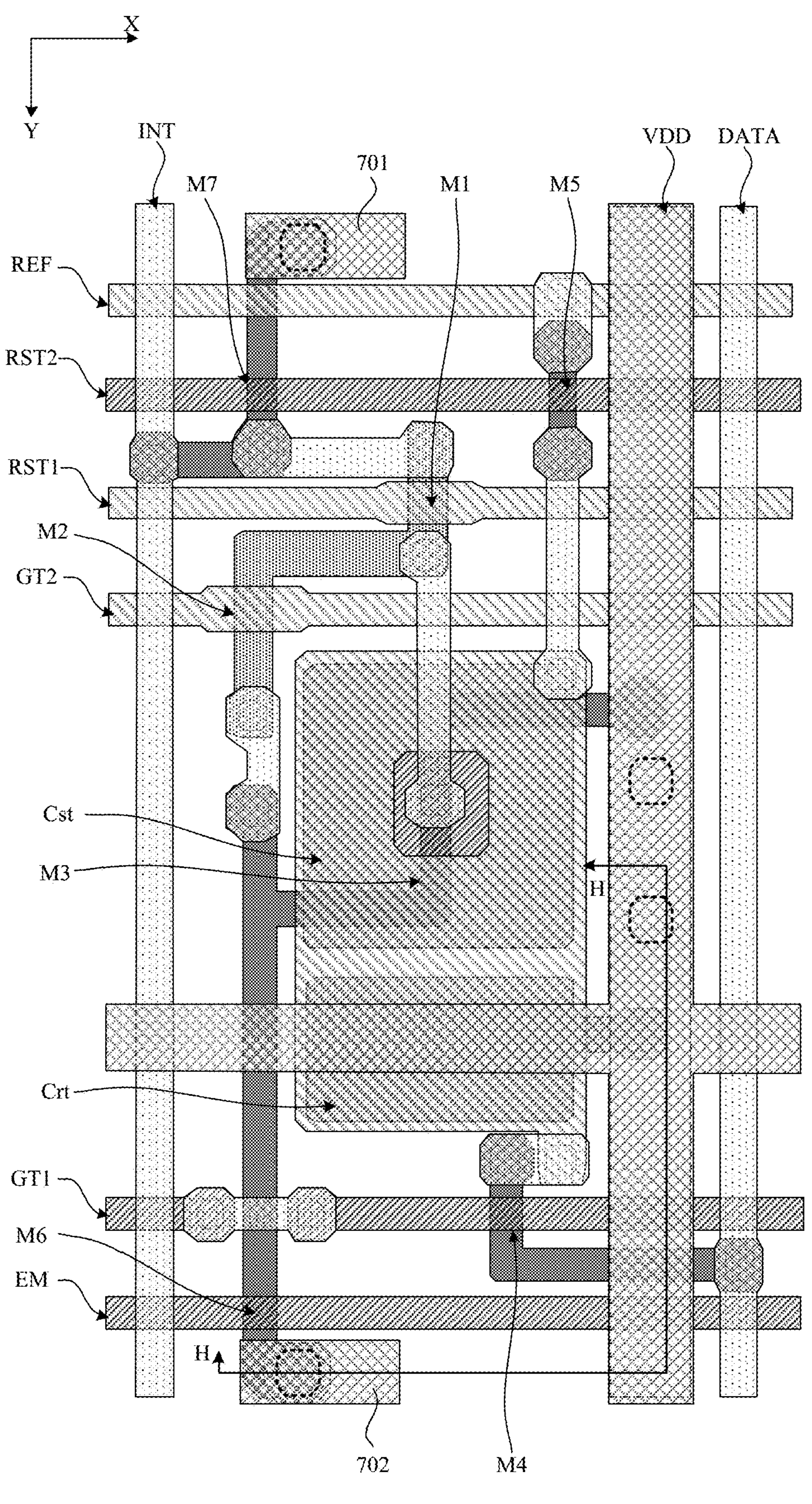
FIG. 28 is another top view of a sub-pixel of a display substrate according to at least one embodiment of the present disclosure.
Figure 29:
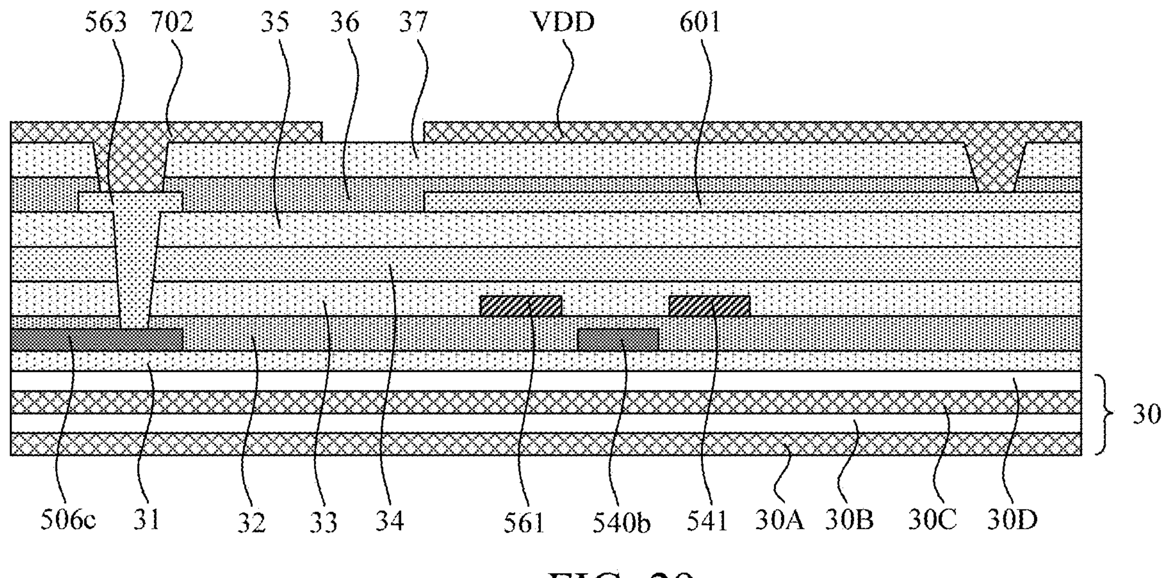
FIG. 29 is a schematic sectional view along H-H in FIG. 28.

FIG. 28 is another top view of a sub-pixel of a display substrate according to at least one embodiment of the present disclosure. FIG. 29 is a schematic sectional view along H-H in FIG. 28. As shown in FIGS. 28 and 29, the display region of the display substrate of the present exemplary embodiment includes an underlay substrate 30, and a first semiconductor layer, first conductive layer, second semiconductor layer, second conductive layer, third conductive layer, and fourth conductive layer which are sequentially arranged on the underlay substrate 30. A first insulating layer 31 is arranged between the underlay substrate 30 and the first semiconductor layer. A second insulating layer 32 is arranged between the first semiconductor layer and the first conductive layer. A third insulating layer 33 is arranged between the first conductive layer and the second semiconductor layer. A fourth insulating layer 34 is arranged between the second semiconductor layer and the second conductive layer. A fifth insulating layer 35 is arranged between the second conductive layer and the third conductive layer. A sixth insulating layer 36 and a seventh insulating layer 37 are sequentially arranged between the third conductive layer and the fourth conductive layer.

In some exemplary implementation modes, the first conductive layer, the second conductive layer, the third conductive layer, and the fourth conductive layer may be made of metal materials, e.g., any one or more of Argentum (Ag), Copper (Cu), Aluminum (Al), and Molybdenum (Mo), or alloy materials of the abovementioned metals, e.g., an Aluminum-Neodymium alloy (AlNd) or a Molybdenum-Niobium alloy (MoNb), and may be single-layer structures, or multilayer composite structures such as Mo/Cu/Mo.

In some exemplary implementation modes, each of the first insulating layer 31 to the sixth insulating layer 36 may be made of any one or more of silicon oxide (SiOx), silicon nitride (SiNx), and silicon oxynitride (SiON), and may be single-layer, multilayer, or composite. The first insulating layer 31 and the third insulating layer 33 are called buffer layers. The first insulating layer 31 is arranged to improve the water and oxygen resistance of the underlay substrate. The second insulating layer 32 and the fourth insulating layer 34 are called Gate Insulator (GI) layers. The fifth insulating layer 35 is called an Interlayer Dielectric (ILD) layer. The sixth insulating layer 36 is called a passivation layer. The seventh insulating layer 37 may be made of an organic material, e.g., polyimide (PI), acrylic, or polyethylene terephthalate (PET). The seventh insulating layer 37 is called a first planar layer. In some examples, a second planar layer, an anode layer, an organic insulating layer, a cathode layer, and a package layer are sequentially arranged on a side of the fourth conductive layer away from the underlay substrate 30. However, no limits are made thereto in the present embodiment.

In the present exemplary implementation mode, a third initialization transistor M7 shown in FIG. 28 is what a pixel circuit of a sub-pixel of an (n−1)th row includes, and other transistors (i.e., M1 to M6) are what a pixel circuit of a sub-pixel of an nth row includes. The third initialization transistor M7 in FIG. 28 is connected with a first electrode of a light emitting element of the sub-pixel of the (n−1)th row, and the light emitting control transistor M6 is connected with a first electrode of a light emitting element of the sub-pixel of the nth row.

The top view of the first semiconductor layer of the display region of the present exemplary embodiment may refer to FIG. 22. The top view of the first conductive layer may refer to FIG. 23. The top view of the second semiconductor layer may refer to FIG. 24. The top view of the second conductive layer may refer to FIG. 25. Therefore, elaborations are omitted herein.

Figure 30:
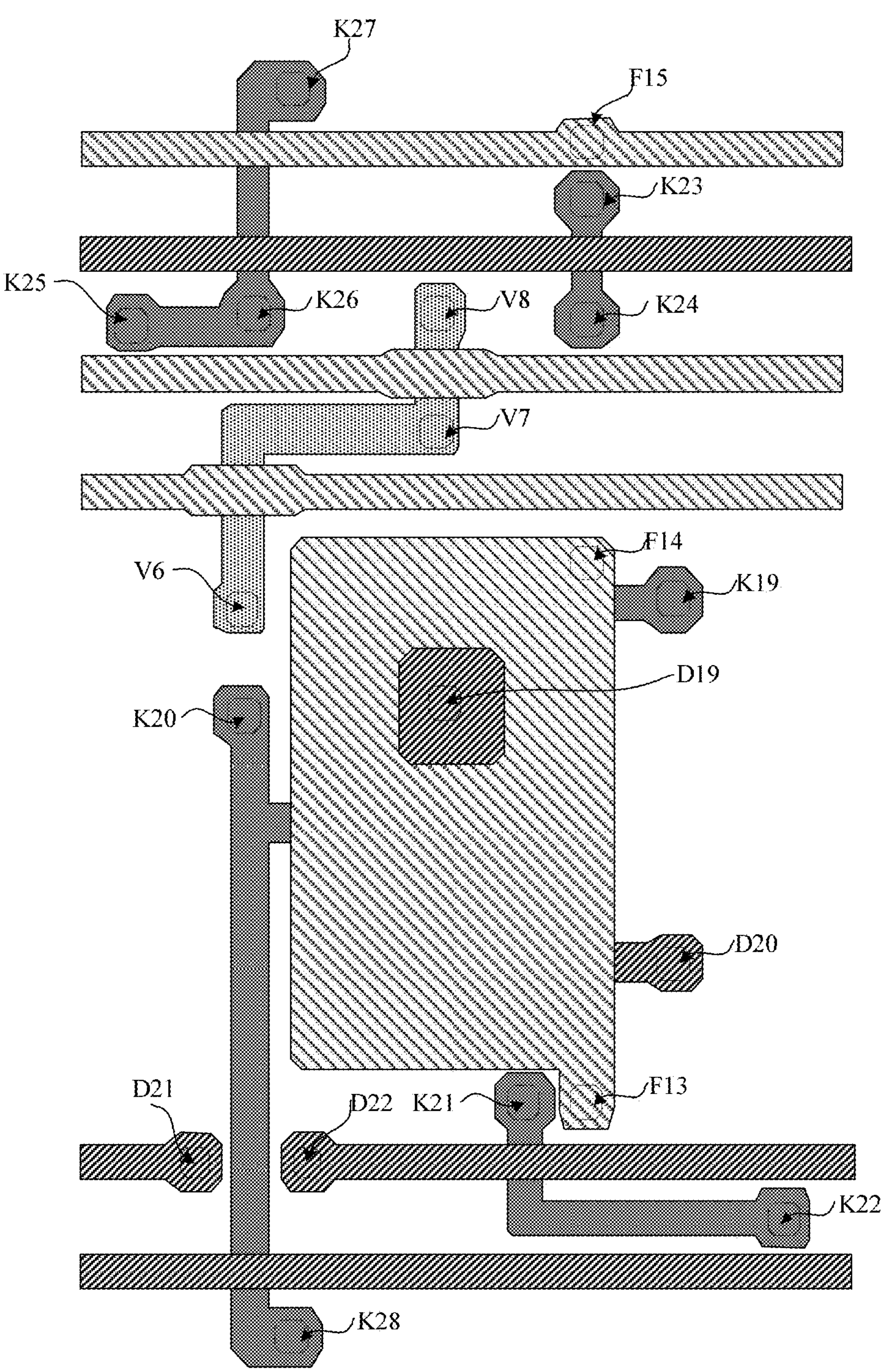
FIG. 30 is a top view of a sub-pixel after a fifth insulating layer is formed according to at least one embodiment of the present disclosure.

FIG. 30 is a top view of a sub-pixel after a fifth insulating layer is formed according to at least one embodiment of the present disclosure. As shown in FIGS. 28 to 30 and 22 to 25, multiple vias are formed on the fifth insulating layer of the display region of the present exemplary embodiment. The multiple vias at least include first vias K19 to K28, second vias D19 to D22, third vias V6 to V8, and fourth vias F13 to F15. The fifth insulating layer 35, fourth insulating layer 34, third insulating layer 33, and second insulating layer 32 in the first vias are etched away to expose a surface of the first semiconductor layer. The fifth insulating layer 35, fourth insulating layer 34, and third insulating layer 33 in the second vias are etched away to expose a surface of the first conductive layer. The fifth insulating layer 35 and fourth insulating layer 34 in the third vias are etched away to expose a surface of the second semiconductor layer. The fifth insulating layer 35 in the fourth vias is etched away to expose a surface of the second conductive layer.

Figure 31:
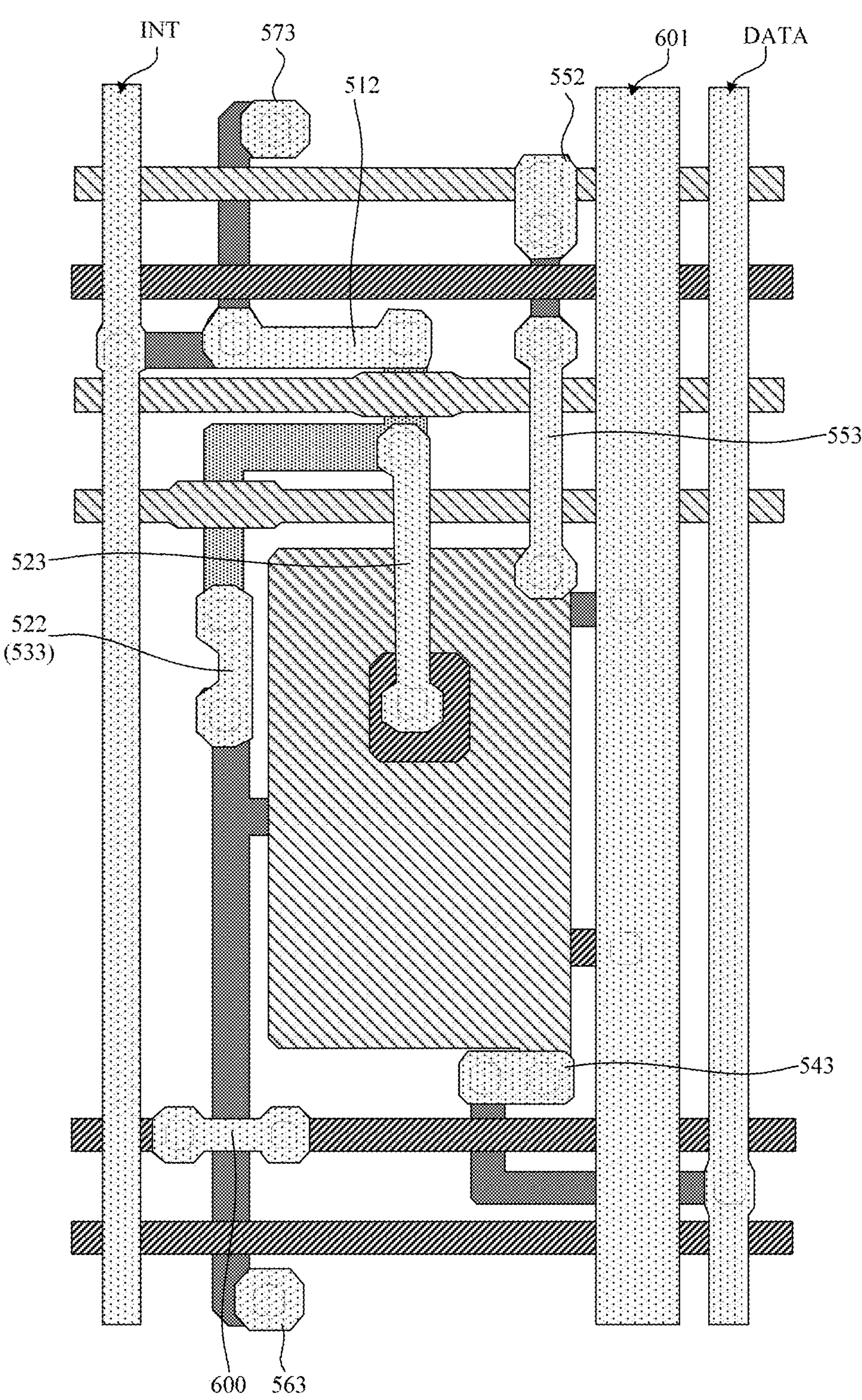
FIG. 31 is a top view of a sub-pixel after a third conductive layer is formed according to at least one embodiment of the present disclosure.

FIG. 31 is a top view of a sub-pixel after a third conductive layer is formed according to at least one embodiment of the present disclosure. As shown in FIGS. 28 to 31 and 22 to 25, the third conductive layer of the display region of the present exemplary embodiment at least includes a data line DATA, an initial voltage line INT, a second electrode 533 of a driving transistor M3, a first electrode 522 and second electrode 523 of a compensation transistor M2, a first electrode 512 of a first initialization transistor M1, a first electrode 552 and second electrode 553 of a second initialization transistor M5, a second electrode 543 of a data writing transistor M4, a second electrode 562 of a light emitting control transistor M6, a second electrode 573 of a third initialization transistor M7, a scanning line connecting electrode 600, and a power connecting line 601. The data line DATA provides a data signal. The initial voltage line INT provides an initial voltage. The first electrode 522 of the compensation transistor M2 and the second electrode 533 of the driving transistor M3 form an integrated structure.

In some exemplary implementation modes, the power connecting line 601, the data line DATA, and the initial voltage line INT extend in a second direction Y. The first electrode 512 of the first initialization transistor M1 is connected with a first doped region 510*b* of an active layer 510 of the first initialization transistor M1 through the third via V8 and connected with a first doped region 570*b* of an active layer 570 of the third initialization transistor M7 through the first via K26. The initial voltage line INT is connected with the first doped region 570*b* of the active layer 570 of the third initialization transistor M7 through the first via K25. The first electrode 512 of the first initialization transistor M1 is connected with the initial voltage line INT through the first doped region 570*b* of the active layer 570 of the third initialization transistor M7. The first electrode 522 of the compensation transistor M2 is connected with a first doped region 520*b* of an active layer 520 of the compensation transistor M2 through the third via V6. The second electrode 523 of the compensation transistor M2 is connected with a second doped region 520*c* of the active layer 520 of the compensation transistor M2 through the third via V7 and connected with a first electrode 581 of a storage capacitor Cst through the second via D19. The second electrode 533 of the driving transistor M3 is connected with a second doped region 530*c* of an active layer 530 of the driving transistor M3 through the first via K20. The power connecting line 601 is connected with a first doped region 530*b* of the active layer 530 of the driving transistor M3 through the first via K19 and connected with a first electrode 591 of a voltage stabilizing capacitor Crt through the second via D20. The first electrode 552 of the second initialization transistor M5 is connected with a first doped region 550*b* of an active layer 550 of the second initialization transistor M5 through the first via K23 and connected with a reference voltage line REF through the fourth via F15. The second electrode 553 of the second initialization transistor M5 is connected with a second doped region 550*c* of the active layer 550 of the second initialization transistor M5 through the first via K24 and connected with a second electrode 582 of the storage capacitor Cst through the fourth via F14. The second electrode 543 of the data writing transistor M4 is connected with a second doped region 540*c* of an active layer 540 of the data writing transistor M4 through the first via K21 and connected with a second electrode 592 of the voltage stabilizing capacitor Crt through the fourth via F13. The data line DATA is connected with a first doped region 540*b* of the active layer 540 of the data writing transistor M4 through the first via K22. The scanning line connecting electrode 600 is connected with a first scanning line GT1 through the second via D21 and connected with a control electrode 541 of the data writing transistor M4 through the second via D22. A second electrode 563 of the light emitting control transistor M6 is connected with a second doped region 530*c* of an active layer 560 of the light emitting control transistor M6 through the first via K28. The second electrode 573 of the third initialization transistor M7 is connected with a second doped region 570*c* of an active layer 570 of the third initialization transistor M7 through the first via K27.

Figure 32:
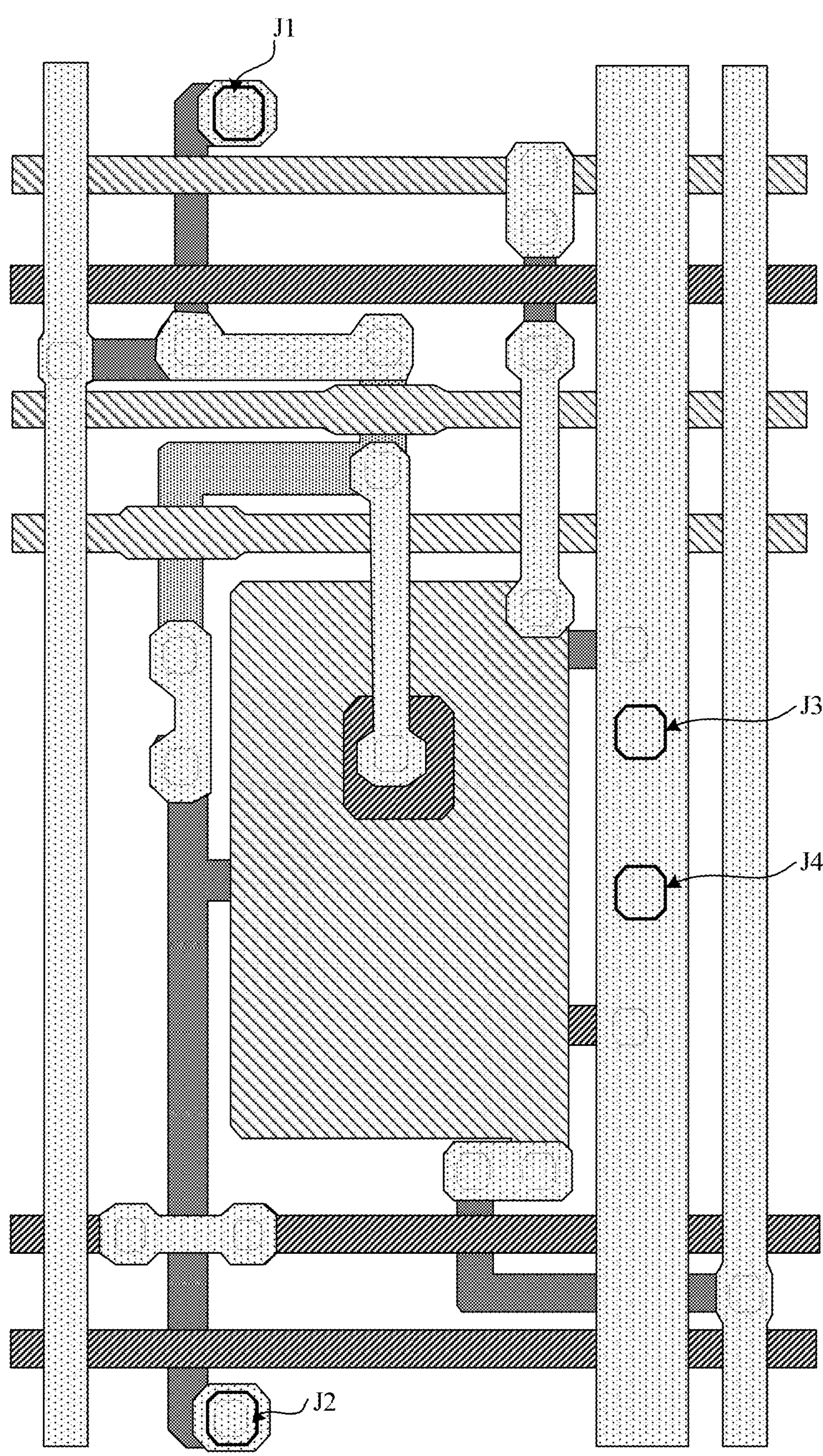
FIG. 32 is a top view of a sub-pixel after a seventh insulating layer is formed according to at least one embodiment of the present disclosure.

FIG. 32 is a top view of a sub-pixel after a seventh insulating layer is formed according to at least one embodiment of the present disclosure. As shown in FIGS. 28 to 32 and 22 to 25, multiple vias are formed on the seventh insulating layer of the display region of the present exemplary embodiment. The multiple vias at least include fifth vias J1 to J4. The seventh insulating layer 37 and sixth insulating layer 36 in the fifth vias are etched away to expose a surface of the third conductive layer. The fifth via J1 exposes a surface of the second electrode 563 of the third initialization transistor M7. The fifth via J2 exposes a surface of the second electrode 563 of the light emitting control transistor M6. The fifth vias J3 and J4 are sequentially arranged in the second direction Y, and expose a surface of the power connecting line 601.

Figure 33:
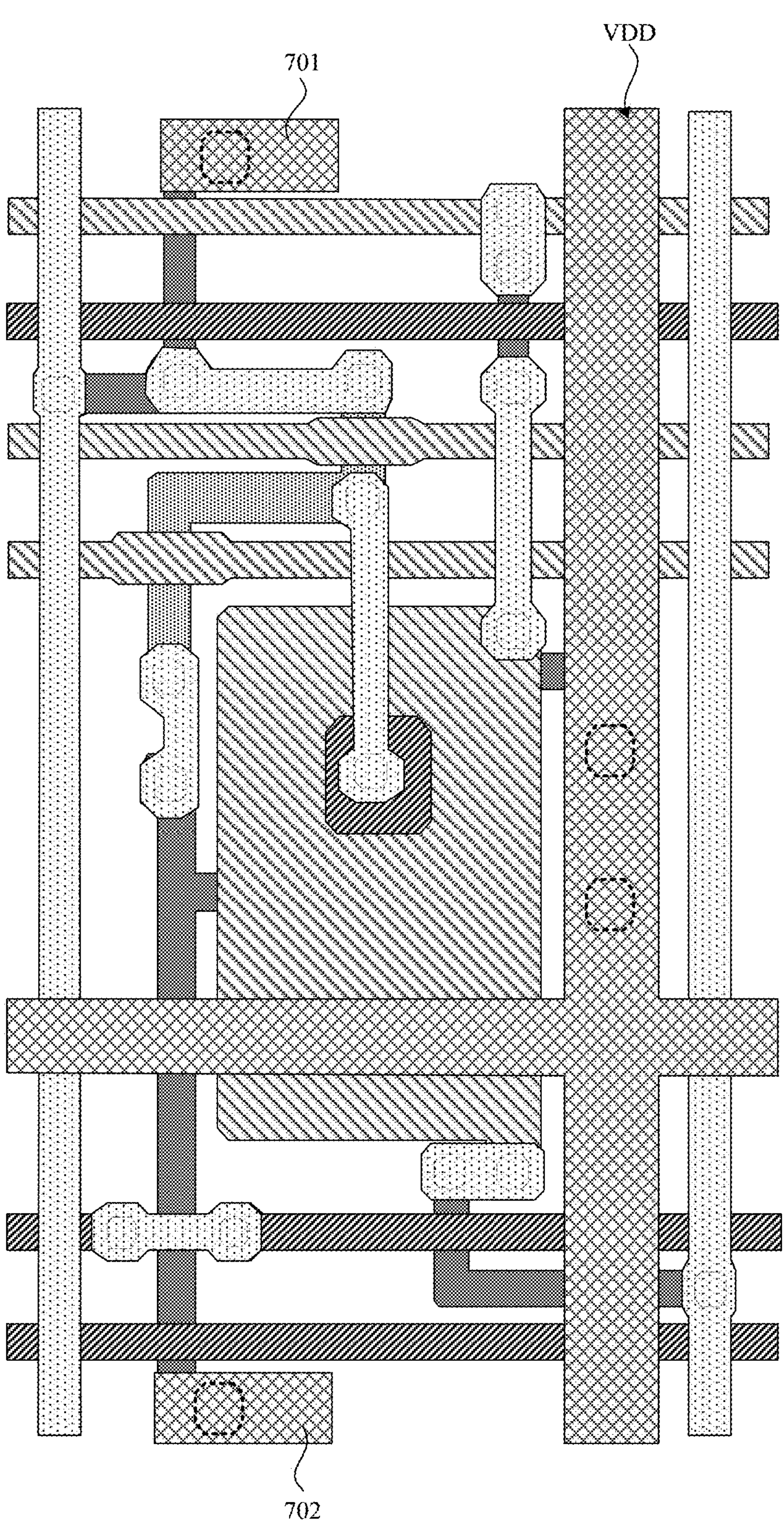
FIG. 33 is a top view of a sub-pixel after a fourth conductive layer is formed according to at least one embodiment of the present disclosure.

FIG. 33 is a top view of a sub-pixel after a fourth conductive layer is formed according to at least one embodiment of the present disclosure. As shown in FIGS. 28 to 33 and 22 to 25, the fourth conductive layer of the display region of the present exemplary embodiment at least includes a third power line VDD, a first anode connecting electrode 701, and a second cathode connecting electrode 702. The third power line VDD extends in a first direction X and the second direction Y respectively to form a net structure to reduce resistance. The third power line VDD is connected with the power connecting line 601 through the fifth vias J3 and J4. The first anode connecting electrode 701 is connected with the second electrode 573 of the third initialization transistor M7 through the fifth via J1. The second anode connecting electrode 702 is connected with the second electrode 563 of the light emitting control transistor M6 through the fifth via J2. In some examples, the first anode connecting electrode 701 may be connected with a first electrode of a light emitting element of a sub-pixel of a previous row, and the second anode connecting electrode 702 may be connected with a first electrode of a light emitting element of a sub-pixel of the present row.

In some exemplary implementation modes, the gate driving circuit in the peripheral region may provide a first scanning signal, a second scanning signal, a first reset signal, a second reset signal, and a light emitting control signal to the pixel circuit in the display region. In some examples, the gate driving circuit may include multiple cascaded first shift register units, multiple cascaded second shift register units, and multiple cascaded third shift register units. The first shift register unit may provide a second scanning signal to a pixel circuit in the display region through a second scanning line and provides a second reset signal to the pixel circuit through a second reset signal line. The second shift register unit may provide a first scanning signal to the pixel circuit in the display region through a first scanning line and provide a first reset signal to the pixel circuit through a first reset signal line. The third shift register unit may provide a light emitting control signal to the pixel circuit in the display region through a light emitting control line.

Figure 34:
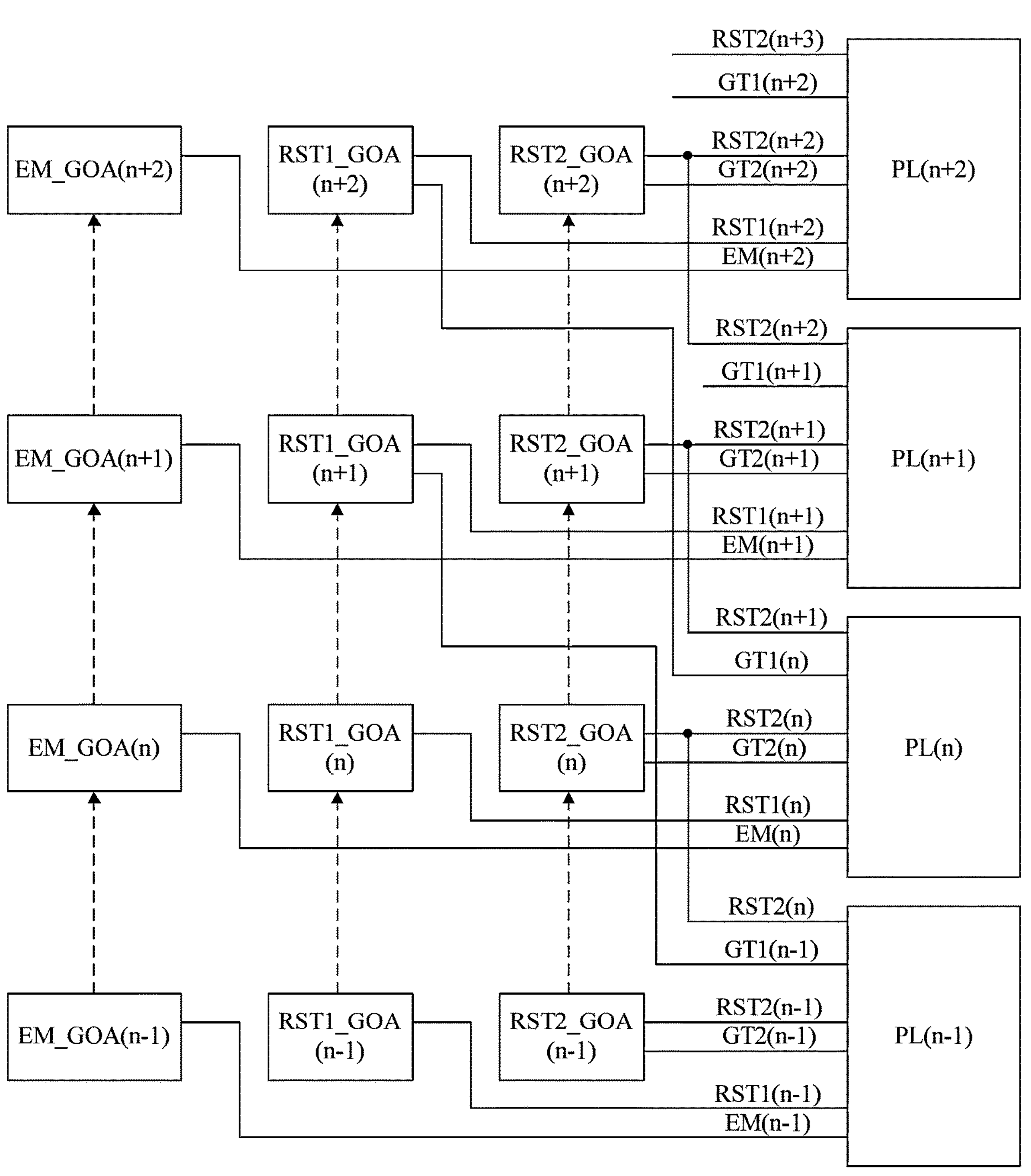
FIG. 34 is a schematic connection diagram of a gate driving circuit and a pixel circuit according to at least one embodiment of the present disclosure.

FIG. 34 is a schematic connection diagram of a gate driving circuit and a pixel circuit according to at least one embodiment of the present disclosure. As shown in FIG. 34, an nth-stage first shift register unit RST2_GOA(n) may provide a second reset signal RST2(*n*) and a second scanning signal GT2(*n*) to a pixel circuit of a sub-pixel PL(n) of an nth row. An nth-stage second shift register unit RST1_GOA(n) may provide a first reset signal RST1(*n*) to the pixel circuit of the sub-pixel PL(n) of the nth row and provide a first scanning signal GT1(*n*−2) to a pixel circuit of a sub-pixel PL(n−2) of an (n−2)th row. An nth-stage third shift register unit EM_GOA(n) may provide a light emitting control signal EM(n) to the pixel circuit of the sub-pixel PL(n) of the nth row. Herein, n is an integer greater than 0.

In some exemplary implementation modes, an equivalent circuit diagram of the first shift register unit may be shown in FIG. 7. An equivalent circuit diagram of the second shift register unit may be shown in FIG. 12. A connection relationship between the first shift register unit and the second shift register unit may be shown in FIG. 11. However, no limits are made thereto in the present embodiment.

In some exemplary implementation modes, a third output terminal of the nth-stage first shift register unit is connected with a second reset signal line driving a pixel circuit of a sub-pixel of an nth row and a third reset signal line driving a sub-pixel of an (n−1)th stage. A second output terminal of the nth-stage first shift register unit is connected with a second scanning line driving the pixel circuit of the sub-pixel of the nth row. A fifth output terminal of the nth-stage second shift register unit is connected with a first reset signal line driving the pixel circuit of the sub-pixel of the nth row. A fourth output terminal of the nth-stage second shift register unit is connected with a first scanning line driving a pixel circuit of a sub-pixel of an (n−2)th row.

The gate driving circuit provided in the present exemplary implementation mode is structurally simplified, and may provide many different gate driving signals for the pixel circuit through three shift register units, thereby improving the performance of the pixel circuit.

Figure 35:
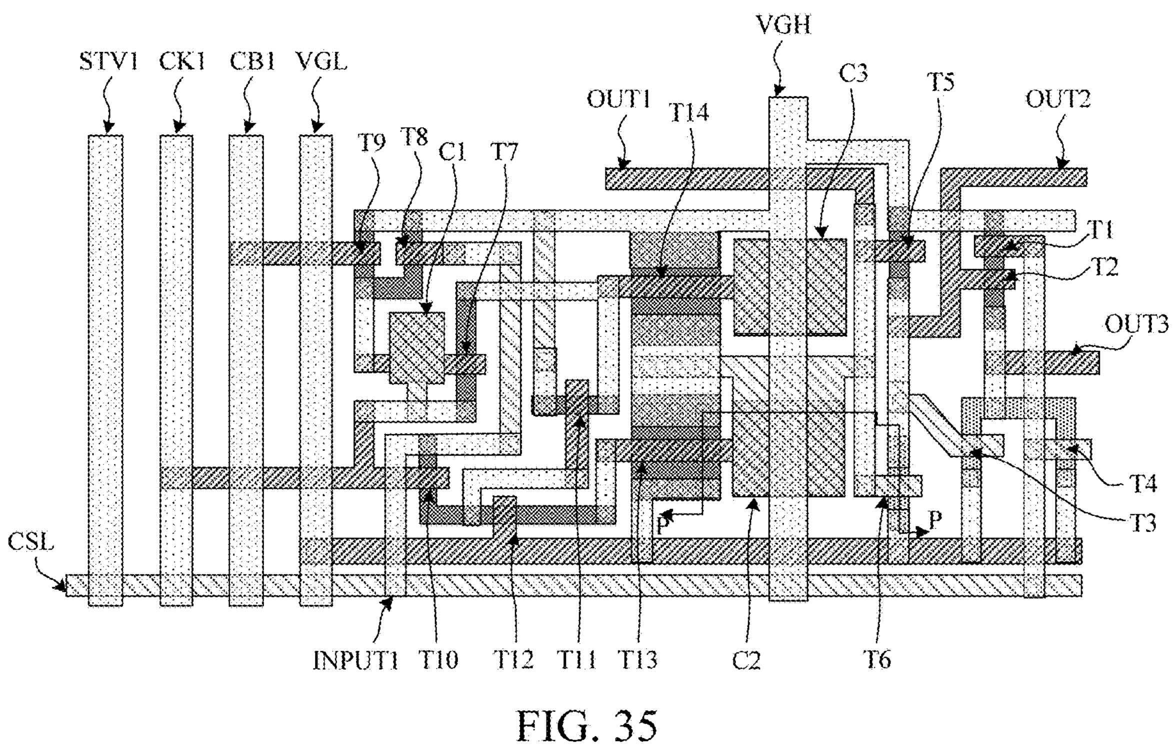
FIG. 35 is a top view of a first shift register unit according to at least one embodiment of the present disclosure.
Figure 36:
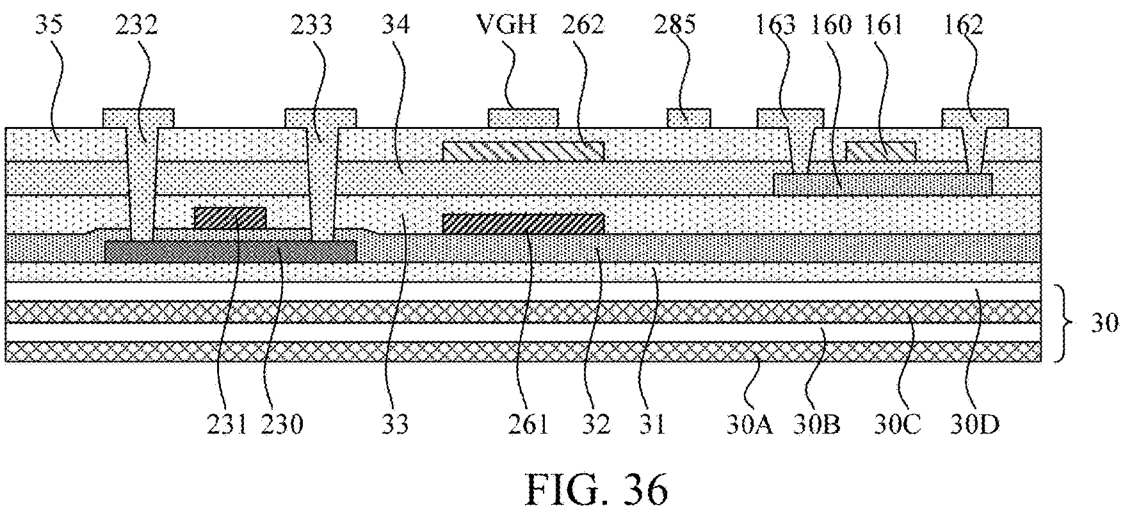
FIG. 36 is a schematic sectional view along P-P in FIG. 35.

FIG. 35 is a top view of a first shift register unit according to at least one embodiment of the present disclosure. FIG. 36 is a schematic sectional view along P-P in FIG. 35. An equivalent circuit diagram of the first shift register unit of the present exemplary embodiment is shown in FIG. 7. The third transistor T3, fourth transistor T4, and sixth transistor T6 in the first shift register unit are N-type transistors, specifically IGZO thin film transistors. The other transistors in the first shift register unit are P-type transistors, specifically low temperature poly-silicon thin film transistors.

In some exemplary implementation modes, as shown in FIGS. 35 and 36, the peripheral region of the display substrate includes, in a plane perpendicular to the display substrate, an underlay substrate 30, and a first semiconductor layer, first conductive layer, second semiconductor layer, second conductive layer, and third conductive layer which are sequentially arranged on the underlay substrate 30. A first insulating layer 31 is arranged between the underlay substrate 30 and the first semiconductor layer. A second insulating layer 32 is arranged between the first conductive layer and the first semiconductor layer. A third insulating layer 33 is arranged between the first conductive layer and the second semiconductor layer. A fourth insulating layer 34 is arranged between the second semiconductor layer and the second conductive layer. A fifth insulating layer 35 is arranged between the second conductive layer and the third conductive layer. However, no limits are made thereto in the present embodiment. In some examples, the display region may include an underlay substrate, and a first semiconductor layer, first conductive layer, second conductive layer, second semiconductor layer, and third conductive layer which are sequentially arranged on the underlay substrate.

Figure 37:
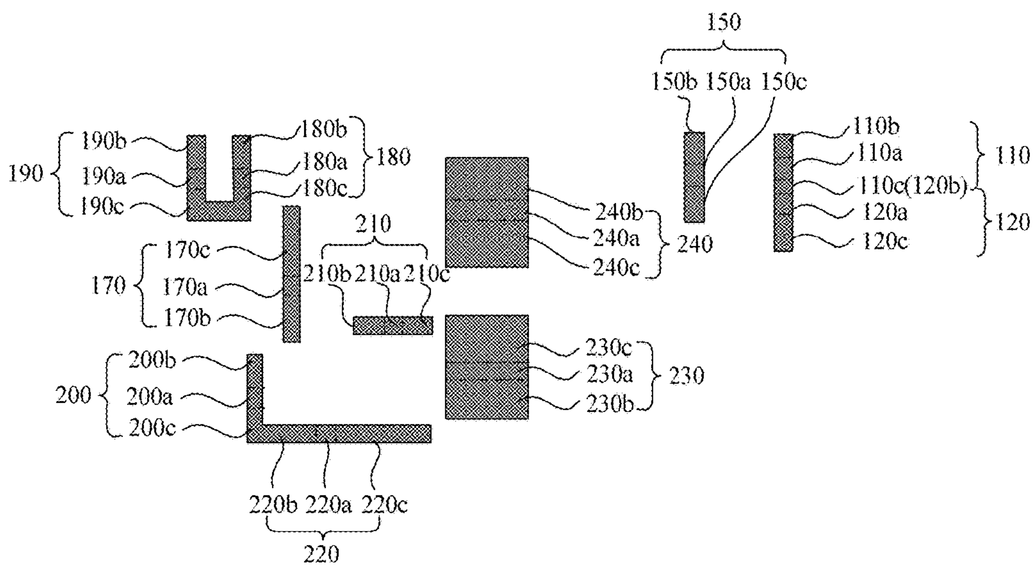
FIG. 37 is a top view of a first shift register unit after a first semiconductor layer is formed according to at least one embodiment of the present disclosure.

FIG. 37 is a top view of a first shift register unit after a first semiconductor layer is formed according to at least one embodiment of the present disclosure. As shown in FIGS. 35 to 37, the first semiconductor layer of the peripheral region may be curved or bent. The first semiconductor layer of the peripheral region at least includes an active layer 110 of a first transistor T1, an active layer 120 of a second transistor T2, an active layer 150 of a fifth transistor T5, an active layer 170 of a seventh transistor T7, an active layer 180 of an eighth transistor T8, an active layer 190 of a ninth transistor T9, an active layer 200 of a tenth transistor T10, an active layer 210 of an eleventh transistor T11, an active layer 220 of a twelfth transistor T12, an active layer 230 of a thirteenth transistor T13, and an active layer 240 of a fourteenth transistor T14.

In some exemplary implementation modes, the active layer 110 of the first transistor T1 and the active layer 120 of the second transistor T2 form an integrated structure which is, for example, strip-shaped. The active layer 180 of the eighth transistor T8 and the active layer 190 of the ninth transistor T9 form an integrated structure which is, for example, of a shape of "⌴". The active layer 200 of the tenth transistor T10 and the active layer 220 of the twelfth transistor T12 form an integrated structure which is, for example, of a shape of "L".

In some exemplary implementation modes, the material of the first semiconductor layer may include, for example, poly-silicon. The active layer may include a channel region, a first doped region, and a second doped region. The channel region may be doped with no impurities, and has a semiconductor characteristic. The first doped region and the second doped region may be on two sides of the channel region and doped with impurities, and thus are conductive. The impurity may change according to the type of the transistor. The first doped region or second doped region of the active layer may be interpreted as a source electrode or drain electrode of the transistor. For example, a source electrode of the first transistor T1 may correspond to a first doped region 110*b* doped with an impurity on a periphery of a channel region 110*a* of an active layer 110, and a drain electrode of the first transistor T1 may correspond to a second doped region 110*c* doped with an impurity on the periphery of the channel region 110*a* of the active layer 110. In addition, a portion of the active layer between transistors may be interpreted as a line doped with an impurity, and may be used to electrically connect the transistors.

Figure 38:
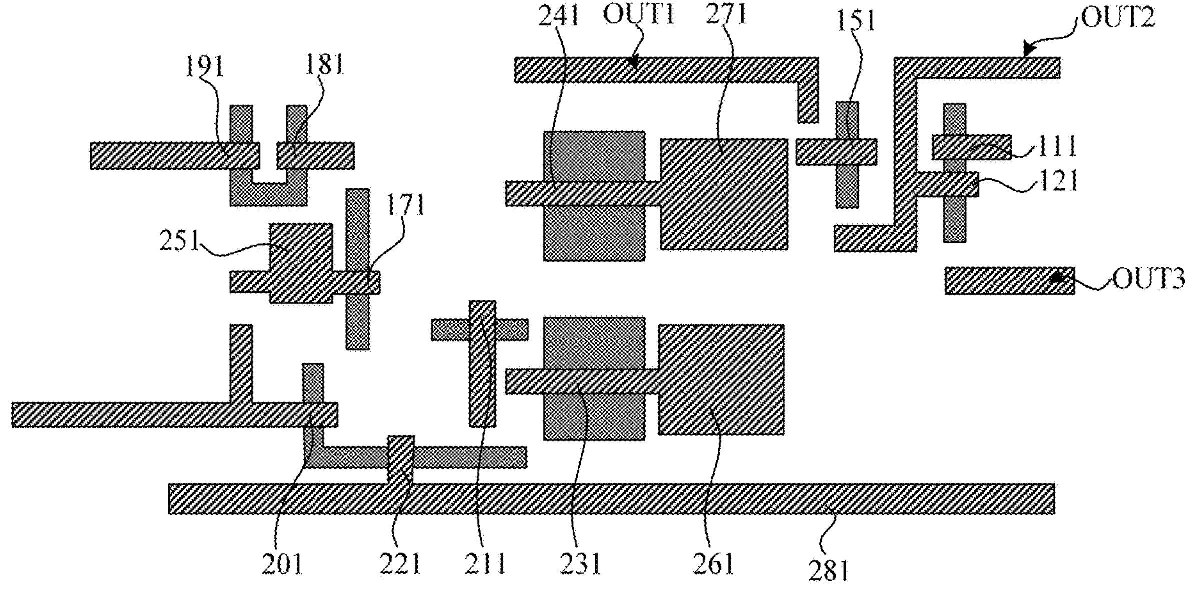
FIG. 38 is a top view of a first shift register unit after a first conductive layer is formed according to at least one embodiment of the present disclosure.

FIG. 38 is a top view of a first shift register unit after a first conductive layer is formed according to at least one embodiment of the present disclosure. As shown in FIGS. 35 to 38, the first conductive layer of the peripheral region at least includes a control electrode 111 of the first transistor T1, a control electrode 121 of the second transistor T2, a control electrode of the fifth transistor T5, a control electrode 171 of the seventh transistor T7, a control electrode 181 of the eighth transistor T8, a control electrode 191 of the ninth transistor T9, a control electrode 201 of the tenth transistor T10, a control electrode 211 of the eleventh transistor T11, a control electrode 221 of the twelfth transistor T12, a control electrode 231 of the thirteenth transistor T13, a control electrode 241 of the fourteenth transistor T14, a first electrode 251 of a first capacitor C1, a first electrode 261 of a second capacitor C2, a first electrode 271 of a third capacitor C3, a first connecting electrode 281, a first output terminal OUT1, a second output terminal OUT2, and a third output terminal OUT3.

In some exemplary implementation modes, the control electrode 121 of the second transistor T2 and the second output terminal OUT2 may form an integrated structure. The control electrode 111 of the first transistor T1 is between the control electrode 121 of the second transistor T2 and the second output terminal OUT2. Extending directions of the control electrode 111 of the first transistor T1, the control electrode 121 of the second transistor T2, and the second output terminal OUT2 are parallel to one another. The third output terminal OUT3 is on a side of the control electrode 121 of the second transistor T2 away from the control electrode 111 of the first transistor T1. An extending direction of the third output terminal OUT3 is parallel to that of the control electrode 111 of the first transistor T1. The first output terminal OUT1 is on a side of the control electrode 151 of the fifth transistor T5 away from the second output terminal OUT2. The first output terminal OUT1 is, for example, of a shape of "¬".

In some exemplary implementation modes, the control electrode 171 of the seventh transistor T7 and the first electrode 251 of the first capacitor C1 may form an integrated structure. The control electrode 231 of the thirteenth transistor T13 and the first electrode 261 of the second capacitor C2 may form an integrated structure. The control electrode 241 of the fourteenth transistor T14 and the first electrode 271 of the third capacitor C3 may form an integrated structure. The control electrode 221 of the twelfth transistor T12 and the first connecting electrode 281 may form an integrated structure.

Figure 39:
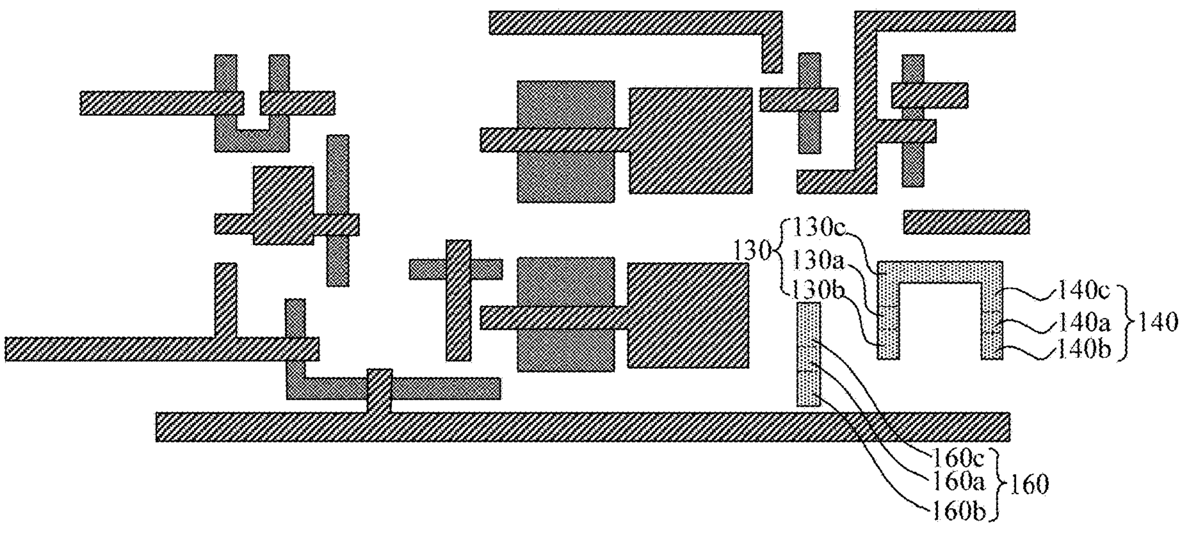
FIG. 39 is a top view of a first shift register unit after a second semiconductor layer is formed according to at least one embodiment of the present disclosure.

FIG. 39 is a top view of a first shift register unit after a second semiconductor layer is formed according to at least one embodiment of the present disclosure. As shown in FIGS. 35 to 39, the second semiconductor layer of the peripheral region may be curved or bent. The second semiconductor layer of the peripheral region at least includes an active layer 130 of a third transistor T3, an active layer 140 of a fourth transistor T4, and an active layer 160 of a sixth transistor T6. In some examples, the material of the second semiconductor layer includes IGZO.

In some exemplary implementation modes, the active layer 130 of the third transistor T3 and the active layer 140 of the fourth transistor T4 form an integrated structure which is, for example, of a shape of "⊓". The active layer 130 of the third transistor T3 includes a channel region 130*a*, and a first doped region 130*b* and second doped region 130*c* which are on two sides of the channel region 130*a*. The active layer 140 of the fourth transistor T4 includes a channel region 140*a*, and a first doped region 140*b* and second doped region 140*c* which are on two sides of the channel region 140*a*. The second doped region 130*c* of the active layer 130 of the third transistor T3 is connected with the second doped region 140*c* of the active layer 140 of the fourth transistor T4. The active layer 130 of the third transistor T3 and the active layer 140 of the fourth transistor T4 are on a side of the third output terminal OUT3 away from the second output terminal OUT2. The active layer 160 of the sixth transistor T6 is on a side of the active layer 130 of the third transistor T3 close to the first electrode 261 of the second capacitor C2. The active layer 160 of the sixth transistor T6 includes a channel region 160*a*, and a first doped region 160*b* and second doped region 160*c* which are on two sides of the channel region 160*a*.

Figure 40:
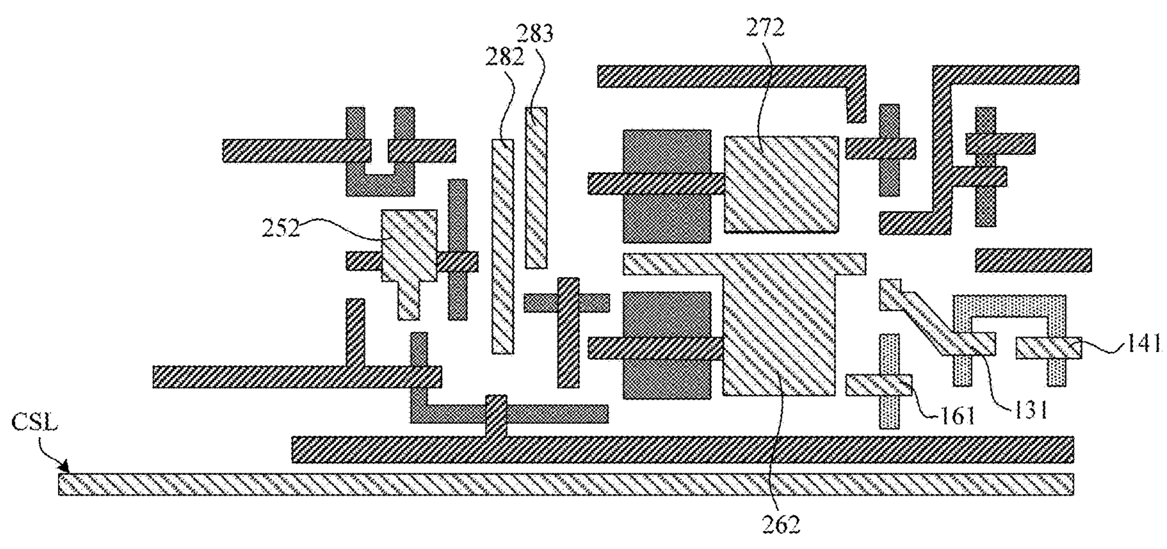
FIG. 40 is a top view of a first shift register unit after a second conductive layer is formed according to at least one embodiment of the present disclosure.

FIG. 40 is a top view of a first shift register unit after a second conductive layer is formed according to at least one embodiment of the present disclosure. As shown in FIGS. 35 to 40, the second conductive layer of the peripheral region at least includes a control electrode 131 of the third transistor T3, a control electrode 141 of the fourth transistor T4, a control electrode 161 of the sixth transistor T6, a second electrode 252 of the first capacitor C1, a second electrode 262 of the second capacitor C2, a second electrode 272 of the third capacitor C3, a second connecting electrode 282, a third connecting electrode 283, and a control signal line CSL.

In some exemplary implementation modes, a projection of the second electrode 262 of the second capacitor C2 on the underlay substrate covers that of the first electrode 261 of the second capacitor C2 on the underlay substrate. A projection of the second electrode 272 of the third capacitor C3 on the underlay substrate covers that of the first electrode 271 of the third capacitor C3 on the underlay substrate. A projection of the control signal line CSL on the underlay substrate is on a side of a projection of the first connecting electrode 281 on the underlay substrate away from the second capacitor C2 and the third capacitor C3. Extending directions of the second connecting electrode 282 and the third connecting electrode 283 are parallel to each other.

Figure 41:
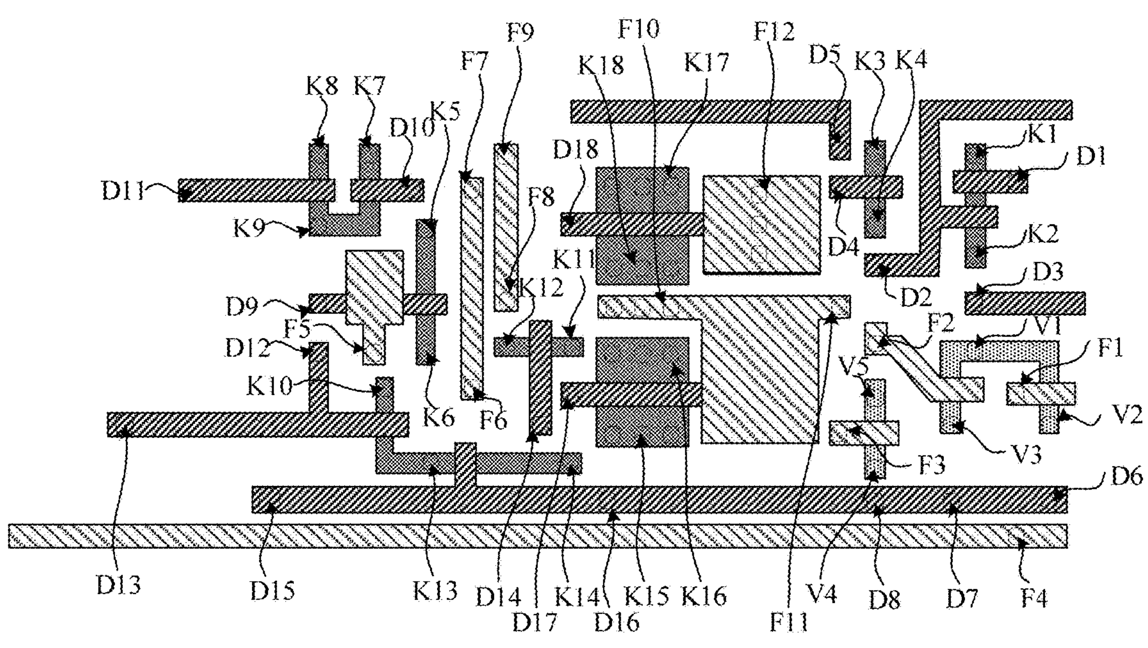
FIG. 41 is a top view of a first shift register unit after a fifth insulating layer is formed according to at least one embodiment of the present disclosure.

FIG. 41 is a top view of a first shift register unit after a fifth insulating layer is formed according to at least one embodiment of the present disclosure. As shown in FIGS. 35 to 41, multiple vias are formed on the fifth insulating layer 35 of the peripheral region. The multiple vias at least include first vias K11 to K18, second vias D1 to D18, third vias V1 to V5, and fourth vias F1 to F12. The fifth insulating layer 35, fourth insulating layer 34, third insulating layer 33, and second insulating layer 32 in the first vias K11 to K18 are etched away to expose a surface of the first semiconductor layer. The fifth insulating layer 35, fourth insulating layer 34, and third insulating layer 33 in the second vias D1 to D18 are etched away to expose a surface of the first conductive layer. The fifth insulating layer 35 and fourth insulating layer 34 in the third vias V1 to V5 are etched away to expose a surface of the second semiconductor layer. The fifth insulating layer 35 in the fourth vias V1 to F12 is etched away to expose a surface of the second conductive layer.

Figure 42:
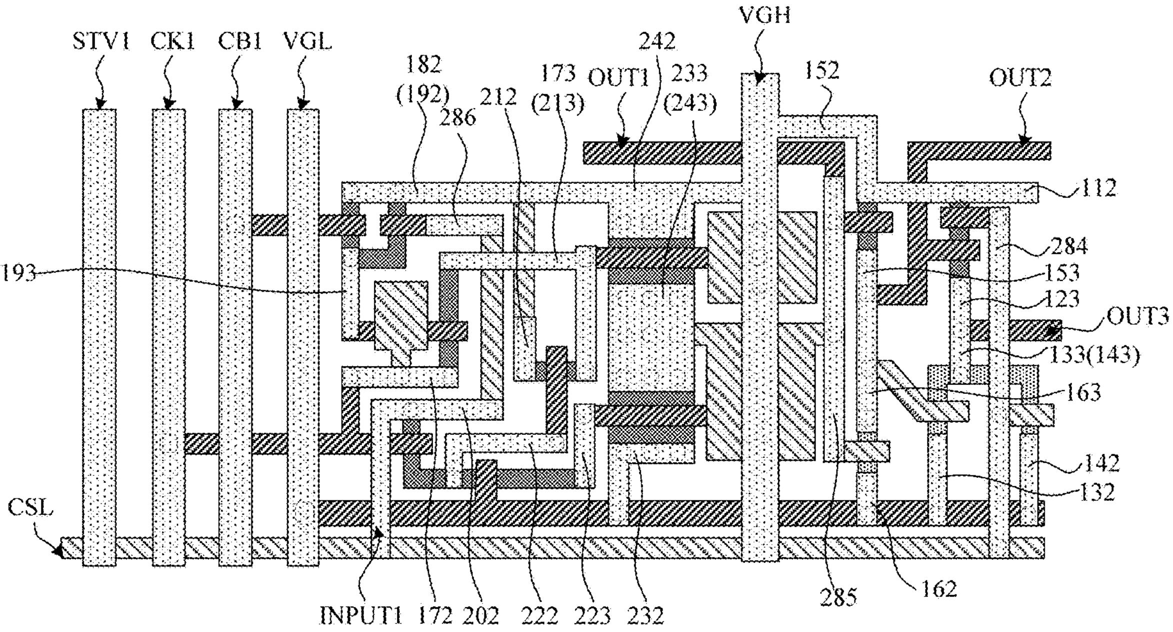
FIG. 42 is a top view of a first shift register unit after a third conductive layer is formed according to at least one embodiment of the present disclosure.

FIG. 42 is a top view of a first shift register unit after a third conductive layer is formed according to at least one embodiment of the present disclosure. As shown in FIGS. 35 to 42, the third conductive layer of the peripheral region at least includes a first electrode 112 of the first transistor T1, a second electrode 123 of the second transistor T2, a first electrode 132 and second electrode 133 of the third transistor T3, a first electrode 142 and second electrode 143 of the fourth transistor T4, a first electrode 152 and second electrode 153 of the fifth transistor T5, a first electrode 162 and second electrode 163 of the sixth transistor T6, a first electrode 172 and second electrode 173 of the seventh transistor T7, a first electrode 182 of the eighth transistor T8, a first electrode 192 and second electrode 193 of the ninth transistor T9, a first electrode 202 of the tenth transistor T10, a first electrode 212 and second electrode 213 of the eleventh transistor T11, a first electrode 222 and second electrode 223 of the twelfth transistor T12, a first electrode 232 and second electrode 233 of the thirteenth transistor T13, a first electrode 242 and second electrode 243 of the fourteenth transistor T14, a fourth connecting electrode 283, a fifth connecting electrode 285, a sixth connecting electrode 286, a first initial signal line STV1, a first clock signal line CK1, a second clock signal line CB1, a first power line VGH, and a second power line VGL.

In some exemplary implementation modes, the first electrode 112 of the first transistor T1 is connected with the first doped region 110*b* of the active layer 110 of the first transistor T1 through the first via K1. The second electrode 123 of the second transistor T2 is connected with a second doped region 120*c* of an active layer 120 of the second transistor T2 through the first via K2 and connected with the third output terminal OUT3 through the second via D3. The fourth connecting electrode 284 is connected with the control electrode 111 of the first transistor T1 through the second via D1, connected with the control electrode 141 of the fourth transistor through the fourth via F1 and connected with the control signal line CSL through the fourth via F4. The first electrode 142 of the fourth transistor T4 is connected with the first doped region 140*b* of the active layer 140 of the fourth transistor T4 through the third via V2 and connected with the first connecting electrode 281 through the second via D6. The first electrode 132 of the third transistor T3 is connected with the first doped region 130*b* of the active layer 130 of the third transistor T3 through the third via V3 and connected with the first connecting electrode 281 through the second via D7. The second electrode 133 of the third transistor T3 is connected with the second doped region 130*c* of the active layer 130 of the third transistor T3 and the second doped region 140*c* of the active layer 140 of the fourth transistor T4 through the third via V1. The second electrode 123 of the second transistor T2, the second electrode 133 of the third transistor T3, and the second electrode 143 of the fourth transistor T4 form an integrated structure.

In some exemplary implementation modes, the first electrode 152 of the fifth transistor T5 is connected with a first doped region 150*b* of an active layer 150 of the fifth transistor T5 through the first via K3. The second electrode 153 of the fifth transistor T5 is connected with a second doped region 150*c* of the active layer 150 of the fifth transistor T5 through the first via K4 and connected with the control electrode 121 of the second transistor T2 and the second output terminal OUT2 through the second via D4. The first electrode 162 of the sixth transistor T6 is connected with the first doped region 160*b* of the active layer 160 of the sixth transistor T6 through the third via V4 and connected with the first connecting electrode 281 through the second via D8. The second electrode 163 of the sixth transistor T6 is connected with the second doped region 160*c* of the active layer 160 of the sixth transistor T6 through the third via V5 and connected with the control electrode 131 of the third transistor T3 through the fourth via F2. The second electrode 153 of the fifth transistor T5 and the second electrode 163 of the sixth transistor T6 form an integrated structure.

In some exemplary implementation modes, the first electrode 172 of the seventh transistor T7 is connected with a first doped region 170*b* of an active layer 170 of the seventh transistor T7 through the first via K6, connected with the second electrode 252 of the first capacitor C1 through the fourth via F5 and connected with the control electrode 201 of the tenth transistor T10 through the second via D12. The second electrode 173 of the seventh transistor T7 is connected with a second doped region 170*c* of the active layer 170 of the seventh transistor T7 through the first via K5 and connected with the control electrode 241 of the fourteenth transistor T14 through the second via D18. The first electrode 182 of the eighth transistor T8 is connected with a first doped region 180*b* of an active layer 180 of the eighth transistor T8 through the first via K7 and connected with the third connecting electrode 283 through the fourth via F9. The sixth connecting electrode 286 is connected with the control electrode 181 of the eighth transistor T8 through the second via D10 and connected with the second connecting electrode 282 through the fourth via F7. The first electrode 192 of the ninth transistor T9 is connected with a first doped region 190*b* of an active layer 190 of the ninth transistor T9 through the first via K8. The second electrode 193 of the ninth transistor T9 is connected with a second doped region 190*c* of the active layer 190 of the ninth transistor T9 through the first via K9 and connected with the first electrode 251 of the first capacitor C1 through the second via D9. The second clock signal line CB1 is connected with the control electrode 191 of the ninth transistor T9 through the second via D11. The first electrode 202 of the tenth transistor T10 is connected with a first doped region 200*b* of an active layer 200 of the tenth transistor T10 through the first via K10 and connected with the second connecting electrode 282 through the fourth via F6. The first electrode 202 of the tenth transistor T10 and a first input terminal INPUT1 form an integrated structure. The first clock signal line CK1 is connected with the control electrode 201 of the tenth transistor T10 through the second via D13. The first electrode 212 of the eleventh transistor T11 is connected with a first doped region 201*b* of an active layer 201 of the eleventh transistor T11 through the first via K12 and connected with the third connecting electrode 283 through the fourth via F8. The second electrode 213 of the eleventh transistor T11 is connected with a second doped region 201*c* of the active layer 201 of the eleventh transistor T11 through the first via K11. The second electrode 173 of the seventh transistor T7 and the second electrode 213 of the eleventh transistor T11 form an integrated structure.

In some exemplary implementation modes, the first electrode 222 of the twelfth transistor T12 is connected with a first doped region 220*b* of an active layer 220 of the twelfth transistor T12 through the first via K13, connected with the control electrode 211 of the eleventh transistor T11 through the second via D14. The second electrode 223 of the twelfth transistor T12 is connected with a second doped region 220*c* of the active layer 220 of the twelfth transistor T12 through the first via K14 and connected with the control electrode 231 of the thirteenth transistor T13 through the second via D17. The first electrode 232 of the thirteenth transistor T13 is connected with a first doped region 230*b* of an active layer 230 of the thirteenth transistor T13 through three abreast first vias K15 and connected with the first connecting electrode 281 through the second via D16. The second electrode 233 of the thirteenth transistor T13 is connected with a second doped region 230*c* of the active layer 230 of the thirteenth transistor T13 through three abreast first vias K16 and connected with the second electrode 262 of the second capacitor C2 through three abreast fourth vias F10. The first electrode 242 of the fourteenth transistor T14 is connected with a first doped region 240*b* of an active layer 240 of the fourteenth transistor T14 through three abreast first vias K17 and connected with the third connecting electrode 283 through the fourth via F9. The second electrode 243 of the fourteenth transistor T14 is connected with a second doped region 240*c* of the active layer 240 of the fourteenth transistor T14 through the first via K18. The second electrode 243 of the fourteenth transistor T14 and the second electrode 233 of the thirteenth transistor T13 form an integrated structure.

In some exemplary implementation modes, the second power line VGL is connected with the first connecting electrode 281 through the second via D15. The first power line VGH is connected with the second electrode 272 of the second capacitor C2 through three vertically arranged fourth vias F12. The first power line VGH, the first electrode 122 of the first transistor T1, the first electrode 152 of the fifth transistor T5, the first electrode 182 of the eighth transistor T8, the first electrode 192 of the ninth transistor T9, and the first electrode 242 of the fourteenth transistor form an integrated structure.

In some exemplary implementation modes, extending directions of the first initial signal line STV1, the first clock signal line CK1, the second clock signal line CB1, the second power line VGL, and the first power line VGH are parallel to one another and perpendicular to that of the control signal line CSL. For example, all the first initial signal line STV1, the first clock signal line CK1, the second clock signal line CB1, the second power line VGL, and the first power line VGH are sequentially arranged in a horizontal direction and extend in a vertical direction, and the control signal line CGL extends in the horizontal direction.

The first shift register unit provided in the present exemplary implementation mode may provide a second reset signal and second scanning signal to the pixel circuit of the display region. The second reset signal provided by the first shift register unit of the present exemplary implementation mode may keep the voltage of the second node of the pixel circuit in the reset stage and the compensation stage.

Figure 43:
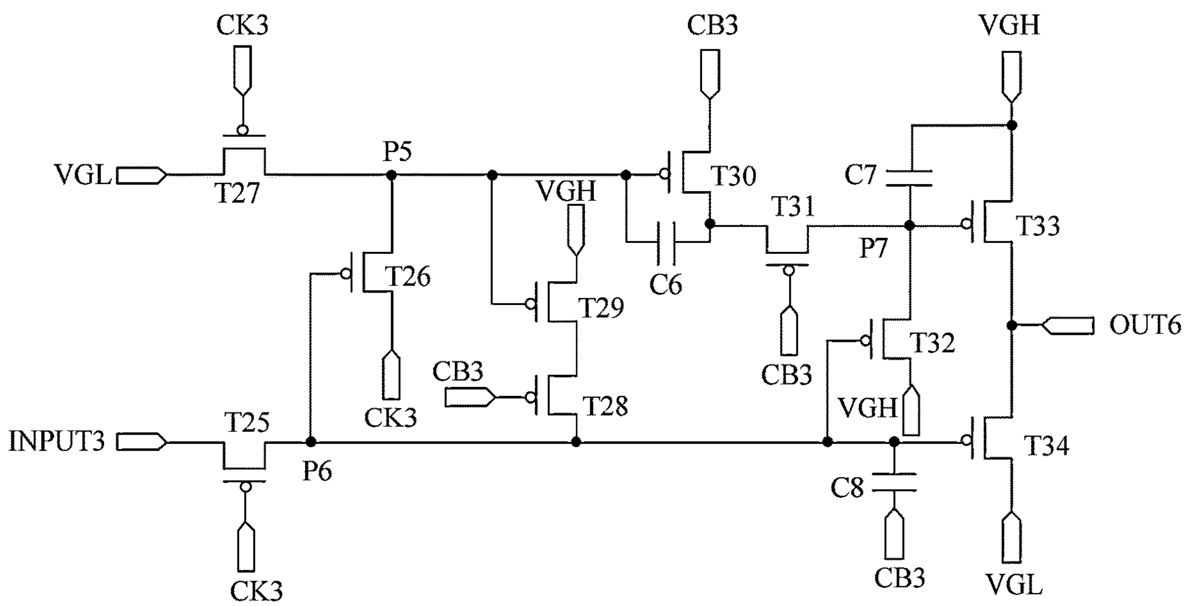
FIG. 43 is an equivalent circuit diagram of a third shift register unit according to at least one embodiment of the present disclosure.

FIG. 43 is an equivalent circuit diagram of a third shift register unit according to at least one embodiment of the present disclosure. As shown in FIG. 43, the third shift register unit provided in the present exemplary embodiment includes a twenty-fifth transistor T25 to a thirty-fourth transistor T34, a sixth capacitor C6, a seventh capacitor C7, and an eighth capacitor C8. A control electrode of the twenty-fifth transistor T25 is connected with a fifth clock signal line CK3, a first electrode of the twenty-fifth transistor T25 is connected with a third input terminal INPUT3, and a second electrode of the twenty-fifth transistor T25 is connected with a sixth control node P6. A control electrode of a twenty-sixth transistor T26 is connected with the sixth control node P6, a first electrode of the twenty-sixth transistor T26 is connected with the fifth clock signal line CK3, and a second electrode of the twenty-sixth transistor T26 is connected with a fifth control node P5. A control electrode of a twenty-seventh transistor T27 is connected with the fifth clock signal line CK3, a first electrode of the twenty-seventh transistor T27 is connected with the second power line VGL, and a second electrode of the twenty-seventh transistor T27 is connected with the fifth control node P5. A control electrode of the twenty-eighth transistor T28 is connected with a sixth clock signal line CB3, a first electrode of the twenty-eighth transistor T28 is connected with a second electrode of a twenty-ninth transistor T29, and a second electrode of the twenty-eighth transistor T28 is connected with the sixth control node P6. A control electrode of the twenty-ninth transistor T29 is connected with the fifth control node P5, and a first electrode of the twenty-ninth transistor T29 is connected with the first power line VGH. A control electrode of a thirtieth transistor T30 is connected with the fifth control node P5, a first electrode of the thirtieth transistor T30 is connected with the sixth clock signal line CB3, and a second electrode of the thirtieth transistor T30 is connected with a first electrode of a thirty-first transistor T31. A control electrode of the thirty-first transistor T31 is connected with the sixth clock signal line CB3, and a second electrode of the thirty-first transistor T31 is connected with a seventh control node P7. A control electrode of a thirty-second transistor T32 is connected with the sixth control node P6, a first electrode of the thirty-second transistor T32 is connected with the first power line VGH, and a second electrode of the thirty-second transistor T32 is connected with the seventh control node P7. A control electrode of a thirty-third transistor T33 is connected with the seventh control node P7, a first electrode of the thirty-third transistor T33 is connected with the first power line VGH, and a second electrode of the thirty-third transistor T33 is connected with a sixth output terminal OUT6. A control electrode of the thirty-fourth transistor T34 is connected with the sixth control node P6, a first electrode of the thirty-fourth transistor T34 is connected with the second power line VGL, and a second electrode of the thirty-fourth transistor T34 is connected with the sixth output terminal OUT6. A first electrode of the sixth capacitor C6 is connected with the control electrode of the thirtieth transistor T30, and a second electrode of the sixth capacitor C6 is connected with the second electrode of the thirtieth transistor T30. A first electrode of the seventh capacitor C7 is connected with the control electrode of the thirty-third transistor T33, and a second electrode of the seventh capacitor C7 is connected with the first power line VGH. A first electrode of the eighth capacitor C8 is connected with the control electrode of the thirty-fourth transistor T34, and a second electrode of the eighth capacitor C8 is connected with the sixth clock signal line CB3.

Figure 44:
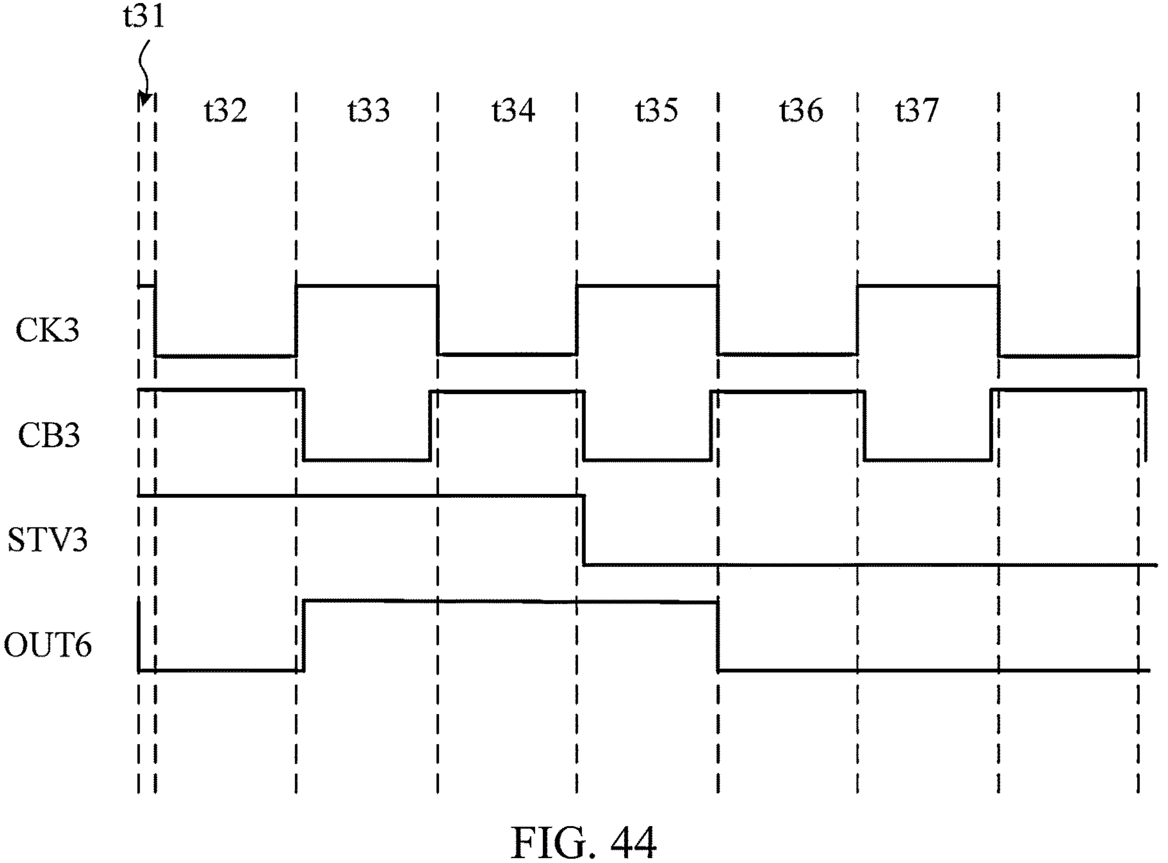
FIG. 44 is a working timing diagram of the third shift register unit shown in FIG. 43.

The following description is made only with an example that the twenty-fifth transistor T25 to the thirty-fourth transistor T34 are all P-type transistors. Description is made taking a first-stage third shift register unit as an example. A third input terminal INPUT3 of the first-stage third shift register unit is connected with a third initial signal line STV3. FIG. 44 is a working timing diagram of the third shift register unit shown in FIG. 43. As shown in FIGS. 43 and 44, the third shift register unit of the present exemplary embodiment includes ten transistor units (i.e., the twenty-fifth transistor T25 to the thirty-fourth transistor T34), three capacitor units (i.e., the sixth capacitor C6 to the eighth capacitor C8), three input terminals (i.e., the fifth clock signal line CK3, the sixth clock signal line CB3, and the third input terminal INPUT3), one output terminal (i.e., the sixth output terminal OUT6), and two power terminals (i.e., the first power line VGH and the second power line VGL). The first power line VGH keeps providing high-level signals. The second power line VGL keeps providing low-level signals.

As shown in FIGS. 43 and 44, a working process of the third shift register unit of the present exemplary embodiment includes the following stages.

In a first stage t31, the fifth clock signal line CK3 provides a high-level signal, the sixth clock signal line CB3 provides a high-level signal, and the third initial signal line STV3 provides a high-level signal. The twenty-fifth transistor T25, the twenty-seventh transistor T27, the twenty-eighth transistor T28, the twenty-ninth transistor T29, the thirtieth transistor T30, the thirty-first transistor T31, and the thirty-third transistor T33 are turned off, the twenty-sixth transistor T26, the thirty-second transistor T32, and the thirty-fourth transistor T34 are turned on, and the sixth output terminal OUT6 outputs a low-level signal.

In a second stage t32, the fifth clock signal line CK3 provides a low-level signal, the sixth clock signal line CB3 provides a high-level signal, and the third initial signal line STV3 provides a high-level signal. The twenty-fifth transistor T25, the twenty-seventh transistor T27, the twenty-ninth transistor T29, and the thirtieth transistor T30 are turned on, the twenty-sixth transistor T26, the twenty-eighth transistor T28, the thirty-first transistor T31, the thirty-second transistor T32, the thirty-fourth transistor T34, and the thirty-third transistor T33 are turned off, and the sixth output terminal OUT6 outputs a low-level signal.

In a third stage t33, the fifth clock signal line CK3 provides a high-level signal, the sixth clock signal line CB3 provides a low-level signal, and the third initial signal line STV3 provides a high-level signal. The twenty-fifth transistor T25, the twenty-seventh transistor T27, the twenty-sixth transistor T26, the thirty-second transistor T32, and the thirty-fourth transistor T34 are turned off, the twenty-eighth transistor T28, the twenty-ninth transistor T29, the thirtieth transistor T30, the thirty-first transistor T31, and the thirty-third transistor T33 are turned on, and the sixth output terminal OUT6 outputs a high-level signal.

In a fourth stage t34, the fifth clock signal line CK3 provides a low-level signal, the sixth clock signal line CB3 provides a high-level signal, and the third initial signal line STV3 provides a high-level signal. The twenty-fifth transistor T25, the twenty-seventh transistor T27, the twenty-ninth transistor T29, the thirtieth transistor T30, and the thirty-third transistor T33 are turned on, the twenty-sixth transistor T26, the twenty-eighth transistor T28, the thirty-first transistor T31, the thirty-second transistor T32, and the thirty-fourth transistor T34 are turned off, and the sixth output terminal OUT6 provides a high-level signal.

In a fifth stage t35, the fifth clock signal line CK3 provides a high-level signal, the sixth clock signal line CB3 provides a low-level signal, and the third initial signal line STV3 provides a low-level signal. The twenty-fifth transistor T25, the twenty-sixth transistor T26, the twenty-seventh transistor T27, the thirty-second transistor T32, and the thirty-fourth transistor T34 are turned off, the twenty-eighth transistor T28, the twenty-ninth transistor T29, the thirtieth transistor T30, the thirty-first transistor T31, and the thirty-third transistor T33 are turned on, and the sixth output terminal OUT6 provides a high-level signal.

In a sixth stage t36, the fifth clock signal line CK3 provides a low-level signal, the sixth clock signal line CB3 provides a high-level signal, and the third initial signal line STV3 provides a low-level signal. The twenty-fifth transistor T25, the twenty-sixth transistor T26, the twenty-seventh transistor T27, the thirty-second transistor T32, and the thirty-fourth transistor T34 are turned on, the twenty-eighth transistor T28, the twenty-ninth transistor T29, the thirtieth transistor T30, the thirty-first transistor T31, and the thirty-third transistor T33 are turned off, and the sixth output terminal OUT6 provides a low-level signal.

In a seventh stage t37, the fifth clock signal line CK3 provides a high-level signal, the sixth clock signal line CB3 provides a low-level signal, and the third initial signal line STV3 provides a low-level signal. The twenty-fifth transistor T25, the twenty-seventh transistor T27, the twenty-ninth transistor T29, the thirtieth transistor T30, and the thirty-third transistor T33 are turned off, the twenty-sixth transistor T26, the thirty-first transistor T31, the thirty-second transistor T32, and the thirty-fourth transistor T34 are turned on, and the sixth output terminal OUT6 provides a low-level signal.

The sixth stage and the seventh stage may be repeated after the seventh stage, and the working process is restarted from the first stage when the third input terminal INPUT3 inputs a low-level signal.

The third shift register unit provided in the present exemplary implementation mode provides a light emitting control signal to the pixel circuit through the light emitting control line.

The structure of the display substrate will now be described through an example of a preparation process of the display substrate. A "patterning process" mentioned in the present disclosure includes film layer deposition, coating with a photoresist, masking, exposure, development, etching, photoresist stripping, and other treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film made from a certain material on a base by a deposition or coating process. If the patterning process is not needed by the "thin film" in the whole making process, the "thin film" may also be called a "layer". When the patterning process is needed by the "thin film" in the whole making process, the thin film is called a "thin film" before the patterning process and called a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the film layer is a size of the film layer in a direction perpendicular to the display substrate. In the exemplary embodiment of the present disclosure, "the projection of A includes the projection of B" refers to that a boundary of the projection of B falls within a range of a boundary of the projection of A or the boundary of the projection of A is overlapped with the boundary of the projection of B.

In some exemplary implementation modes, the preparation process of the display substrate may include the following operations, as shown in FIGS. 20 to 27 and 35 to 42. The preparation process of the present exemplary implementation mode is described taking a sub-pixel of the display region and a first shift register unit of the peripheral region as an example. An equivalent circuit diagram of a pixel circuit of the sub-pixel is shown in FIG. 18. An equivalent circuit diagram of the first shift register unit is shown in FIG. 7.

In (1), a flexible underlay substrate is prepared on a glass carrier plate.

In some exemplary implementation modes, the underlay substrate 30 includes a first flexible layer 30A, first inorganic material layer 30B, second flexible layer 30C, and second inorganic material layer 30D which are stacked on the glass carrier plate. The first flexible layer 30A and the second flexible layer 30C may be made of polyimide (PI), polyethylene terephthalate (PET), flexible polymer films subjected to surface treatment, or other materials. The first inorganic material layer 30B and the second inorganic material layer 30D may be made of silicon nitride (SiNx), silicon oxide (SiOx), etc., to improve the water and oxygen resistance of the underlay substrate. The first inorganic material layer 30B and the second inorganic material layer 30D are also called barrier layers.

In some exemplary implementation modes, a preparation process of the underlay substrate may include the following operations. First, the glass carrier plate is coated with a layer of polyimide to form a first flexible layer after curing. Then, a layer of barrier thin film is deposited on the first flexible layer to form a first barrier layer covering the first flexible layer. Next, the first barrier layer is coated with a layer of polyimide to form a second flexible layer after curing. Finally, a layer of barrier thin film is deposited on the second flexible layer to form a second barrier layer covering the second flexible layer, to complete the preparation of the underlay substrate 30. After the present process, both the display region and the peripheral region include the underlay substrate 30, as shown in FIGS. 21 and 36.

In (2), a pattern of a first semiconductor layer is formed.

In some exemplary implementation modes, a first insulating thin film and a first semiconductor thin film are sequentially deposited on the underlay substrate 30, and the first semiconductor thin film is patterned through a patterning process to form a first insulating layer 31 covering the whole underlay substrate 30 and the pattern of the first semiconductor layer arranged on the first insulating layer 11, as shown in FIGS. 22 and 37. In some examples, the pattern of the first semiconductor layer at least includes active layers of multiple P-type transistors in the pixel circuit and the first shift register unit. The active layer may include a channel region, a source region, and a drain region. The channel region may be doped with no impurities, and has a semiconductor characteristic. The source region and the drain region may be on two sides of the channel region and doped with impurities, and thus are conductive. The impurity may change according to the type (e.g., an N type or a P type) of the transistor. In some examples, the material of the first semiconductor thin film may be poly-silicon.

In (3), a pattern of a first conductive layer is formed.

In some exemplary implementation modes, a second insulating thin film and a first metal thin film are sequentially deposited on the underlay substrate 30 where the abovementioned pattern is formed, and the first metal thin film is patterned through a patterning process to form a second insulating layer 32 covering the pattern of the first semiconductor layer and the pattern of the first conductive layer arranged on the second insulating layer 32, as shown in FIGS. 23 and 38. In some examples, the pattern of the first conductive layer at least includes control electrodes of the multiple P-type transistors in the pixel circuit and the first shift register unit, first electrodes of multiple capacitors in the pixel circuit and the first shift register unit, a light emitting control line EM providing a light emitting control signal to the pixel circuit, a first scanning line providing a first scanning signal to the pixel circuit, a second reset signal line RST2 providing a second reset signal to the pixel circuit, and a first output terminal OUT1, second output terminal OUT2 and third output terminal OUT3 of the first shift register unit.

In (4), a pattern of a second semiconductor layer is formed.

In some exemplary implementation modes, a third insulating thin film and a second semiconductor thin film are sequentially deposited on the underlay substrate 30 where the abovementioned patterns are formed, and the second semiconductor thin film is patterned through a patterning process to form a third insulating layer 33 covering the first conductive layer and the pattern of the second semiconductor layer arranged on the third insulating layer 33, as shown in FIGS. 24 and 39. In some examples, the pattern of the second semiconductor layer at least includes active layers of multiple N-type transistors in the pixel circuit and the first shift register unit. In some examples, the material of the second semiconductor thin film may be IGZO.

In (5), a pattern of a second conductive layer is formed.

In some exemplary implementation modes, a fourth insulating thin film and a second metal thin film are sequentially deposited on the underlay substrate 30 where the abovementioned patterns are formed, and the second metal thin film is patterned through a patterning process to form a fourth insulating layer 34 covering the second semiconductor layer and the pattern of the second conductive layer arranged on the fourth insulating layer 34, as shown in FIGS. 25 and 40. In some examples, the pattern of the second conductive layer at least includes control electrodes of the multiple N-type transistors in the pixel circuit and the first shift register unit, second electrodes of the multiple capacitors in the pixel circuit and the first shift register unit, a first reset signal line RST1 providing a first reset signal to the pixel circuit, a second scanning signal line GT2 providing a second scanning signal to the pixel circuit, a reference voltage line REF providing a reference voltage to the pixel circuit, and a control signal line CSL providing a control signal to the first shift register unit.

In (6), a pattern of a fifth insulating layer is formed.

In some exemplary implementation modes, a fifth insulating thin film is deposited on the underlay substrate 30 where the abovementioned patterns are formed, and is patterned through a patterning process to form the pattern of the fifth insulating layer 35 covering the second conductive layer, as shown in FIGS. 26 and 41. In some examples, multiple vias are formed on the fifth insulating layer 35. The multiple vias at least include first vias K1 to K26 exposing the first semiconductor layer, second vias D1 to D22 exposing the first conductive layer, third vias V1 to V8 exposing the second semiconductor layer, and fourth vias F1 to F15 exposing the second conductive layer. The fifth insulating layer 35, fourth insulating layer 34, third insulating layer 33, and second insulating layer 32 in the first vias K1 to K26 are etched away. The fifth insulating layer 35, fourth insulating layer 34, and third insulating layer 33 in the second vias D1 to D22 are etched away. The fifth insulating layer 35 and fourth insulating layer 34 in the third vias V1 to V8 are etched away. The fifth insulating layer 35 in the fourth vias F1 to F15 are etched away.

In (7), a pattern of a third conductive layer is formed.

In some exemplary implementation modes, a third metal thin film is deposited on the underlay substrate 30 where the abovementioned patterns are formed, and is patterned through a patterning process to form the pattern of the third conductive layer on the fifth insulating layer 35, as shown in FIGS. 27 and 42. In some examples, the pattern of the third conductive layer at least includes first electrodes and second electrodes of the multiple P-type transistors and N-type transistors in the pixel circuit and the first shift register unit, an initial voltage line INT providing an initial voltage to the pixel circuit, a data line DATA providing a data signal to the pixel circuit, a third power line VDD providing a power voltage to the pixel circuit, a first initial signal line STV1, first clock signal line CK1, second clock signal line CK1, first power line VGH and second power line VGL which are connected with the first shift register unit, and multiple connecting electrodes in the pixel circuit and the first shift register unit.

In (8), patterns of a planar layer, an anode layer, a Pixel Define Layer (PDL), an organic light emitting layer, a cathode layer, and a package layer are sequentially formed.

In some exemplary implementation modes, the underlay substrate where the abovementioned patterns are formed is coated with a planar thin film, and masking, exposure, and development are performed on the planar thin film to form the pattern of the planar layer. Then, an anode thin film is deposited on the underlay substrate where the abovementioned patterns are formed, and is patterned through a patterning process to form an anode pattern on the planar layer. Next, the underlay substrate where the abovementioned patterns are formed is coated with a pixel define thin film, and masking, exposure and development processes are performed to form the pattern of the Pixel Define Layer (PDL). The pixel define layer is formed in each sub-pixel in the display region. A pixel opening exposing the anode is formed in the pixel define layer in each sub-pixel. Later on, the organic light emitting layer connected with the anode is formed in the abovementioned pixel opening. Afterwards, a cathode thin film is deposited and patterned through a patterning process to form a cathode pattern. The cathode is connected with the organic light emitting layer and the second power line respectively. Afterwards, the package layer is formed on the cathode. The package layer may include a stacked structure of inorganic material/organic material/inorganic material. In some possible implementation modes, the cathode may be connected with the second power line in multiple manners, e.g., laser drilling.

In some exemplary implementation modes, the first conductive layer, the second conductive layer, and the third conductive layer may be made of metal materials, e.g., any one or more of Argentum (Ag), Copper (Cu), Aluminum (Al), and Molybdenum (Mo), or alloy materials of the abovementioned metals, e.g., an Aluminum-Neodymium alloy (AlNd) or a Molybdenum-Niobium alloy (MoNb), and may be single-layer structures, or multilayer composite structures such as Mo/Cu/Mo. The first insulating layer 31, the second insulating layer 32, the third insulating layer 33, the fourth insulating layer 34, and the fifth insulating layer 35 may be made of any one or more of silicon oxide (SiOx), silicon nitride (SiNx), and silicon oxynitride (SiON), and may be single-layer, multilayer, or composite. The first insulating layer 31 and the third insulating layer 33 are called buffer layers. The first insulating layer 31 is arranged to improve the water and oxygen resistance of the underlay substrate. The second insulating layer 32 and the fourth insulating layer 34 are called Gate Insulator (GI) layers. The fifth insulating layer 35 is called an Interlayer Dielectric (ILD) layer. The planar layer may be made of an organic material, e.g., polyimide, acrylic, or polyethylene terephthalate. The pixel define layer may be made of an organic material, e.g., polyimide, acrylic, or polyethylene terephthalate. The anode may be made of a transparent conductive material, e.g., indium tin oxide (ITO) or indium zinc oxide (IZO). The cathode may be made of any one or more of Magnesium (Mg), Argentum (Ag), Aluminum (Al), Copper (Cu), and Lithium (Li), or an alloy made of any one or more of the abovementioned metals. However, no limits are made thereto in the present embodiment. For example, the anode may be made of a reflective material such as a metal, and the cathode may be made of a transparent conductive material.

The structure of the display substrate of the present exemplary embodiment and the preparation process thereof are described only as an example. In some exemplary implementation modes, changes in corresponding structures and addition or deletion of the patterning process may be made as practically required. For example, patterns of a sixth insulating layer, a first planar layer, a fourth conductive layer, a second planar layer, an anode layer, a pixel define layer, an organic light emitting layer, a cathode layer, and a package layer may be sequentially formed after the third conductive layer is formed. For another example, the first insulating layer, the first semiconductor layer, the second insulating layer, the first conductive layer, the third insulating layer, the second conductive layer, the fourth insulating layer, the second semiconductor layer, the fifth insulating layer, and the third conductive layer may be sequentially formed on the underlay substrate. For example, the N-type thin film transistor may be of a bottom-gate structure. However, no limits are made thereto in the present embodiment.

The preparation process of the present exemplary embodiment may be implemented using an existing mature preparation device, and is compatible well with an existing preparation process, simple in process implementation, easy to implement, high in production efficiency and yield, and low in production cost.

According to the display substrate provided in the present exemplary embodiment, many different gate driving signals are provided to the pixel circuit through the gate driving circuit, so that the performance of the pixel circuit may be improved, and the pixel circuit may satisfy both low-frequency (e.g., about 1 Hz) driving and high-frequency (e.g., about 140 Hz) driving. For example, an electronic product adopts low-frequency driving to reduce the power consumption in a standby or electronic reading state, and adopts high-frequency driving in a game state.

Figure 45:
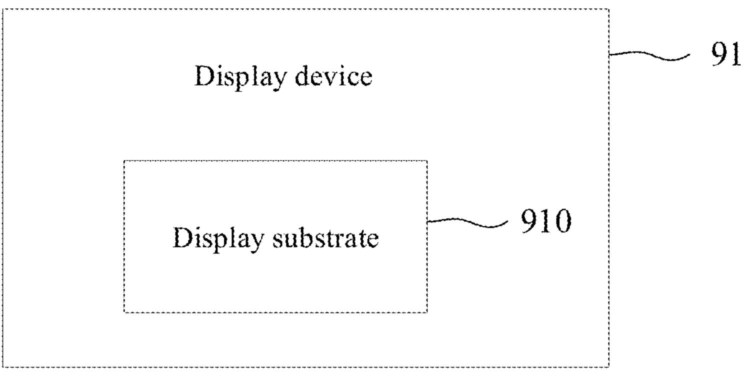
FIG. 45 is a schematic diagram of a display device according to at least one embodiment of the present disclosure.

FIG. 45 is a schematic diagram of a display device according to at least one embodiment of the present disclosure. As shown in FIG. 45, the present embodiment provides a display device 91, which includes a display substrate 910. The display substrate 910 is the display substrate provided in the abovementioned embodiments. Herein, the display substrate 910 may be an OLED display substrate. The display device 91 may be any product or component with a display function, such as an OLED display device, a mobile phone, a tablet computer, a television, a display, a notebook computer, a digital photo frame, and a navigator. However, no limits are made thereto in the present embodiment.

The drawings of the present disclosure only involve the structures involved in the present disclosure, and the other structures may refer to conventional designs. The embodiments in the present disclosure, i.e., the features in the embodiments, can be combined without conflicts to obtain new embodiments.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising a display region and a peripheral region on a periphery of the display region, wherein a gate driving circuit is arranged in the peripheral region, and the gate driving circuit comprises multiple cascaded shift register units, at least one of the shift register units comprises at least one transistor of a first semiconductor type, at least one transistor of a second semiconductor type, and at least one capacitor, and types of the at least one transistor of the first semiconductor type and the at least one transistor of the second semiconductor type are different;

in a direction perpendicular to the display substrate, the display substrate comprises an underlay substrate, and a first semiconductor layer, a first conductive layer, a second semiconductor layer, a second conductive layer, and a third conductive layer which are arranged on the underlay substrate;

the first semiconductor layer at least comprises an active layer of the at least one transistor of the second semiconductor type of the at least one of the shift register units;

the first conductive layer at least comprises a control electrode of the at least one transistor of the second semiconductor type and a first electrode of the at least one capacitor of the at least one of the shift register units;

the second semiconductor layer at least comprises an active layer of the at least one transistor of the first semiconductor type of the at least one of the shift register units;

the second conductive layer at least comprises a control electrode of the at least one transistor of the first semiconductor type and a second electrode of the at least one capacitor of the at least one of the shift register units; and the third conductive layer at least comprises first electrodes and second electrodes of the at least one transistor of the first semiconductor type and the at least one transistor of the second semiconductor type of the at least one of the shift register units;

wherein the first conductive layer further comprises a first output terminal, a second output terminal and a third output terminal of the at least one of the shift register units;

wherein the second conductive layer further comprises a control signal line;

wherein the third conductive layer further comprises a first power line and a second power line;

wherein the at least one of the shift register units comprises an input circuit, a first control circuit, a second control circuit, and an output circuit;

wherein the second control circuit is connected with the first power line, the second power line, the first output terminal, and a second output terminal, and is configured to provide an effective level signal of the first power line or the second power line to the second output terminal under control of the first output terminal; and the output circuit is connected with a control signal line, the first power line, the second power line, the second output terminal, and a third output terminal, and is configured to output an effective level signal of the first power line or the second power line to the third output terminal under control of the control signal line and the second output terminal, wherein, within the time of one frame, a duration of an effective level signal provided by the third output terminal is longer than a duration of an effective level signal provided by the second output terminal.

2. The display substrate according to claim 1, wherein the output circuit comprises a first transistor, a second transistor, a third transistor, and a fourth transistor; wherein the first transistor and the second transistor are a transistor of the second semiconductor type, and the third transistor and the fourth transistor are a transistor of the first semiconductor type; wherein a control electrode of the first transistor is connected with the control signal line, a first electrode of the first transistor is connected with the first power line, and a second electrode of the first transistor is connected with a first electrode of the second transistor; a control electrode of the second transistor is connected with the second output terminal, and a second electrode of the second transistor is connected with the third output terminal.

3. The display substrate according to claim 2, wherein a control electrode of the third transistor is connected with the second output terminal, a first electrode of the third transistor is connected with the second power line, and a second electrode of the third transistor is connected with the third output terminal; and a control electrode of the fourth transistor is connected with the control signal line, a first electrode of the fourth transistor is connected with the second power line, and a second electrode of the fourth transistor is connected with the third output terminal.

4. The display substrate according to claim 2, wherein the second control circuit comprises a fifth transistor and a sixth transistor; wherein the fifth transistor is the transistor of the second semiconductor type, and the sixth transistor is the transistor of the first semiconductor type; wherein a control electrode of the fifth transistor is connected with the first output terminal, a first electrode of the fifth transistor is connected with the first power line, and a second electrode of the fifth transistor is connected with the second output terminal.

5. The display substrate according to claim 4, wherein a control electrode of the sixth transistor is connected with the first output terminal, a first electrode of the sixth transistor is connected with the second power line, and a second electrode of the sixth transistor is connected with the second output terminal.

6. The display substrate according to claim 4, wherein the fifth transistor is on a side of the first transistor and the second transistor close to the first control circuit, and the sixth transistor is on a side of the third transistor close to the first control circuit.

7. The display substrate according to claim 6, wherein the first electrode of the first transistor, the first electrode of the fifth transistor, and the first power line form an integrated structure.

8. The display substrate according to claim 6, wherein the second electrode of the fifth transistor and the second electrode of the sixth transistor form an integrated structure and are connected with the control electrode of the third transistor, the control electrode of the second transistor, and the second output terminal.

9. A display device, comprising the display substrate according to claim 1.

10. A preparation method of the display substrate, for preparing the display substrate according to claim 1, the preparation method comprising:

providing the underlay substrate; and forming the first semiconductor layer, the first conductive layer, the second semiconductor layer, the second conductive layer, and the third conductive layer on the underlay substrate in the peripheral region on the periphery of the display region, wherein the first semiconductor layer at least comprises the active layer of the at least one transistor of the second semiconductor type of the at least one shift register unit of the gate driving circuit; the first conductive layer at least comprises the control electrode of the at least one transistor of the second semiconductor type and the first electrode of the at least one capacitor of the at least one shift register unit; the second semiconductor layer at least comprises the active layer of the at least one transistor of the first semiconductor type of the at least one shift register unit; the second conductive layer at least comprises the control electrode of the at least one transistor of the first semiconductor type and the second electrode of the at least one capacitor of the at least one shift register unit; and the third conductive layer at least comprises the first electrodes and the second electrodes of the at least one transistor of the first semiconductor type and the at least one transistor of the second semiconductor type of the at least one shift register unit.

11. The display substrate according to claim 1, wherein the first control circuit comprises: a twelfth transistor, a thirteenth transistor, a fourteenth transistor, a second capacitor, and a third capacitor;

wherein the twelfth transistor, the thirteenth transistor, and the fourteenth transistor are a transistor of the second semiconductor type; wherein a control electrode of the thirteenth transistor and a first electrode of the second capacitor is an integrated structure, and a control electrode of the fourteenth transistor and a first electrode of the third capacitor is an integrated structure.

12. The display substrate according to claim 1, wherein the input circuit comprises: a seventh transistor, an eighth transistor, a ninth transistor, a tenth transistor, an eleventh transistor, and a first capacitor;

wherein a control electrode of the seventh transistor and a first electrode of the first capacitor is an integrated structure.

* * * * *